United States Patent
Nakayama et al.

(10) Patent No.: US 7,340,229 B2
(45) Date of Patent: Mar. 4, 2008

(54) HIGH FREQUENCY AMPLIFICATION CIRCUIT AND MOBILE COMMUNICATION TERMINAL USING THE SAME

(75) Inventors: Masao Nakayama, Ritto (JP);
Tsunehiro Takagi, Nagaokakyo (JP);
Masahiko Inamori, Ibaraki (JP);
Kaname Motoyoshi, Nishinomiya (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 313 days.

(21) Appl. No.: 11/179,598

(22) Filed: Jul. 13, 2005

(65) Prior Publication Data

US 2006/0040629 A1   Feb. 23, 2006

(30) Foreign Application Priority Data

Aug. 20, 2004   (JP)  ............... 2004-241071

(51) Int. Cl.
*H04B 1/04* (2006.01)
(52) U.S. Cl. ............... 455/127.2; 330/277; 330/278
(58) Field of Classification Search ............ 455/127.1, 455/127.2, 69, 522, 572; 375/297; 330/127, 330/129, 135, 250, 277, 278, 285, 296
See application file for complete search history.

(56) References Cited

U.S. PATENT DOCUMENTS

| 4,371,842 A | * | 2/1983 | Lee ............... 330/141 |
| 4,890,077 A | * | 12/1989 | Sun ............... 333/81 A |
| 6,075,414 A | | 6/2000 | Nagaoka et al. |
| 6,229,370 B1 | * | 5/2001 | Inamori et al. ............ 333/81 R |
| 6,337,974 B1 | * | 1/2002 | Inamori et al. ............ 330/278 |
| 6,492,872 B1 | * | 12/2002 | Fujioka et al. ............ 330/285 |
| 6,542,045 B2 | | 4/2003 | Nishibe |
| 6,977,550 B2 | * | 12/2005 | Ishida et al. ............ 330/129 |

FOREIGN PATENT DOCUMENTS

| JP | 50-76959 | 6/1975 |
| JP | 61-216504 | 9/1986 |
| JP | 10-256853 | 9/1998 |
| JP | 10-261925 | 9/1998 |
| JP | 2001-196898 | 7/2001 |
| JP | 2001-217653 | 8/2001 |
| JP | 2002-246802 | 8/2002 |
| JP | 2002-368562 | 12/2002 |

OTHER PUBLICATIONS

Japanese Office Action issued in Japanese Patent Application No. JP 2005-172246, mailed Jul. 27, 2007.

* cited by examiner

*Primary Examiner*—Quochien B. Vuong
(74) *Attorney, Agent, or Firm*—McDermott Will & Emery

(57) ABSTRACT

A gain control circuit 12 comprises an FET 41 operating as a variable resistor. A gate terminal of the FET 41 is supplied with a control voltage VC applied to a gain control terminal 23. A source terminal and a drain terminal of the FET 41 are supplied with a reference voltage Vref1 obtained by a reference voltage circuit 13. The reference voltage Vref1 is controlled so as to compensate for a variation in the threshold voltage of the FET 41. The resistance value of the FET 41 is changed in accordance with the control voltage VC, and thus the gain of the high frequency amplification circuit 10 is also continuously changed.

23 Claims, 29 Drawing Sheets

HIGH FREQUENCY AMPLIFICATION CIRCUIT AND MOBILE COMMUNICATION TERMINAL USING THE SAME

BACKGROUND OF THE INVENTION

1. Field of the Invention

The present invention relates to a high frequency amplification circuit and a mobile communication terminal using the same, and more specifically to a high frequency amplification circuit provided in a high frequency circuit block or the like of a transmission section of a mobile communication terminal for performing gain control in accordance with a given control voltage, and the mobile communication terminal using the same.

2. Description of the Background Art

Recently, in the field of mobile communication, composite cellular phone terminals compatible to a plurality of communication systems are becoming main stream mobile communication terminals. Examples of such composite cellular phone terminals are compatible to the PDC (Personal Digital Cellular) system and the W-CDMA (Wide band Code Division Multiple Access) system. The PDC system has an advantage of providing a wide service area, and the W-CDMA system has an advantage of providing a high data communication rate. The composite cellular phone terminals compatible to both of these systems have the advantages of both of the systems, and thus are expected to be rapidly spread in the future. Aside from such terminals, communication systems compatible to multiple bands using the W-CDMA system are now being studied.

Such a mobile communication terminal uses a plurality of signals having different frequencies as carrier waves, and therefore includes a plurality of high frequency circuit blocks corresponding to the respective frequencies (see FIG. 2 described below). Meanwhile, in order to reduce the size of the mobile communication terminals, it is considered important to reduce the number of components on the substrate and thus reduce the size of the high frequency circuit blocks.

FIG. 30 is a block diagram showing a structure of a conventional high frequency amplification circuit which is included in a mobile communication terminal compatible to a plurality of communication systems. In FIG. 30, matching circuits 901, 904 and 906 are impedance matching circuits for performing impedance conversion. A high frequency signal which is input from a signal input terminal 911 is input to a gain control circuit 902 via the matching circuit 901. The gain control circuit 902 attenuates the input signal in accordance with a control voltage VC applied to a gain control terminal 913 and outputs the attenuated signal. The output signal from the gain control circuit 902 is amplified by an amplifier 903. The output signal from the amplifier 903 is input to an amplifier 905 via the matching circuit 904, and is amplified by the amplifier 905. The output signal from the amplifier 905 is output from a signal output terminal 912 via the matching circuit 906. The control voltage VC applied to the gain control terminal 913 is generated by converting a digital control signal, which is output from a control section (not shown), into an analog signal by a D/A converter.

FIG. 31 is a graph illustrating the relationship between the control voltage and the output voltage in the high frequency amplification circuit shown in FIG. 30, the relationship being obtained where the input power is constant. As shown in FIG. 31, the output power is approximately fixed at $P_L$ when the control voltage VC is lower than $V_L$, is approximately fixed at $P_H$ when the control voltage VC is higher than $V_H$, and continuously changes in accordance with the control voltage VC when the control voltage VC is equal to or higher than $V_L$ and equal to or lower than $V_H$.

By using a high frequency amplification circuit having such characteristics, the transmission power of the mobile communication terminal can be controlled. For example, with the time division multiple access system represented by the PDC system, burst communication is performed between a mobile communication terminal and a base station. Therefore, as shown in FIG. 32, the power of a signal transmitted between the mobile communication terminal and the base station is high during a communication period and low during a non-communication period. Such a transmission signal can be easily generated by supplying the gain control terminal 913 of the high frequency amplification circuit (FIG. 30) with a first control voltage during the communication period and with a second control voltage lower than the first control voltage during the non-communication period.

A gain control circuit included in a high frequency circuit block of a transmission section of a mobile communication terminal as described above is configured by using, for example, a MESFET (Metal Semiconductor Field Effect Transistor). In a gain control circuit including an FET, gain control is performed by the FET operating as a variable resistor. A conventionally known gain control circuit including an FET is, for example, described in Japanese Laid-Open Patent Publication No. 10-256853.

FIG. 33 is a circuit diagram showing a conventional gain control circuit 920 described in Japanese Laid-Open Patent Publication No. 10-256853. The gain control circuit 920 shown in FIG. 33 includes resistors 921 and 922 and an FET 923 for attenuation control, and acts as a variable attenuation circuit. As shown in FIG. 33, the resistor 921 is provided between a signal input terminal 931 and a signal output terminal 932. The signal input terminal 931 is also connected to one end of the resistor 922, and the other end of the resistor 922 is connected to a positive power source 924. The FET 923 is provided parallel to the resistor 921. The end of the resistor 921 closer to the signal input terminal 931 is connected to a source terminal of the FET 923, and the end of the resistor 921 closer to the signal output terminal 932 is connected to a drain terminal of the FET 923. A gate terminal of the FET 923 is connected to an attenuation control terminal 933 via a resistor 925. A control voltage VC is applied to the attenuation control terminal 933 for adjusting an attenuation in the gain control circuit 920.

Hereinafter, the voltage value of the power source 924 will be represented as Vref, the threshold voltage of the FET 923 will be represented as Vth, the voltage applied to the attenuation control terminal 933 will be represented as VC, and the potentials at the gate terminal, the source terminal and the drain terminal of the FET 923 will be respectively represented as Vg, Vs and Vd. The maximum value of the control voltage VC at which the FET 923 is in a disconnected state (i.e., a state where the resistance value between the source terminal and the drain terminal is in a high impedance state) will be represented as VC(off). The minimum value of the control voltage VC at which the FET 923 is in a conductive state (i.e., a state where the resistance value between the source terminal and the drain terminal is in a low impedance state) will be represented as VC(on). The difference between VC(off) and VC(on) will be represented as Vw.

When the FET 923 is just put into the disconnected state (i.e., when the FET 923 will not be in the disconnected state if the potential at the gate terminal becomes higher than the current value), the potentials at the gate terminal and the source terminal have a relationship represented by expression (1).

$$Vg - Vs = Vth \quad (1)$$

With the voltage drop by the resistors 921, 922 and 925 being ignored, the potentials at the terminals of the FET 923 are represented by expressions (2) through (4) using the voltage value Vref of the power source 924 and VC(off).

$$Vg = VC(\text{off}) \quad (2)$$

$$Vs = Vref \quad (3)$$

$$Vd = Vref \quad (4)$$

By substituting expressions (2) and (3) for expression (1), expression (5) is obtained using voltage VC(off). VC(on) is represented by expression (6).

$$VC(\text{off}) = Vref + Vth \quad (5)$$

$$VC(\text{on}) = Vref + Vth + Vw \quad (6)$$

According to expressions (2) through (5), it is appreciated that the potentials at the terminals of the FET 932 when the FET 932 is just put into the disconnected state are determined by the threshold voltage Vth of the FET 923 and the voltage value Vref of the power source 924.

In the conventional gain control circuit shown in FIG. 33, the control voltage VC is changed in the state where the voltage value Vref of the power source 924 is fixed, so that the potential between the gate terminal and the source terminal of the FET 923 is changed, and the ON resistance value between the source terminal and the drain terminal of the FET 923 is changed. In this behavior, the attenuation between the signal input terminal 931 and the signal output terminal 932 is changed in accordance with the control voltage VC. Thus, the gain control can be performed based on the control voltage VC.

However, the above-described conventional gain control circuit has the following problems. As described above, expression (5) is fulfilled with the conventional gain control circuit. However, when the threshold voltage Vth of the FET 923 is varied due to, for example, inconsistencies in the production process or the operating temperature change, the control voltage VC(off) at which the FET 923 is just put into the disconnected state is varied. For this reason, with the conventional gain control circuit, when the threshold voltage of the FET 923 is varied due to, for example, inconsistencies in the production process or the operating temperature change, the attenuation of the high frequency signal in the FET 923 is varied and thus the gain of the high frequency amplification circuit is varied.

In addition, with the conventional gain control circuit, the dynamic range is determined by the difference between (i) the ON resistance between the source terminal and the drain terminal of the FET 923 when the FET 923 is in the disconnected state and (ii) the ON resistance when the FET 923 is in the conductive state. In order to broaden the dynamic range, the resolution of the control voltage needs to be improved, which necessitates connection of a D/A converter having a high resolution of output voltage to the gain control terminal. This enlarges the circuit scale of the D/A converter and thus increases the control parameters of the attenuation, which complicate the control circuit.

SUMMARY OF THE INVENTION

Therefore, an object of the present invention is to provide a high frequency amplification circuit having a reduced influence on the gain exerted by a variation in the threshold voltage of the FET which is caused by, for example, inconsistencies in the production process or the operating temperature change, a high frequency amplification circuit having a broadened gain control range while preventing the control circuit from being enlarged or being complicated, and a mobile communication terminal using such a high frequency amplification circuit.

The present invention has the following features to attain the object mentioned above.

A high frequency amplification circuit according to the present invention comprises a terminal group including a signal input terminal to which a high frequency signal to be amplified is to be input, a signal output terminal for outputting the amplified high frequency signal, a gain control terminal to which a control voltage is to be applied, and a reference voltage terminal to which a reference voltage is to be applied; an amplifier provided between the signal input terminal and the signal output terminal for amplifying the input high frequency signal; a gain control circuit, provided between the signal input terminal and the signal output terminal and connected in series to the amplifier, for changing an attenuation of the input high frequency signal in accordance with the control voltage applied to the gain control terminal; and a reference voltage circuit for generating an internal reference voltage from the reference voltage applied to the reference voltage terminal and supplying the generated internal reference voltage to the gain control circuit. The gain control circuit includes at least one first field effect transistor for receiving the control voltage at a gate terminal thereof, the gain control circuit having a resistance value which is changed in accordance with the given control voltage. The reference voltage circuit includes a second field effect transistor having a threshold voltage which is substantially equal to that of the at least one first field effect transistor, the second field effect transistor being provided for generating the internal reference voltage which is shifted with respect to the reference voltage by the threshold voltage. The gain control circuit continuously changes the attenuation of the input high frequency signal by the resistance value of the at least one first field effect transistor being continuously changed. The reference voltage circuit supplies the internal reference voltage to a source terminal and/or a drain terminal of the at least one first field effect transistor, thereby counteracting an influence exerted by the threshold voltage of the at least one first field effect transistor on a change in the attenuation of the high frequency signal in the gain control circuit.

In this case, the high frequency amplification circuit may further comprise an attenuation circuit provided between the signal input terminal and the ground terminal, or an attenuation circuit provided between the signal output terminal and a ground terminal. Alternatively, the high frequency amplification circuit may further comprise an attenuation circuit provided between the signal input terminal and the ground terminal and an attenuation circuit provided between the signal output terminal and the ground terminal. The attenuation circuit may include a resistor and a capacitor connected in series to each other.

The gain control circuit may further comprise a resistor connected to the source terminal and the drain terminal of the at least one first field effect transistor.

Alternatively, the gain control circuit may comprise a control voltage division circuit provided between the gain control terminal and the ground terminal for dividing the control voltage to obtain a plurality of voltages; a plurality of the first field effect transistors connected in series to each other and each having a gate terminal to which the voltage obtained by the control voltage division circuit is to be applied; and a plurality of resistors connected to source terminals and drain terminals of the plurality of first field effect transistors.

The reference voltage circuit may comprise a reference voltage division circuit provided between the reference voltage terminal and the ground terminal for dividing the reference voltage; a resistor provided between the reference voltage terminal and a drain terminal of the second field effect transistor; and a resistor provided between the ground terminal and a source terminal of the second field effect transistor. Preferably, a potential, at the drain terminal or the source terminal of the second field effect transistor in the case where a voltage obtained by the reference voltage division circuit is applied to a gate terminal of the second field effect transistor, is output as the internal reference voltage.

Alternatively, a high frequency amplification circuit according to the present invention comprises a terminal group including a signal input terminal to which a high frequency signal to be amplified is to be input, a signal output terminal for outputting the amplified high frequency signal, a gain control terminal to which a control voltage is to be applied, and a reference voltage terminal to which a reference voltage is to be applied; an amplifier provided between the signal input terminal and the signal output terminal for amplifying the input high frequency signal; a gain control circuit, provided between the signal input terminal and the signal output terminal and connected in series to the amplifier, for changing an attenuation of the input high frequency signal in accordance with the control voltage applied to the gain control terminal; and a reference voltage circuit for generating an internal reference voltage from the reference voltage applied to the reference voltage terminal and supplying the generated internal reference voltage to the gain control circuit. The gain control circuit may include a first field effect transistor for receiving the control voltage at a gate terminal thereof, the gain control circuit having a resistance value which is changed in accordance with the given control voltage. The reference voltage circuit may include a plurality of second field effect transistors for generating a voltage which is shifted with respect to the reference voltage by a threshold voltage of the second field effect transistors, and a voltage division circuit for dividing the generated voltage. The gain control circuit may continuously change the attenuation of the input high frequency signal by the resistance value of the first field effect transistor being continuously changed. The reference voltage circuit may supply a voltage obtained by the voltage division circuit to a source terminal and/or a drain terminal of the first field effect transistor as the internal reference voltage, thereby counteracting an influence exerted by a threshold voltage of the first field effect transistor on a change in the attenuation of the high frequency signal in the gain control circuit.

In this case, the gain control circuit may further comprise a resistor connected to the source terminal and the drain terminal of the first field effect transistor. The reference voltage circuit may comprise a reference voltage division circuit provided between the reference voltage terminal and the ground terminal for dividing the reference voltage; and two second field effect transistors, as the plurality of second field effect transistors, provided between the reference voltage terminal and the ground terminal and connected parallel to each other. Among the two second field effect transistors, one second field effect transistor may be configured such that a voltage obtained by the reference voltage division circuit is applied to a gate terminal thereof, a first resistor is provided between a drain terminal thereof and the reference voltage terminal, and a second resistor is provided between a source terminal thereof and the ground terminal. The other second field effect transistor may be configured such that a gate terminal thereof is connected to the source terminal of the one second field effect transistor, a third resistor is provided between a drain terminal thereof and the reference voltage terminal, and a fourth resistor and a fifth resistor connected in series to each other are provided as the voltage division circuit between a source terminal thereof and the ground terminal. A potential between the fourth resistor and the fifth resistor may be output as the internal reference voltage.

Alternatively, a high frequency amplification circuit according to the present invention comprises a terminal group including first and second signal input terminals to which first and second high frequency signals to be amplified are respectively to be input, first and second signal output terminals respectively for outputting the amplified high frequency signals, a gain control terminal to which a control voltage is to be applied, and a reference voltage terminal to which a reference voltage is to be applied; a first amplifier provided between the first signal input terminal and the first signal output terminal for amplifying the input first high frequency signal; a second amplifier provided between the second signal input terminal and the second signal output terminal for amplifying the input second high frequency signal; a first gain control circuit, provided between the first signal input terminal and the first signal output terminal and connected in series to the first amplifier, for changing an attenuation of the input first high frequency signal in accordance with the control voltage applied to the gain control terminal; a second gain control circuit, provided between the second signal input terminal and the second signal output terminal and connected in series to the second amplifier, for changing an attenuation of the input second high frequency signal in accordance with the control voltage applied to the gain control terminal; and a reference voltage circuit for generating first and second internal reference voltages from the reference voltage applied to the reference voltage terminal and supplying the generated first and second internal reference voltages respectively to the first and second gain control circuits. The first gain control circuit may include a first field effect transistor for receiving the control voltage at a gate terminal thereof, the first gain control circuit having a resistance value which is changed in accordance with the given control voltage. The second gain control circuit may include a second field effect transistor for receiving the control voltage at a gate terminal thereof, the second gain control circuit having a resistance value which is changed in accordance with the given control voltage. The reference voltage circuit may include a plurality of third field effect transistors for generating a voltage which is shifted with respect to the reference voltage by a threshold voltage of the third field effect transistors, and a voltage division circuit for dividing the generated voltage and generating the first and second internal reference voltages. The first and second gain control circuits may continuously change the attenuation of the input first and second high frequency signals respectively by the resistance values of the first and second field effect transistors being continuously changed. The reference voltage circuit may supply the first and second internal reference voltages generated by the voltage division circuit to source terminals and/or drain terminals of the first and second field effect transistors respectively, thereby counteracting influences exerted by the threshold voltages of the first and second field effect transistors on changes in the attenuation of the high frequency signals in the first and second gain control circuits, respectively.

In this case, the first and second gain control circuits may further comprise a resistor connected to the source terminal and the drain terminal of the first field effect transistor.

The reference voltage circuit may comprise a reference voltage division circuit provided between the reference voltage terminal and the ground terminal for dividing the reference voltage; two third field effect transistors, as the plurality of third field effect transistors, provided between the reference voltage terminal and the ground terminal and connected parallel to each other. Among the two third field effect transistors, one third field effect transistor may be configured such that a voltage obtained by the reference voltage division circuit is applied to a gate terminal thereof, a first resistor is provided between a drain terminal thereof and the reference voltage terminal, and a second resistor is provided between a source terminal thereof and the ground terminal. The other third field effect transistor may be configured such that a gate terminal thereof is connected to the source terminal of the one third field effect transistor, a third resistor is provided between a drain terminal thereof and the reference voltage terminal, and fourth through seventh resistors are provided as the voltage division circuit between a source terminal thereof and the ground terminal. A first resistor series circuit including the fourth and fifth resistors, and a second resistor series circuit including the sixth and seventh resistors, may be connected parallel to each other. A potential between the fourth resistor and the fifth resistor may be output to the first gain control circuit as the first internal reference voltage; and a potential between the sixth resistor and the seventh resistor may be output to the second gain control circuit as the second internal reference voltage.

Alternatively, the reference voltage circuit may comprise a reference voltage division circuit provided between the reference voltage terminal and the ground terminal for dividing the reference voltage; two third field effect transistors, as the plurality of third field effect transistors, provided between the reference voltage terminal and the ground terminal and connected parallel to each other. Among the two third field effect transistors, one third field effect transistor may be configured such that a voltage obtained by the reference voltage division circuit is applied to a gate terminal thereof, a first resistor is provided between a drain terminal thereof and the reference voltage terminal, and a second resistor is provided between a source terminal thereof and the ground terminal. The other third field effect transistor may be configured such that a gate terminal thereof is connected to the source terminal of the one third field effect transistor, a third resistor is provided between a drain terminal thereof and the reference voltage terminal, and fourth, fifth and sixth resistors connected in series are provided as the voltage division circuit between a source terminal thereof and the ground terminal. A potential between the fifth resistor and the sixth resistor may be output to the first gain control circuit as the first internal reference voltage; and a potential between the fourth resistor and the fifth resistor may be output to the second gain control circuit as the second internal reference voltage.

Alternatively, a high frequency amplification circuit according to the present invention comprises a terminal group including a signal input terminal to which a high frequency signal to be amplified is to be input, a signal output terminal for outputting the amplified high frequency signal, a gain control terminal to which a control voltage is to be applied, and a reference voltage terminal to which a reference voltage is to be applied; a signal line connected between the signal input terminal and the signal output terminal for allowing the input high frequency signal to flow therethrough; an amplifier provided on the signal line for amplifying the input high frequency signal; a control voltage circuit for generating an internal control voltage from the control voltage applied to the gain control terminal; and a gain control circuit provided on the signal line for changing an attenuation of the high frequency signal flowing through the signal line in accordance with the internal control voltage. The gain control circuit may include a first field effect transistor provided between the signal input terminal and the ground terminal for receiving the reference voltage at a gate terminal thereof and receiving the internal control voltage at a source terminal and/or a drain terminal thereof, the gain control circuit having a resistance value which is changed in accordance with the given internal control voltage. The control voltage circuit may include a second field effect transistor having a threshold voltage which is substantially equal to that of the first field effect transistor, the second field effect transistor being provided for generating the internal reference voltage which is shifted with respect to the control voltage by the threshold voltage. The gain control circuit may continuously change the attenuation of the high frequency signal flowing through the signal line by the resistance value of the first field effect transistor being continuously changed. The control voltage circuit may supply the internal control voltage to the gain control circuit, thereby counteracting an influence exerted by the threshold voltage of the first field effect transistor on a change in the attenuation of the high frequency signal in the gain control circuit.

In this case, the gain control circuit may further comprise a resistor connected to the source terminal and the drain terminal of the first field effect transistor. The control voltage circuit may further comprise a resistor provided between the reference voltage terminal and a drain terminal of the second field effect transistor; and a resistor provided between the ground terminal and a source terminal of the second field effect transistor. The control voltage may be applied to a gate terminal of the second field effect transistor. The drain terminal and/or the source terminal of the first field effect transistor may be connected to the source terminal or the drain terminal of the second field effect transistor.

A mobile communication terminal according to the present invention comprises a high frequency circuit block including a synthesizer section, a transmission section, a receiving section, and a common use section. The transmission section comprises a modulator for converting an input modulation signal into a plurality of transmission signals having different transmission frequencies from each other; and a plurality of amplification sections respectively for amplifying the plurality of transmission signals obtained by the modulator. Each of the plurality of amplification sections comprises a high frequency amplification circuit having a variable gain for amplifying one of the plurality of transmission signals obtained by the modulator; a band-pass filter for extracting a signal component of a predetermined band from the transmission signal amplified by the high frequency amplification circuit; a high output high frequency amplification circuit having a fixed gain for amplifying the signal extracted by the band-pass filter; and an isolator, provided between the high output high frequency amplification circuit and the common use section, for allowing the signal in one direction from the high output high frequency amplification circuit toward the common use section. At least one of the high frequency amplification circuits is one of the above high frequency amplification circuits.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
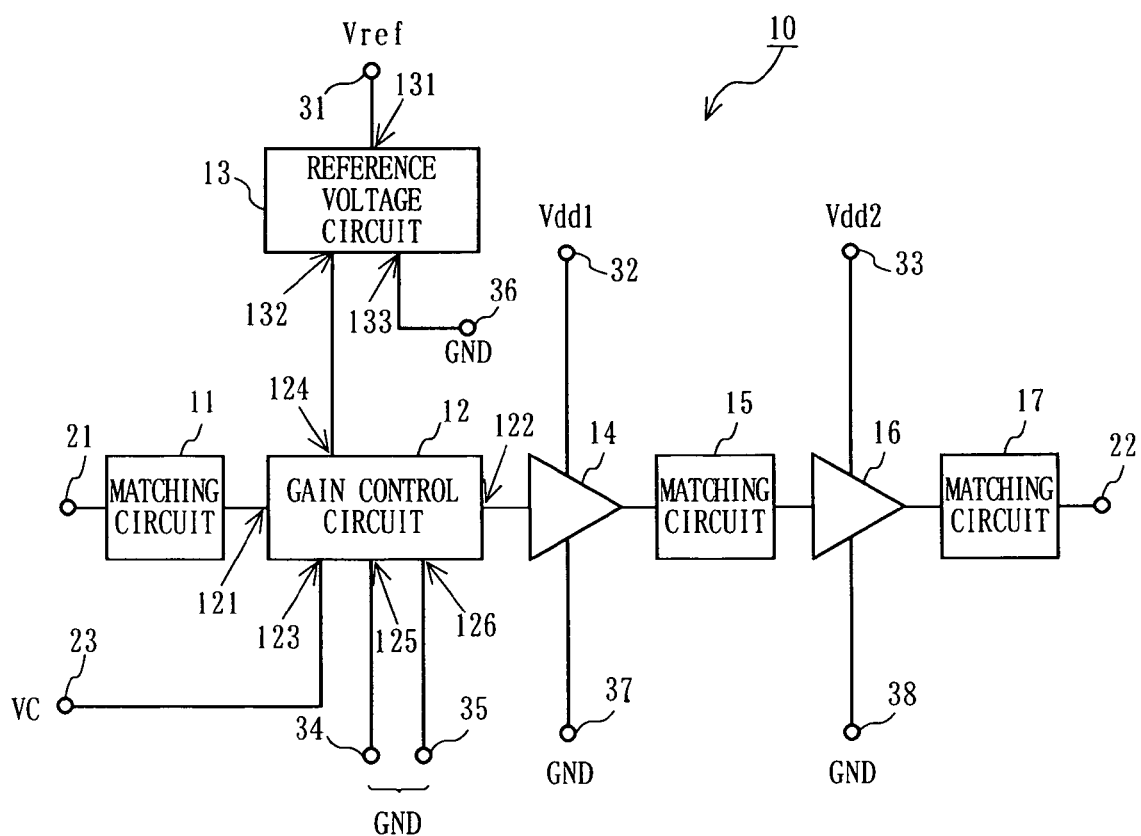
FIG. 1 is a block diagram showing a structure of a high frequency amplification circuit according to a first embodiment of the present invention.
Figure 2:
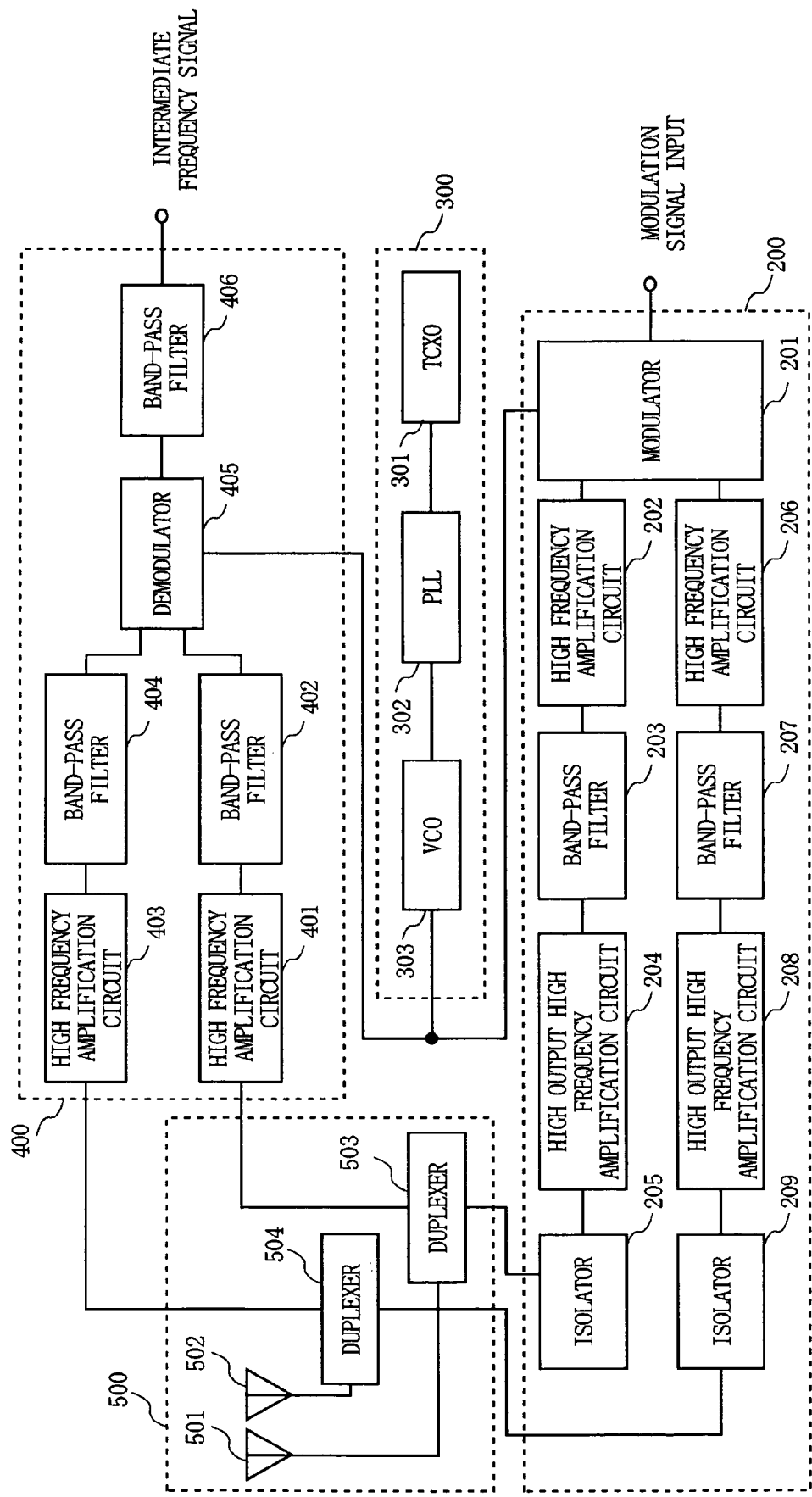
FIG. 2 is a block diagram showing a structure of a wireless section of a cellular phone terminal including the high frequency amplification circuit shown in FIG. 1.

FIG. 1 is a block diagram showing a structure of a high frequency amplification circuit 10 according to a first embodiment of the present invention. FIG. 2 is a block diagram showing a structure of a wireless section of a cellular phone terminal including the high frequency amplification circuit 10 shown in FIG. 1. The high frequency amplification circuit 10 shown in FIG. 1 is used as a high frequency amplification circuit 202 and/or a high frequency amplification circuit 206 in the wireless section of the cellular phone terminal shown in FIG. 2. In other words, the cellular phone terminal according to this embodiment is the mobile communication terminal shown in FIG. 2 in which at least one of the high frequency amplification circuits 202 and 206 has the structure of the high frequency amplification circuit 10 shown in FIG. 1.

Before describing the high frequency amplification circuit 10 in detail, the wireless section of the cellular phone terminal shown in FIG. 2 will be described in detail. The cellular phone terminal according to this embodiment is compatible to a plurality of communication systems including the PDC system and the W-CDMA system. As shown in FIG. 2, the wireless section of the cellular phone terminal includes a transmission section 200, a synthesizer section 300, a receiving section 400, and a common use section 500.

The synthesizer section 300 includes a temperature controlled crystal oscillator 301 (labeled as "TCXO" in FIG. 2), a phase locked loop circuit 302 (labeled as "PLL" in FIG. 2), and a voltage controlled oscillator 303 (labeled as "VCO" in FIG. 2). The synthesizer section 300 supplies a signal having a predetermined frequency to the transmission section 200 and the receiving section 400.

The transmission section 200 includes a modulator 201, the high frequency amplification circuits 202 and 206, band-pass filters 203 and 207, high output high frequency amplification circuits 204 and 208, and isolators 205 and 209. The modulator 201 performs two ways of modulation using carrier waves having different transmission frequencies from each other based on an input signal, and outputs two transmission signals (hereinafter, referred to as "first and second transmission signals"). The high frequency amplification circuit 202, the band-pass filter 203, the high output high frequency amplification circuit 204 and the isolator 205 are included in a first amplification section. The high frequency amplification circuit 206, the band-pass filter 207, the high output high frequency amplification circuit 208 and the isolator 209 are included in a second amplification section, which operates independently from the first amplification section.

The modulator 201 outputs, for example, a transmission signal modulated in accordance with the PDC system (transmission frequency: about 900 MHz) as the first transmission signal, and a transmission signal modulated in accordance with the W-CDMA system (transmission frequency: about 1.9 GHz) as the second transmission signal. The first and second transmission signals are input to the first and second amplification sections, respectively. The high frequency amplification circuit 202 is a variable gain amplification circuit and amplifies the first transmission signal (1 mW or less) to about 10 mW at the maximum. The band-pass filter 203 extracts a signal component of the transmission wave band from the high frequency signal amplified by the high frequency amplification circuit 202. The high output high frequency amplification circuit 204 is a fixed gain amplification circuit and amplifies the high frequency signal (10 mW or less) output from the band-pass filter 203 to about 1 W at the maximum. The isolator 205 allows the signal to pass in one direction from the high output high frequency amplification circuit 204 toward the common use section 500. The elements included in the second amplification section operate in substantially the same behavior.

The common use section 500 includes antennas 501 and 502, and duplexers 503 and 504. The duplexer 503 has a TX terminal connected to an output terminal of the isolator 205, an RX terminal connected to one of two input terminals of the receiving section 400, and an ANT terminal connected to the antenna 501. The duplexer 504 has a TX terminal connected to an output terminal of the isolator 209, an RX terminal connected to the other input terminal of the receiving section 400, and an ANT terminal connected to the antenna 502.

The receiving section 400 includes high frequency amplification circuits 401 and 403, band-pass filters 402, 404 and 406, and a demodulator 405. The high frequency amplification circuit 401 amplifies a receiving signal received by the antenna 501, and the band-pass filter 402 extracts a signal component of the transmission wave band from the output signal from the high frequency amplification circuit 401. The high frequency amplification circuit 403 amplifies a receiving signal received by the antenna 502, and the band-pass filter 404 extracts a signal component of the transmission wave band from the output signal from the high frequency amplification circuit 403. The demodulator 405 mixes the two signal components extracted by the band-pass filters 402 and 404 and the signal which is output from the synthesizer section 300. The band-pass filter 406 extracts an intermediate frequency signal from the output signal from the demodulator 405.

Hereinafter, the high frequency amplification circuit 10 will be described in detail with reference to FIG. 1. The high frequency amplification circuit 10 includes a matching circuit 11, a gain control circuit 12, a reference voltage circuit 13, an amplifier 14, a matching circuit 15, an amplifier 16, and a matching circuit 17. The high frequency amplification circuit 10 further includes a signal input terminal 21, a signal output terminal 22, a gain control terminal 23, a reference voltage terminal 31, power source terminals 32 and 33, and ground terminals 34 through 38. As described above, the high frequency amplification circuit 10 is used as the high frequency amplification circuit 202 and/or the high frequency amplification circuit 206 in the cellular phone terminal shown in FIG. 2.

The gain control circuit 12 includes a signal input terminal 121, a signal output terminal 122, a gain control terminal 123, a reference voltage terminal 124, and ground terminals 125 and 126. The reference voltage circuit 13 includes a reference voltage terminal 131, a reference voltage output terminal 132, and a ground terminal 133. The reference voltage output terminal 132 is connected to the reference voltage terminal 124. The reference voltage terminal 131 and the ground terminal 133 are respectively connected to the reference voltage terminal 31 and the ground terminal 36. The gain control terminal 123 is connected to the gain control terminal 23. The ground terminals 125 and 126 are respectively connected to the ground terminals 34 and 35. The power source terminals 32 and 33 are respectively connected to power source terminals of the amplifiers 14 and 16. The ground terminals 37 and 38 are respectively connected to ground terminals of the amplifiers 14 and 16.

The high frequency amplification circuit 10 performs level adjustment, and then performs two-stage amplification, on an input high frequency signal. The high frequency signal to be amplified is input from the signal input terminal 21, and the amplified signal is output from the signal output terminal 22. In order to control the gain of the high frequency amplification circuit 10, the gain control terminal 23 is supplied with a control voltage VC. The reference voltage terminal 31 is supplied with a predetermined reference voltage Vref, and the power source terminals 32 and 33 are respectively supplied with predetermined supply voltages Vdd1 and Vdd2.

The matching circuits 11, 15 and 17 are impedance matching circuits for performing impedance conversion on an input signal. The amplifier 14 performs first-stage amplification, and the amplifier 16 performs second-stage amplification. The gain control circuit 12 attenuates an input signal based on the control voltage VC applied to the gain control terminal 23 and outputs the attenuated signal.

In more detail, the signal input terminal 21 is connected to an input terminal of the matching circuit 11. An output terminal of the matching circuit 11 is connected to the signal input terminal 121 of the gain control circuit 12. The signal output terminal 122 of the gain control circuit 12 is connected to an input terminal of the amplifier 14. An output terminal of the amplifier 14 connected to an input terminal of the matching circuit 15. An output terminal of the matching circuit 15 is connected to an input terminal of the amplifier 16. An output terminal of the amplifier 16 is connected to an input terminal of the matching circuit 17. An output terminal of the matching circuit 17 is connected to the signal output terminal 22.

An input high frequency signal is input to the gain control circuit 12 via the matching circuit 11, and is attenuated by the gain control circuit 12. The output signal from the gain control circuit 12 is amplified by the amplifier 14. The output signal from the amplifier 14 is input to the amplifier 16 via the matching circuit 15, and is amplified by the amplifier 16. The output signal from the amplifier 16 is output from the signal output terminal 22 via the matching circuit 17.

Hereinafter, gain control performed by the high frequency amplification circuit 10 will be described. The gain control circuit 12 attenuates an input high frequency signal by changing a resistance value of the gain control circuit 12 based on the control voltage VC applied to the gain control terminal 23. The reference voltage circuit 13 obtains a reference voltage Vref1 for compensating for the change in the resistance value of the gain control circuit 12 (i.e., a voltage at which the resistance value of the gain control circuit 12 is constant if the control voltage VC is constant), and gives the reference voltage Vref1 to the gain control circuit 12. The high frequency amplification circuit 10 thus performs the gain control by controlling the attenuation in the gain control circuit 12 using the control voltage VC applied to the gain control terminal 23 and the reference voltage Vref1 obtained by the reference voltage circuit 13.

Figure 3:
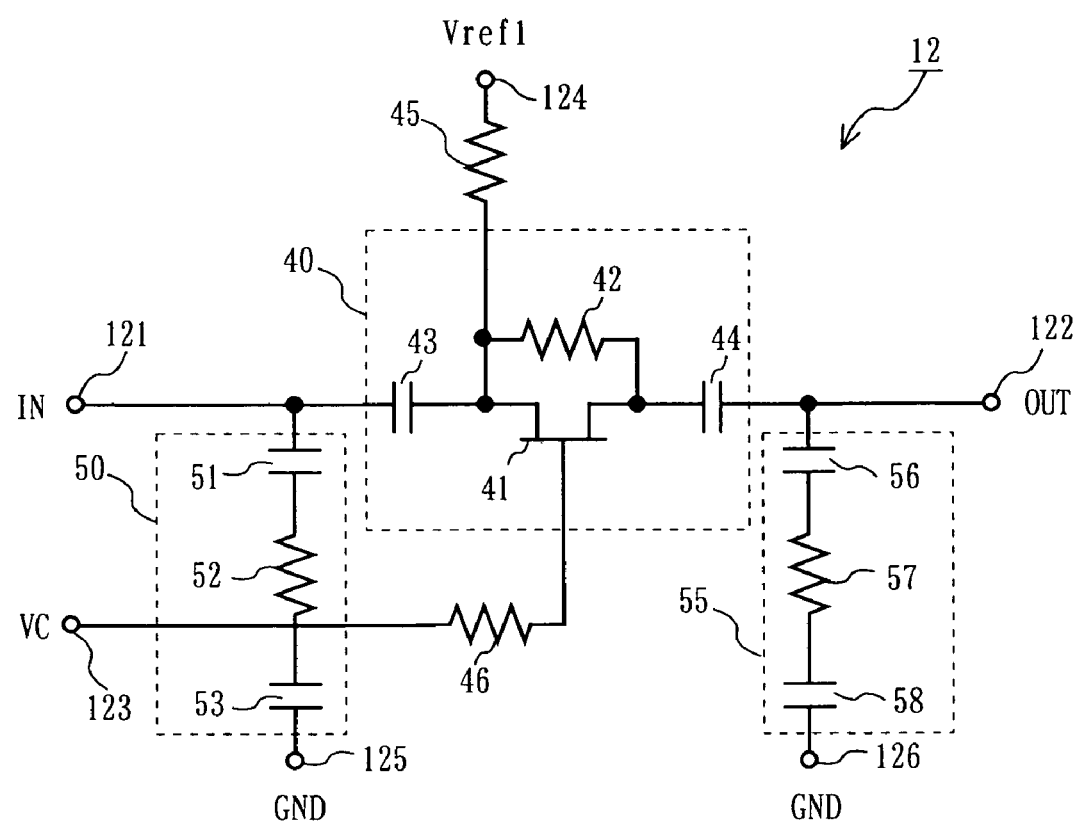
FIG. 3 is a circuit diagram of a gain control circuit included in the high frequency amplification circuit shown in FIG. 1.

FIG. 3 is a circuit diagram showing a detailed structure of the gain control circuit 12. As shown in FIG. 3, the signal input terminal 121 is connected to one end of a capacitor 43 and one end of a capacitor 51. The other end of the capacitor 43 is connected to a source terminal of an FET 41, one end of a resistor 42, and one end of a resistor 45. The other end of the resistor 45 is connected to the reference voltage terminal 124. The other end of the resistor 42 is connected to a drain terminal of the FET 41 and one end of a capacitor 44. The signal output terminal 122 is connected to the other end of the capacitor 44 and one end of a capacitor 56.

The other end of the capacitor 51 is connected to one end of a resistor 52. The other end of the resistor 52 is connected to one end of a capacitor 53. The other end of the capacitor 53 is connected to the ground terminal 125. The other end of the capacitor 56 is connected to one end of a resistor 57. The other end of the resistor 57 is connected to one end of a capacitor 58. The other end of the capacitor 58 is connected to the ground terminal 126. The gain control terminal 123 is connected to one end of a resistor 46. The other end of the resistor 46 is connected to a gate terminal of the FET 41.

In the gain control circuit 12, a variable resistance circuit 40 includes the FET 41, the resistor 42, and the capacitors 43 and 44, which are provided between the signal input terminal 121 and the signal output terminal 122. An attenuation circuit 50 includes the capacitors 51 and 53, and the resistor 52, which are provided between the signal input terminal 121 and the ground terminal 125. An attenuation circuit 55 includes the capacitors 56 and 58, and the resistor 57, which are provided between the signal output terminal 122 and the ground terminal 126.

Since the capacitors 43 and 44 are provided between the signal input terminal 121 and the signal output terminal 122, the DC resistance between the terminals 121 and 122 is infinite. Since the capacitors 51 and 53 are provided between the signal input terminal 121 and the ground terminal 125, the DC resistance between the terminals 121 and 125 is also infinite. Since the capacitors 56 and 58 are provided between the signal output terminal 122 and the ground terminal 126, the DC resistance between the terminals 122 and 126 is also infinite.

In the gain control circuit 12, the source terminal and the drain terminal of the FET 41 may be replaced with each other. The one end of the resistor 45 may be connected to the drain terminal of the FET 41 and the other end of the resistor 42, instead of the source terminal of the FET 41 and the one end of the resistor 42. In the attenuation circuit 50, the capacitor 51 and the resistor 52 may be replaced with each other, the resistor 52 and the capacitor 53 may be replaced with each other, and one of the capacitors 51 and 53 may be omitted. Substantially the same modifications may be done in the attenuation circuit 55.

Hereinafter, an operation of the FET 41 included in the gain control circuit 12 as a variable resistor will be described. In the gain control circuit 12, the resistance value between the source terminal and the drain terminal of the FET 41 is changed based on the control voltage VC applied to the gain control terminal 123 and the reference voltage Vref1 applied to the reference voltage terminal 124. As a result, the attenuation between the signal input terminal 121 and the signal output terminal 122 is changed. Thus, the gain control of the high frequency amplification circuit 10 is performed.

Figure 4:
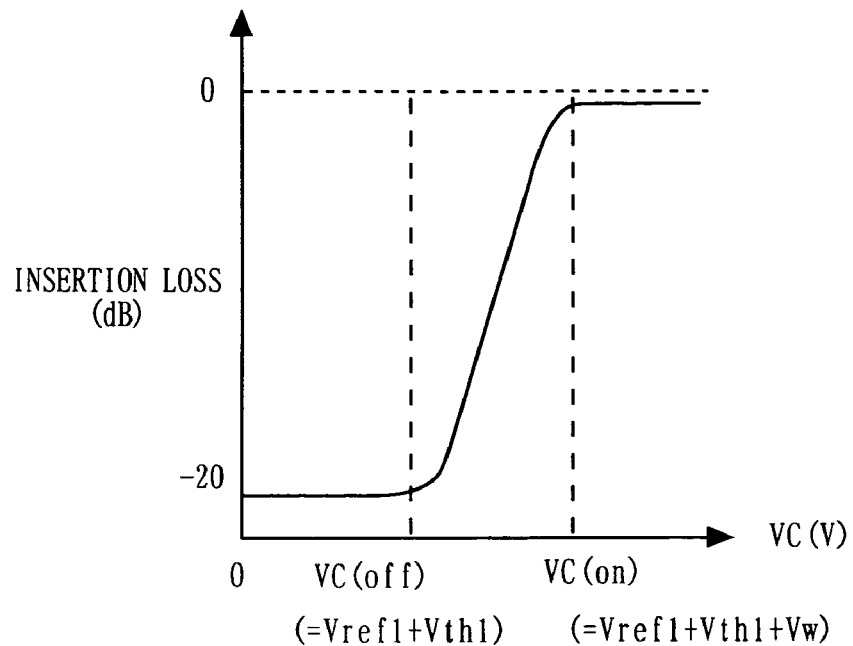
FIG. 4 is a graph illustrating the relationship between the control voltage and insertion loss in the gain control circuit shown in FIG. 3.

FIG. 4 is a graph illustrating the relationship between the control voltage and the insertion loss in the gain control circuit 12. In FIG. 4, the horizontal axis represents the control voltage VC applied to the gate terminal of the FET 41, and the vertical axis represents the attenuation between the source terminal and the drain terminal of the FET 41. It is appreciated from FIG. 4 that the impedance between the source terminal and the drain terminal of the FET 41 is in one of the following three states.

(a) When VC<VC(off): fixed to about −20 dB;
(b) When VC>VC(on): fixed to about 0 dB; and
(c) When VC(off)≦VC≦VC(on): continuously changed in accordance with the value of VC.

Hereinafter, the state in (a) above will be referred to as a "disconnected state", the state in (b) above will be referred to as a "conductive state", and the state in (c) above will be referred to as a "variable resistance state". The threshold voltage of the FET 41 will be represented as Vth1, the potentials at the gate terminal, the source terminal and the drain terminal of the FET 41 will be respectively represented as Vg, Vs and Vd. The difference between VC(off) and VC(on) will be represented as Vw.

Assuming that the resistance values of the resistors 42, 45 and 46 are sufficiently high and the voltage drop by these resistors is negligible, the potential at the gate terminal of the FET 41 is substantially equal to the control voltage VC and the potentials at the source terminal and the drain terminal of the FET 41 are substantially equal to the reference voltage Vref1. Namely, expressions (11) through (13) are fulfilled.

$$Vg = VC \qquad (11)$$

$$Vd = Vref1 \qquad (12)$$

$$Vs = Vref1 \qquad (13)$$

When the FET 41 is just put into the disconnected state (i.e., when the FET 41 will not be in the disconnected state if the potential at the gate terminal becomes higher than the current value), the potentials at the gate terminal and the source terminal of the FET 41 have a relationship represented by expression (14).

$$Vg - Vs = Vth1 \qquad (14)$$

At this point, expression (15) is also fulfilled.

$$Vg = VC(off) \qquad (15)$$

By substituting expressions (13) and (15) for expression (14), expression (16) is obtained using VC(off). VC(on) is represented by expression (17).

$$VC(off) = Vref1 + Vth1 \qquad (16)$$

$$VC(on) = Vref1 + Vth1 + Vw \qquad (17)$$

According to expressions (11) through (13) and (16), it is appreciated that the potentials at the terminals of the FET 41 when the FET 41 is just put into the disconnected state are determined by the threshold voltage Vth1 of the FET 41 and the voltage value Vref1 applied to the reference voltage terminal 124.

In the gain control circuit 12, the potential between the gate terminal and the source terminal of the FET 41 is changed by changing the control voltage VC applied to the gain control terminal 123 in the state where the reference voltage Vref1 for compensating for the resistance value is applied to the reference voltage terminal 124. Accordingly, the ON resistance value between the source terminal and the drain terminal of the FET 41 is changed. As a result, the attenuation between the signal input terminal 121 and the signal output terminal 122 is changed in accordance with the control voltage VC. Thus, the gain control is performed.

The gain control circuit 12 includes the attenuation circuit 50 between the signal input terminal 121 and the ground terminal 125 and the attenuation circuit 55 between the signal output terminal 122 and the ground terminal 126. When the control voltage VC is changed and thus the resistance value between the source terminal and the drain terminal of the FET 41 is changed, the impedance between the source terminal and the drain terminal of the FET 41 is changed. The attenuation circuits 50 and 55 act to reduce the change in the impedance.

Figure 5:
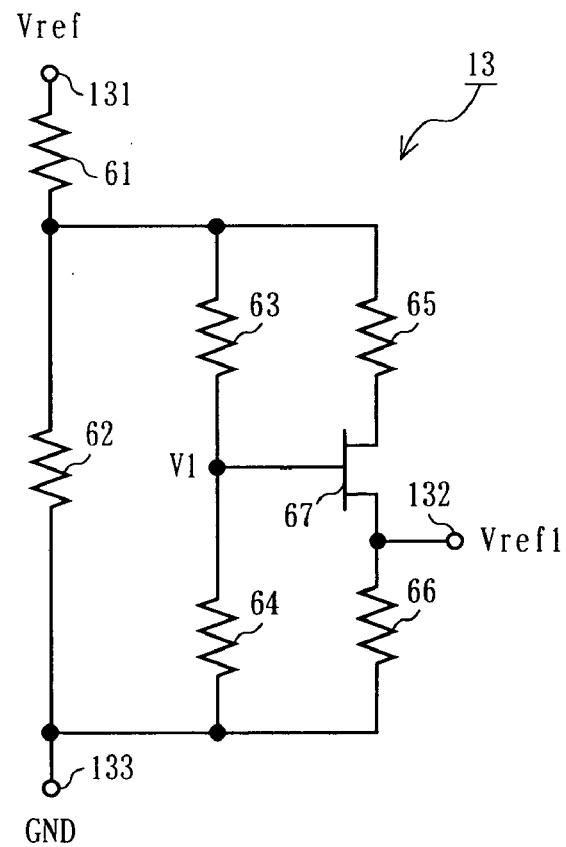
FIG. 5 is a circuit diagram of a reference voltage circuit included in the high frequency amplification circuit shown in FIG. 1.

FIG. 5 is a circuit diagram showing a detailed structure of the reference voltage circuit 13. As shown in FIG. 5, the reference voltage terminal 131 is connected to one end of a resistor 61. The other end of the resistor 61 is connected to one end of a resistor 62, one end of a resistor 63, and one end of a resistor 65. The other end of the resistor 63 is connected to a gate terminal of an FET 67 and one end of a resistor 64. Hereinafter, the potential at the connection point of the other end of the resistor 63, the gate terminal of the FET 67, and the one end of the resistor 64 will be represented as V1. The other end of the resistor 65 is connected to a drain terminal of the FET 67. The reference voltage output terminal 132 is connected to a source terminal of the FET 67 and one end of a resistor 66. The ground terminal 133 is connected to the other end of the resistor 62, the other end of the resistor 64, and the other end of the resistor 66. The reference voltage output terminal 132 may be connected to the drain terminal of the FET 67 instead of the source terminal.

Hereinafter, an operation of the reference voltage circuit 13 will be described. It is assumed that the resistance values of the resistors 65 and 66 are sufficiently high and the current flowing between the drain terminal and the source terminal of the FET 67 is negligible. Where the threshold voltage of the FET 67 is Vth, the voltage V1 applied to the gate terminal of the FET 67 is represented by expression (21) using the threshold voltage Vth of the FET 67 and the voltage value Vref1 output from the reference voltage output terminal 132.

$$Vref1 = V1 - Vth \qquad (21)$$

In the reference voltage circuit 13, the potential V1 can be set to a predetermined desired value by appropriately selecting the resistance values of the resistors 61 through 64.

In the case where the gain control circuit 12 and the reference voltage circuit 13 are produced using the same semiconductor process, the threshold voltages of the FETs included in the circuits 12 and 13 are substantially equal to each other. Therefore, expression (22) is fulfilled.

$$Vth1 = Vth \qquad (22)$$

Accordingly, VC(off) and VC(on) in the gain control circuit 12 are represented by expressions (23) and (24) from expressions (16), (17), (21) and (22).

$$VC(off) = V1 \qquad (23)$$

$$VC(on) = V1 + Vw \qquad (24)$$

Neither expression (23) nor expression (24) includes a term which depends on the threshold voltage of the FETs. Therefore, even when the threshold voltage of the FETs varies, VC(off) and VC(on) are not influenced by such a variation, and the gain control performed by the gain control circuit 12 is not influenced by such a variation, either. For this reason, the variation in the gain caused by the variation in the threshold voltage of the FETs can be reduced.

Next, specific examples of the gain control characteristics when the threshold voltage of the FETs in the high frequency amplification circuit 10 varies will be described. Here, as an example, an experimental result performed under the conditions that the frequency of the signal which is input from the signal input terminal 121 is 1.95 GHz and the reference voltage Vref applied to the reference voltage terminal 131 is 3 V will be described. With such conditions, the control voltage applied to the gain control terminal 123 was changed from 0 V to 3 V in the case where the threshold voltage Vth of the FET 41 and the FET 67 was −0.6 V, −0.5 V and −0.4 V. The results will be shown.

Figure 6:
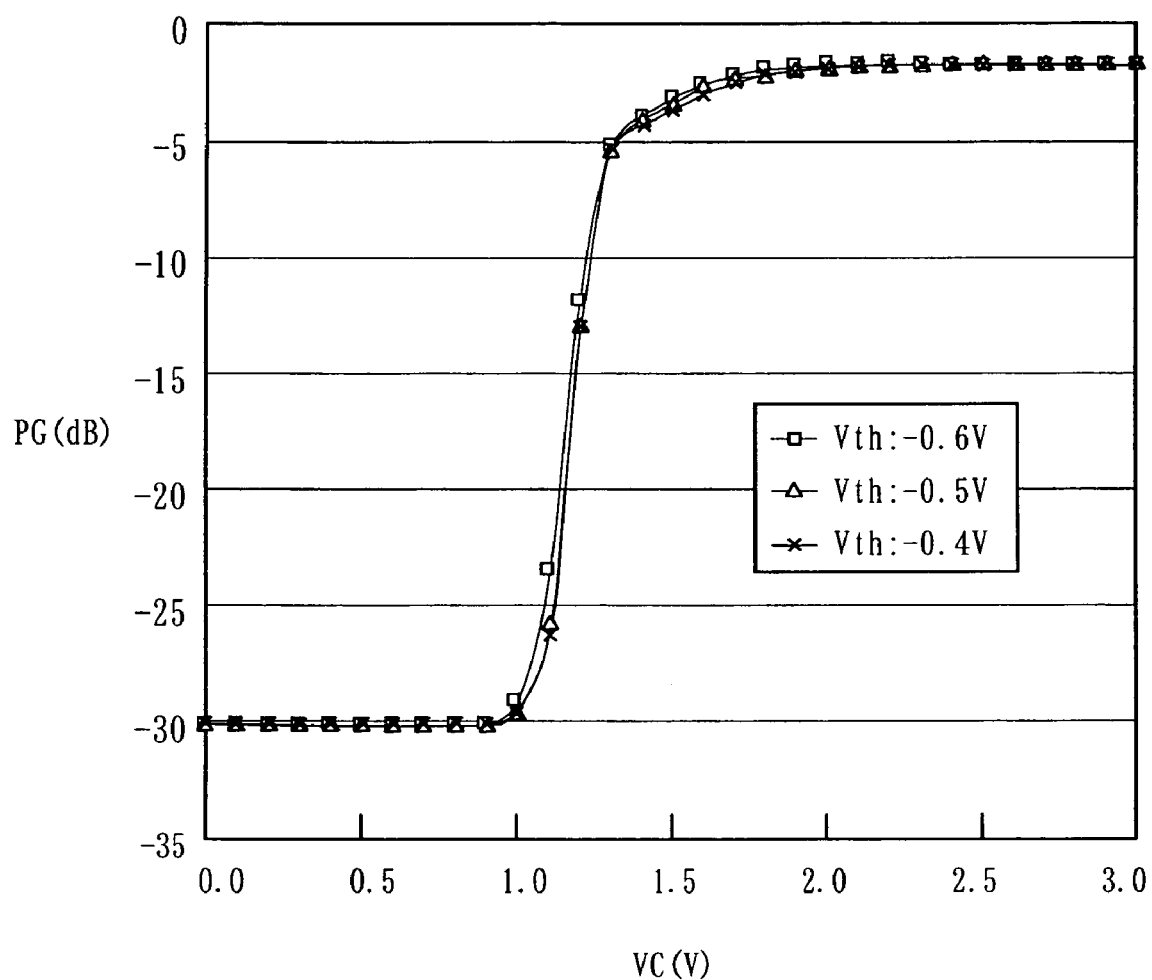
FIG. 6 is a graph illustrating the relationship between the control voltage and the input/output power ratio in the gain control circuit shown in FIG. 3.
Figure 7:
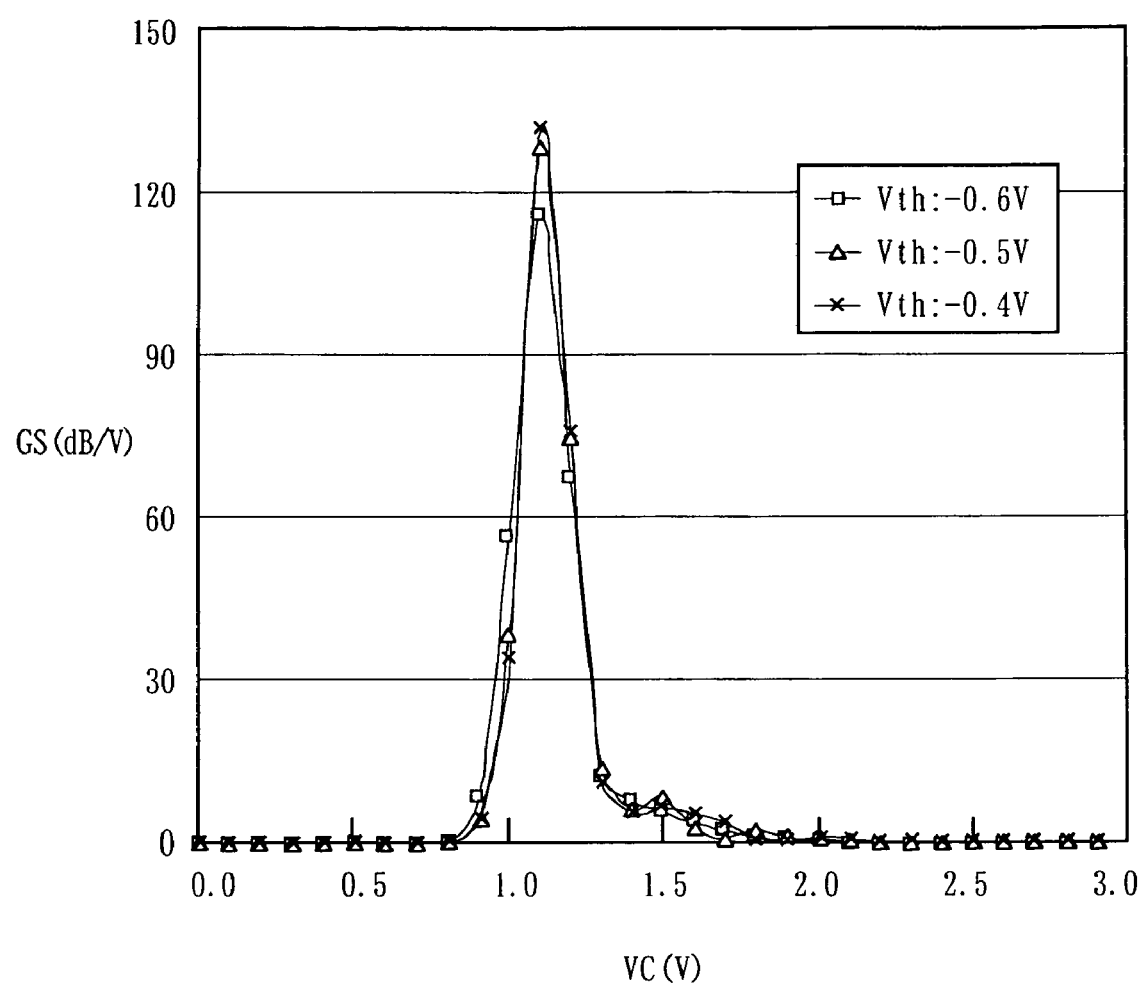
FIG. 7 is a graph illustrating the relationship between the control voltage and the gain control sensitivity in the gain control circuit shown in FIG. 3.

FIG. 6 is a graph illustrating the relationship between the control voltage and the input/output power ratio in the gain control circuit 12 operating in the above-described conditions. FIG. 7 is a graph illustrating the relationship between the control voltage and the gain control sensitivity in the gain control circuit 12 operating in the above-described conditions. In FIG. 6 and FIG. 7, the horizontal axis represents the control voltage VC applied to the gain control terminal 23. In FIG. 6, the vertical axis represents the ratio PG between the power of the input signal to the signal input terminal 121 and the power of the output signal from the signal output terminal 122. In FIG. 7, the vertical axis represents the gain control sensitivity GS. The "gain control sensitivity" is represented by a differential coefficient which is obtained by differentiating the power ratio PG shown in FIG. 6 by the control voltage.

According to FIG. 6 and FIG. 7, even when the threshold voltage of the FETs varies, the characteristics of the gain control circuit 12 are not substantially influenced by such a variation. Therefore, the high frequency amplification circuit 10 reduces the variations in the gain control characteristics and the gain control sensitivity even when the threshold voltage of the FETs varies due to the inconsistencies in the production process or the operating temperature change.

As described above, a high frequency amplification circuit according to this embodiment can reduce the variation in the gain caused by the variation in the threshold voltage of the FET included in the gain control circuit.

The reference voltage circuit 13 may include a resistor having a sufficiently high resistance value between the connection point of the resistors 63 and 64 and the gate terminal of the FET 67.

Second Embodiment

Figure 8:
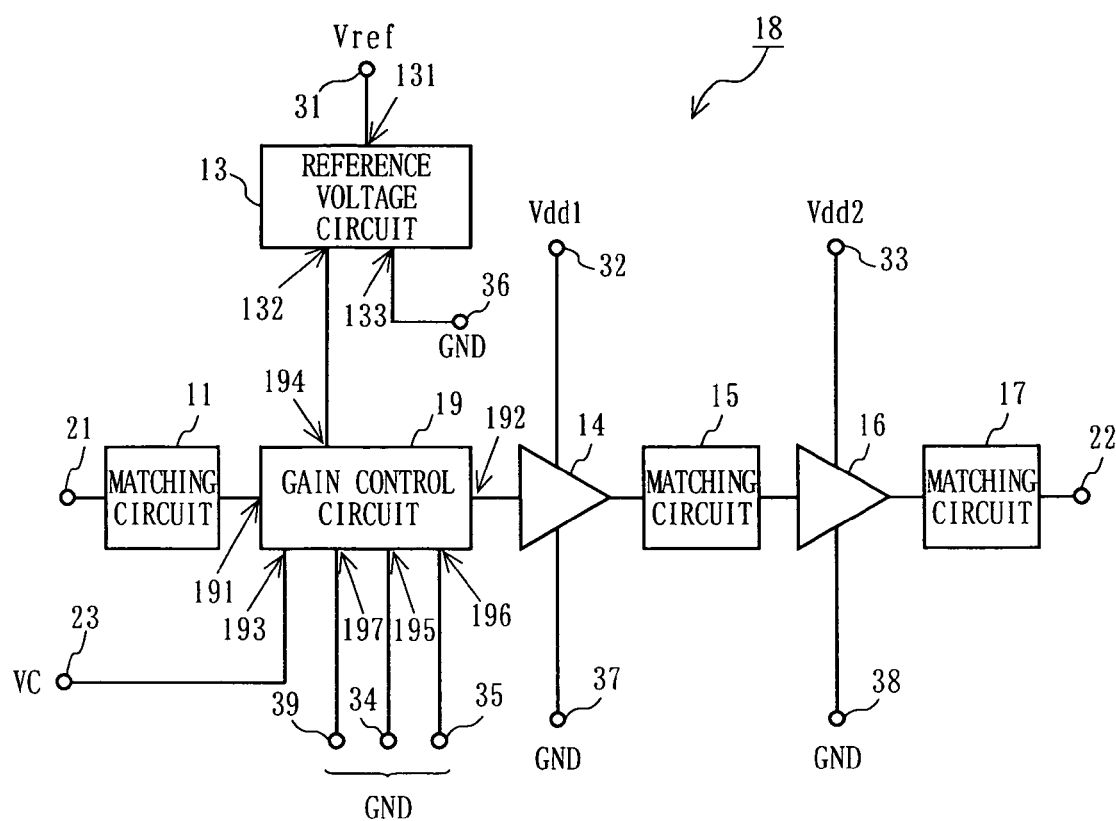
FIG. 8 is a block diagram showing a structure of a high frequency amplification circuit according to a second embodiment of the present invention.

FIG. 8 is a block diagram showing a structure of a high frequency amplification circuit 18 according to a second embodiment of the present invention. Like the high frequency amplification circuit 10 according to the first embodiment, the high frequency amplification circuit 18 shown in FIG. 8 is used as the high frequency amplification circuit 202 and/or the high frequency amplification circuit 206 in the cellular phone terminal shown in FIG. 2. In other words, a cellular phone terminal according to this embodiment is the cellular phone terminal shown in FIG. 2 in which at least one of the high frequency amplification circuits 202 and 206 has the structure of the high frequency amplification circuit 18 shown in FIG. 8. Among the elements in this embodiment, elements identical to those in the first embodiment bear identical reference numerals thereto, and descriptions thereof will be omitted.

The high frequency amplification circuit 18 is different from the high frequency amplification circuit 10 (FIG. 1) according to the first embodiment in including a gain control circuit 19 instead of the gain control circuit 12 and additionally including a ground terminal 39. The operation of the high frequency amplification circuit 18 is substantially the same as that of the high frequency amplification circuit 10.

The gain control circuit 19 includes a signal input terminal 191, a signal output terminal 192, a gain control terminal 193, a reference voltage terminal 194, and ground terminals 195 through 197. The reference voltage output terminal 132 is connected to the reference voltage terminal 194. The gain control terminal 193 is connected to the gain control terminal 23. The ground terminals 195 through 197 are respectively connected to the ground terminals 34, 35 and 39.

Figure 9:
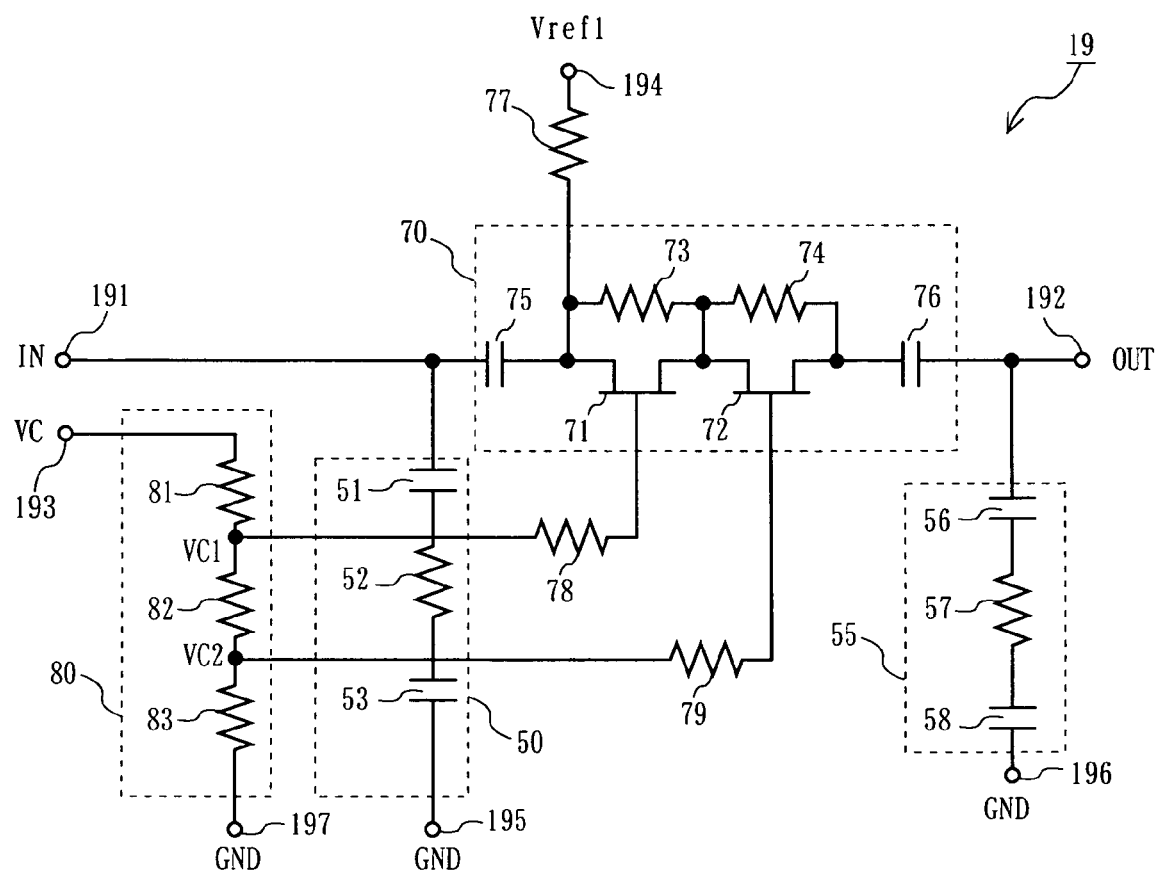
FIG. 9 is a circuit diagram of a gain control circuit included in the high frequency amplification circuit shown in FIG. 8.

FIG. 9 is a circuit diagram showing a detailed structure of the gain control circuit 19. As shown in FIG. 9, the signal input terminal 191 is connected to one end of a capacitor 75 and one end of a capacitor 51. The other end of the capacitor 75 is connected to a source terminal of an FET 71, one end of a resistor 73, and one end of a resistor 77. The other end of the resistor 77 is connected to the reference voltage terminal 194. The other end of the resistor 73 is connected to one end of a resistor 74, a drain terminal of the FET 71, and a source terminal of an FET 72. The other end of the resistor 74 is connected to a drain terminal of the FET 72 and one end of a capacitor 76. The signal output terminal 192 is connected to the other end of the capacitor 76 and one end of a capacitor 56. The capacitors 51 and 53 and the resistor 52 are connected in the same behavior as in the first embodiment. The ground terminal 195 is connected to the other end of the capacitor 53. The capacitors 56 and 58 and the resistor 57 are connected in the same behavior as in the first embodiment. The ground terminal 196 is connected to the other end of the capacitor 58.

The gain control terminal 193 is connected to one end of a resistor 81. The other end of the resistor 81 is connected to one end of a resistor 82 and one end of a resistor 78. Hereinafter, the potential at the connection point of the other end of the resistor 81, the one end of the resistor 82, and the one end of the resistor 78 will be represented as VC1. The other end of the resistor 78 is connected to a gate terminal of the FET 71. The other end of the resistor 82 is connected to one end of a resistor 83 and one end of a resistor 79. Hereinafter, the potential at the connection point of the other end of the resistor 82, the one end of the resistor 83, and the one end of the resistor 79 will be represented as VC2. The other end of the resistor 79 is connected to a gate terminal of the FET 72. The ground terminal 197 is connected to the other end of the resistor 83.

In the gain control circuit 19, a variable resistance circuit 70 includes the FETs 71 and 72, the resistors 73 and 74, and the capacitors 75 and 76, which are provided between the signal input terminal 191 and the signal output terminal 192. An attenuation circuit 50 includes the capacitors 51 and 53, and the resistor 52, which are provided between the signal input terminal 191 and the ground terminal 195. An attenuation circuit 55 includes the capacitors 56 and 58, and the resistor 57, which are provided between the signal output terminal 192 and the ground terminal 196. A voltage division circuit 80 includes the resistors 81 through 83 which are provided between the gain control terminal 193 and the ground terminal 197.

Like in the first embodiment, in the gain control circuit 19, the DC resistance between the signal input terminal 191 and the signal output terminal 192, the DC resistance between the signal input terminal 191 and the ground terminal 195, and the DC resistance between the signal output terminal 192 and the ground terminal 196 are all infinite.

In the gain control circuit 19 also, the source terminal and the drain terminal of the FET 71 may be replaced with each other. The source terminal and the drain terminal of the FET 72 may be replaced with each other. In the attenuation circuit 50, the capacitor 51 and the resistor 52 may be replaced with each other, the resistor 52 and the capacitor 53 may be replaced with each other, and one of the capacitors 51 and 53 may be omitted. Substantially the same modifications may be done in the attenuation circuit 55.

The one end of the resistor 77 may be connected to the drain terminal of the FET 71, the other end of the resistor 73, and the source terminal of the FET 72, instead of the source terminal of the FET 71 and the one end of the resistor 73. Alternatively, the one end of the resistor 77 may be connected to the drain terminal of the FET 72 and the other end of the resistor 74. The variable resistance circuit 70 may include a multiple gate FET having a plurality of gate terminals between the source terminal and the drain terminal, instead of the FETs 71 and 72.

Hereinafter, an operation of the FETs 71 and 72 included in the gain control circuit 19 as a variable resistor will be described. In the gain control circuit 19 also, the resistance value between the source terminal of the FET 71 and the drain terminal of the FET 72 is changed in accordance with the control voltage VC applied to the gain control terminal 193 and the reference voltage Vref1 applied to the reference voltage terminal 194. As a result, the attenuation between the signal input terminal 191 and the signal output terminal 192 is changed. Thus, gain control of the high frequency amplification circuit 18 is performed.

Figure 10A:
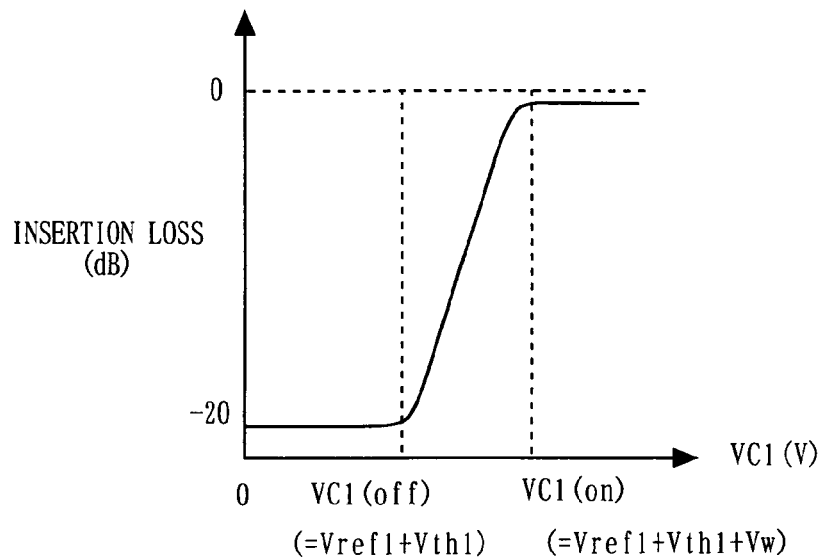
FIG. 10A is a graph illustrating the relationship between the control voltage and the insertion loss in a first FET included in the gain control circuit shown in FIG. 9.
Figure 10B:
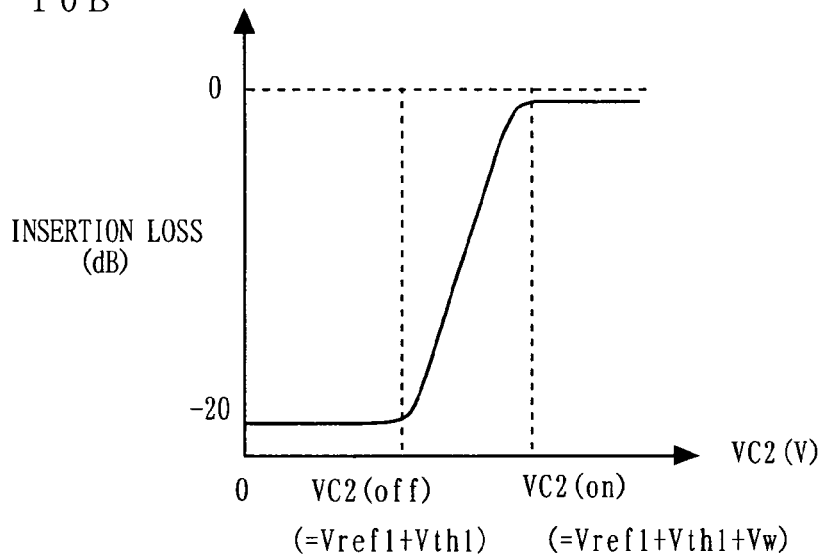
FIG. 10B is a graph illustrating the relationship between the control voltage and the insertion loss in a second FET included in the gain control circuit shown in FIG. 9.
Figure 10C:
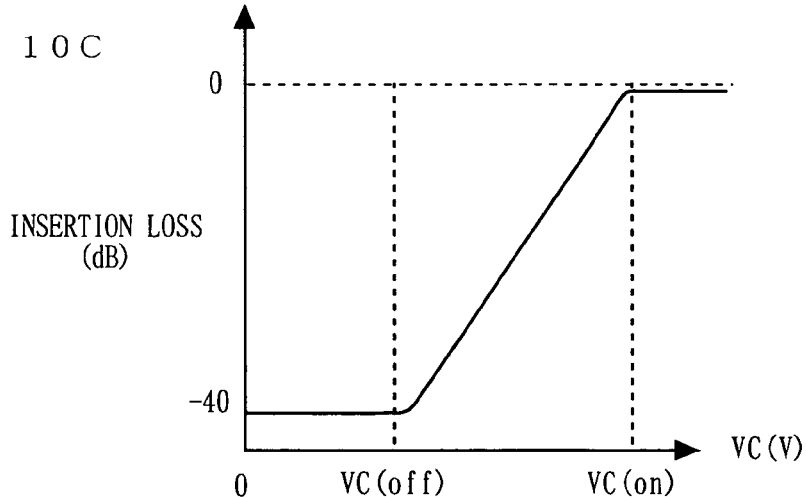
FIG. 10C is a graph illustrating the relationship between the control voltage and the insertion loss in an FET-connected circuit included in the gain control circuit shown in FIG. 9.

FIG. 10A, FIG. 10B and FIG. 10C are respectively graphs illustrating the relationship between the control voltage and the insertion loss in the FET 71, the FET 72 and a circuit including the FETs 71 and 72 connected to each other (hereinafter, referred to as an "FET-connected circuit). In FIG. 10A, the horizontal axis represents the voltage VC1 applied to the gate terminal of the FET 71, and the vertical axis represents the attenuation between the source terminal and the drain terminal of the FET 71. In FIG. 10B, the horizontal axis represents the voltage VC2 applied to the gate terminal of the FET 72, and the vertical axis represents the attenuation between the source terminal and the drain terminal of the FET 72.

It is appreciated from FIG. 10A that the impedance between the source terminal and the drain terminal of the FET 71 is in one of the following three states.

(a1) When VC1<VC1(off): fixed to about −20 dB;
(b1) When VC1>VC1(on): fixed to about 0 dB; and
(c1) When VC1(off)≦VC1≦VC1(on): continuously changed in accordance with the value of VC1.

Similarly, it is appreciated from FIG. 10B that the impedance between the source terminal and the drain terminal of the FET 72 is in one of the following three states.

(a2) When VC2<VC2(off): fixed to about −20 dB;
(b2) When VC2>VC2(on): fixed to about 0 dB; and
(c2) When VC2(off)≦VC2≦VC2(on): continuously changed in accordance with the value of VC2.

Hereinafter, the threshold voltage of the FET 71 will be represented as Vth1, the potentials at the gate terminal, the source terminal and the drain terminal of the FET 71 will be respectively represented as Vg1, Vs1 and Vd1. The difference between VC1(off) and VC1(on) will be represented as Vw.

Assuming that the resistance values of the resistors 73, 74 and 77 through 79 are sufficiently high and the voltage drop by these resistors is negligible, the potential at the gate terminal of the FET 71 is substantially equal to the voltage VC1 and the potentials at the source terminal and the drain terminal of the FET 71 are substantially equal to the reference voltage Vref1. Namely, expressions (31) through (33) are fulfilled.

$$Vg1=VC1 \tag{31}$$

$$Vd1=Vref1 \tag{32}$$

$$Vs1=Vref1 \tag{33}$$

When the FET 71 is just put into the disconnected state, the potentials at the gate terminal and the source terminal of the FET 71 have a relationship represented by expression (34).

$$Vg1-Vs1=Vth1 \tag{34}$$

At this point, expression (35) is also fulfilled.

$$Vg1=VC1(\text{off}) \tag{35}$$

By substituting expressions (33) and (35) for expression (34), expression (36) is obtained using VC1(off). VC1(on) is represented by expression (37).

$$VC1(\text{off})=Vref1+Vth1 \tag{36}$$

$$VC1(\text{on})=Vref1+Vth1+Vw \tag{37}$$

From expressions (31) through (33) and (36), it is appreciated that the potentials at the terminals of the FET 71 when the FET 71 is just put into the disconnected state are determined by the threshold voltage Vth1 of the FET 71 and the voltage value Vref1 applied to the reference voltage terminal 194.

The potential at the gate terminal, the source terminal and the drain terminal of the FET 72 will be respectively represented as Vg2, Vs2 and Vd2. It is assumed that the threshold voltage of the FET 72 is equal to the threshold voltage Vth1 of the FET 71 and the difference between VC2(off) and VC2(on) is equal to Vw. Regarding the FET 72, expressions (41) through (47) are fulfilled like regarding the FET 71.

$$Vg2=VC2 \tag{41}$$

$$Vd2=Vref1 \tag{42}$$

$$Vs2=Vref1 \tag{43}$$

$$Vg2-Vs2=Vth1 \tag{44}$$

$$Vg2=VC2(\text{off}) \tag{45}$$

$$VC2(\text{off})=Vref1+Vth1 \tag{46}$$

$$VC2(\text{on})=Vref1+Vth1+Vw \tag{47}$$

From expressions (41) through (43) and (46), it is appreciated that the potentials at the terminals of the FET 72 when the FET 72 is just put into the disconnected state are determined by the threshold voltage Vth1 of the FET 72 and the voltage value Vref1 applied to the reference voltage terminal 194.

Next, the FET-connected circuit will be described. The resistance values of the resistors 81 through 83 will be respectively represented as R1 through R3. $\alpha=(R1+R2+R3)/(R2+R3)$. $\beta=(R1+R2+R3)/R3$. The values of the control voltage VC when the voltage VC1 becomes VC1(off) and VC1(on) will be respectively represented as VC1off and VC1on. The values of the control voltage VC when the voltage VC2 becomes VC2(off) and VC2(on) will be respectively represented as VC2off and VC2on. These values are represented by expressions (51) through (54).

$$VC1\text{off}=\alpha \times VC1(\text{off}) \tag{51}$$

$$VC1\text{on}=\alpha \times VC1(\text{on}) \tag{52}$$

$$VC2\text{off}=\beta \times VC2(\text{off}) \tag{53}$$

$$VC2\text{on}=\beta \times VC2(\text{on}) \tag{54}$$

Assuming that the characteristics of the FETs 71 and 72 are equal to each other, VC1(off) and VC1(on) respectively match VC2(off) and VC2(on). Since $\alpha<\beta$, expressions (55) and (56) will be fulfilled.

$$VC1\text{off}<VC2\text{off} \tag{55}$$

$$VC1\text{on}<VC2\text{on} \tag{56}$$

Since VC1(off)<VC1(on) and VC2(off)<VC2(on), expressions (57) and (58) will be fulfilled.

$$VC1\text{off}<VC1\text{on} \tag{57}$$

$$VC2\text{off}<VC2\text{on} \tag{58}$$

From expressions (55) through (58), it is appreciated that among VC1off, VC1on, VC2off and VC2on, VC1off is minimum and VC2on is maximum.

FIG. 10C illustrates the relationship between the control voltage and the insertion loss in the FET-connected circuit. In FIG. 10C, the horizontal axis represents the control voltage VC applied to the gain control terminal 193, and the vertical axis represents the attenuation between the source terminal of the FET 71 and the drain terminal FET 72. It is appreciated from FIG. 10C that the impedance between the source terminal of the FET 71 and the drain terminal of the PET 72 is in one of the following three states.

(a3) When VC<VC(off): fixed to about −40 dB;
(b3) When VC>VC(on): fixed to about 0 dB; and
(c3) When VC(off)≦VC≦VC(on): continuously changed in accordance with the value of VC.

In this case, VC(off) and VC(on) are respectively represented by expressions (59) and (60).

$$VC(off) = VC1off \qquad (59)$$
$$= \alpha \times VC1(off)$$
$$= \alpha \times (Vref1 + Vth1)$$
$$VC(on) = VC2on \qquad (60)$$
$$= \beta \times VC2(on)$$
$$= \beta \times (Vref1 + Vth1 + Vw)$$

In the gain control circuit 19, the voltages between the gate terminal and the source terminal of the FET 71 and the FET 72 are changed by changing the control voltage VC applied to the gain control terminal 193 in the state where the reference voltage Vref1 for compensating for the resistance value is applied to the reference voltage terminal 194. Accordingly, the ON resistance value between the source terminal of the FET 71 and the drain terminal of the FET 72 is changed. As a result, the attenuation between the signal input terminal 191 and the signal output terminal 192 is changed in accordance with the control voltage VC. Thus, the gain control is performed. The function of the attenuation circuits 50 and 55 in the gain control circuit 19 is the same as in the first embodiment.

The high frequency amplification circuit 18 includes the reference voltage circuit 13 shown in FIG. 3. The structure and the operation of the reference voltage circuit 13 are described above in the first embodiment and will not be described here again. Regarding the high frequency amplification circuit 18 also, expressions (61) and (62) are fulfilled.

$$Vref1 = V1 - Vth \qquad (61)$$
$$Vth1 = Vth \qquad (62)$$

Accordingly, VC(off) and VC(on) in the gain control circuit 19 are respectively represented by expressions (63) and (64) from expressions (59) through (62).

$$VC(off) = \alpha \times V1 \qquad (63)$$
$$VC(on) = \beta \times (V1 + Vw) \qquad (64)$$

Neither expression (63) nor expression (64) includes a term which depends on the threshold voltage of the FETs. Therefore, even when the threshold voltage of the FETs varies, VC(off) and VC(on) in the gain control circuit 19 are not influenced by such a variation, and the gain control performed by the gain control circuit 19 is not influenced by such a variation, either. For this reason, the variation in the gain caused by the variation in the threshold voltage of the FETs can be reduced.

Next, specific examples of the gain control characteristics when the threshold voltage of the FETs in the high frequency amplification circuit 18 varies will be described. Here, as an example, an experimental result performed with the same conditions of the frequency of the input signal, the reference voltage, the threshold voltage of the FETs, and the control voltage as in the first embodiment will be described. The results regarding the high frequency amplification circuit 18 corresponding to those shown in FIG. 6 and FIG. 7 are shown in FIG. 11 and FIG. 12.

Figure 11:
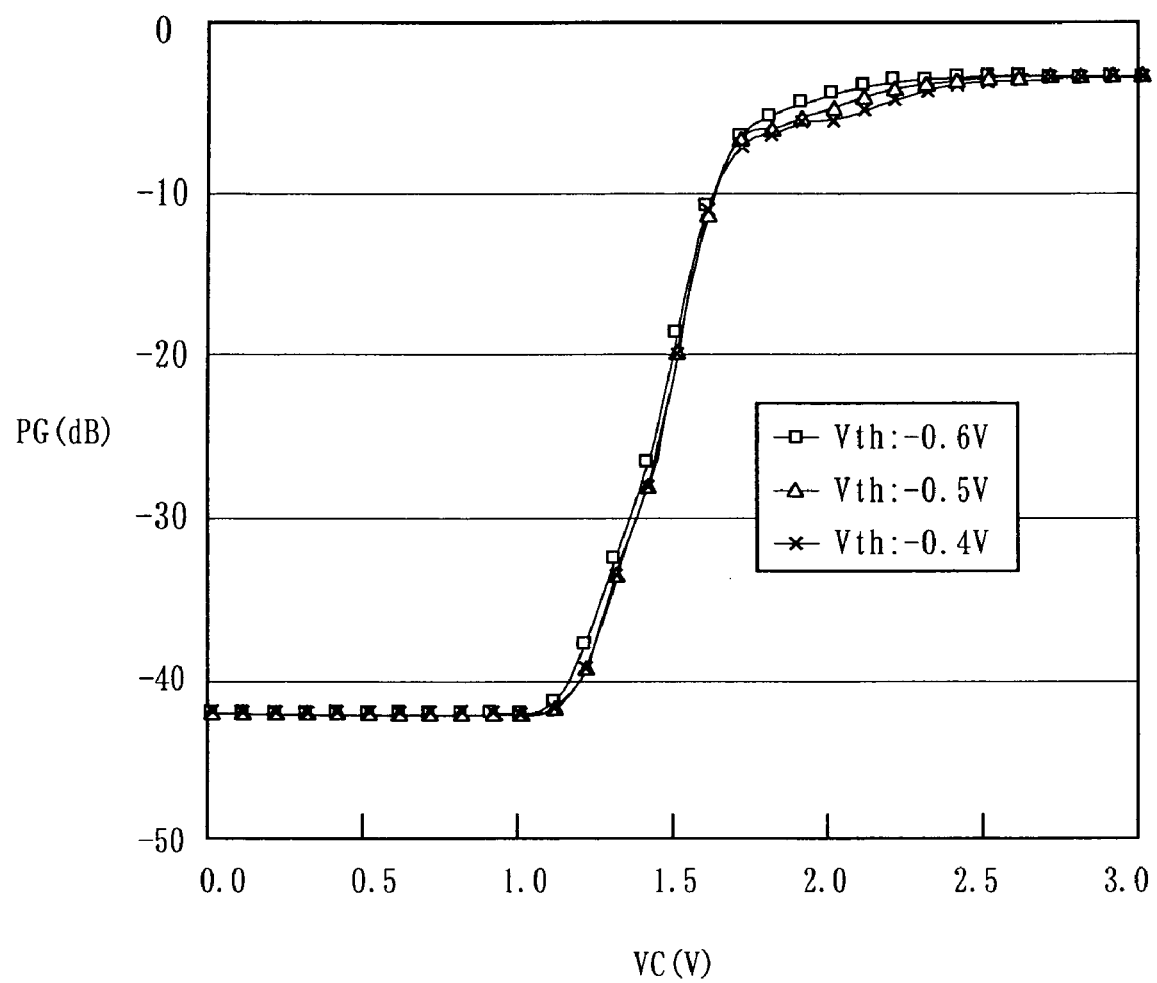
FIG. 11 is a graph illustrating the relationship between the control voltage and the input/output power ratio in the gain control circuit shown in FIG. 9.
Figure 12:
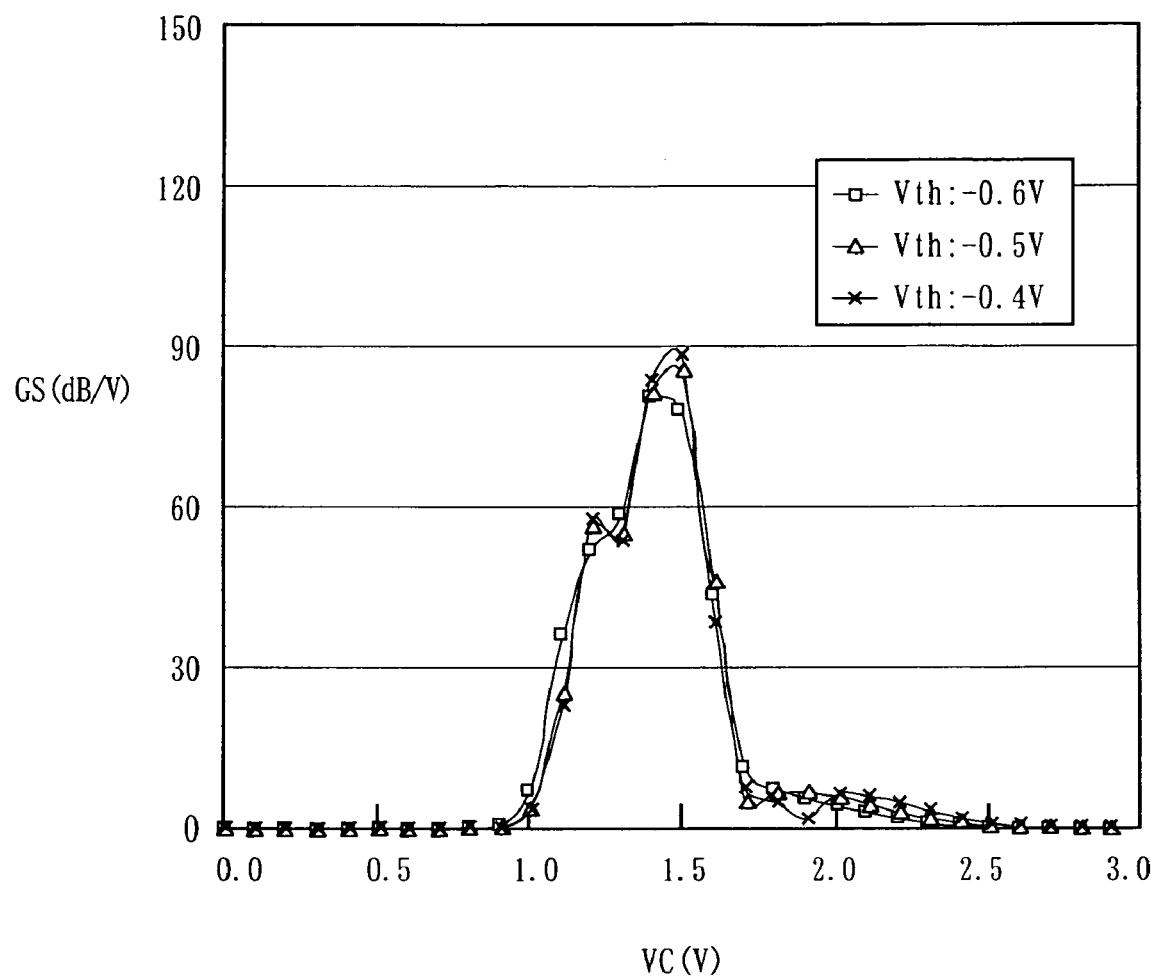
FIG. 12 is a graph illustrating the relationship between the control voltage and the gain control sensitivity in the gain control circuit shown in FIG. 9.

According to FIG. 11 and FIG. 12, even when the threshold voltage of the FETs varies, the characteristics of the gain control circuit 19 are not substantially influenced by such a variation. Therefore, the high frequency amplification circuit 18 can reduce the variations in the gain control characteristics and the gain control sensitivity even when the threshold voltage of the FETs varies due to the inconsistencies in the production process or the operating temperature change.

As compared to the characteristics shown in FIG. 6 and FIG. 7, the characteristics shown in FIG. 11 and FIG. 12 exhibit a larger range of control voltage in which the input/output power ratio is changed and a lower peak value of the gain control sensitivity (about 90 dB/V). Therefore, the dynamic range of the high frequency amplification circuit 18 can be enlarged with no necessity to improve the resolution of the D/A converter for obtaining the control voltage VC while preventing the control circuit from being enlarged or complicated.

Since the variable resistance circuit 70 includes a plurality of FETs 71 and 72, the level of the signal which is input to the input terminal of the variable resistance circuit 70 can be dispersed to the FETs. Therefore, the distortion characteristics of the FETs with respect to an input signal can be improved without increasing the gate width of the FETs.

Third Embodiment

Figure 13:
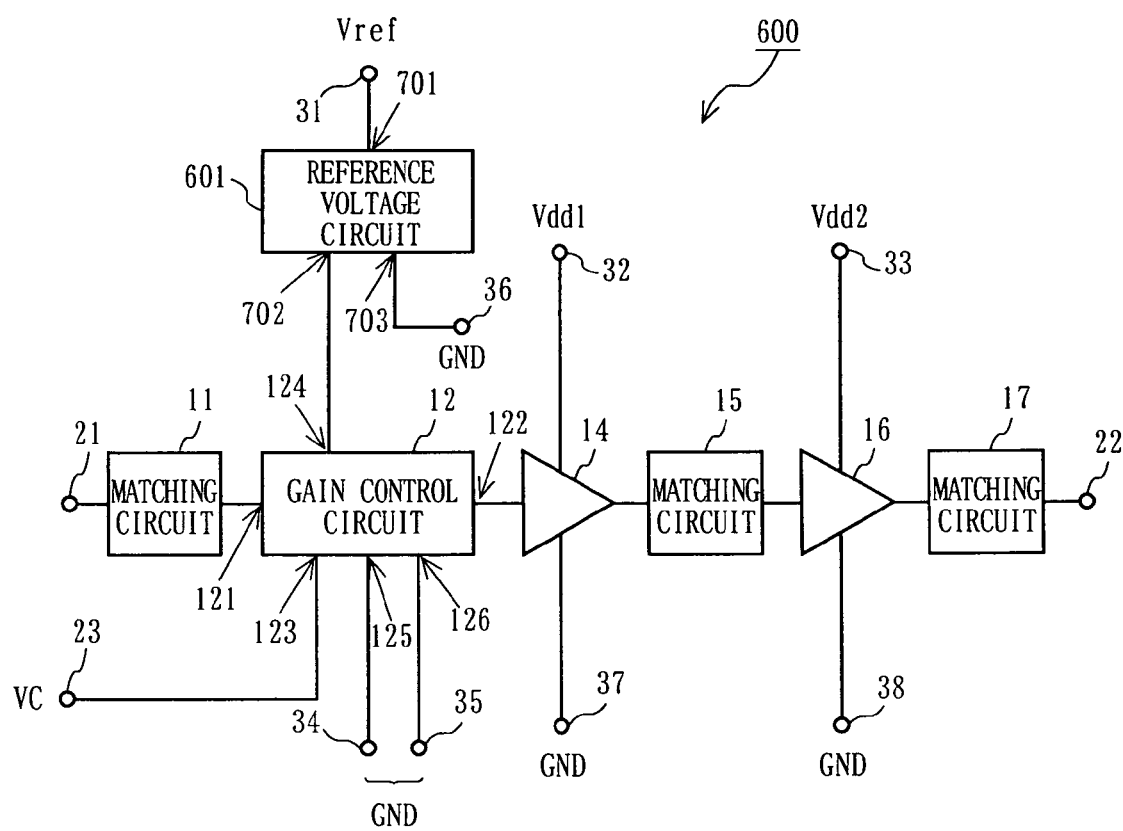
FIG. 13 is a block diagram showing a structure of a high frequency amplification circuit according to a third embodiment of the present invention.

FIG. 13 is a block diagram showing a structure of a high frequency amplification circuit 600 according to a third embodiment of the present invention. Like the high frequency amplification circuit 10 according to the first embodiment, the high frequency amplification circuit 600 shown in FIG. 13 is used as the high frequency amplification circuit 202 and/or the high frequency amplification circuit 206 in the cellular phone terminal shown in FIG. 2. In other words, a cellular phone terminal according to this embodiment is the cellular phone terminal shown in FIG. 2 in which at least one of the high frequency amplification circuits 202 and 206 has the structure of the high frequency amplification circuit 600 shown in FIG. 13. Among the elements in this embodiment, elements identical to those in the first embodiment bear identical reference numerals thereto, and descriptions thereof will be omitted.

The high frequency amplification circuit 600 is different from the high frequency amplification circuit 10 (FIG. 1) according to the first embodiment in including a reference voltage circuit 601 instead of the reference voltage circuit 13. The operation of the high frequency amplification circuit 600 is substantially the same as that of the high frequency amplification circuit 10. Unlike the high frequency amplification circuit 10, the reference voltage circuit 601 included in the high frequency amplification circuit 600 has a circuit configuration which takes into account that the threshold voltage of the FET included in the gain control circuit 12 and the threshold voltage of the FET included in the reference voltage circuit 601 are different from each other.

The reference voltage circuit 601 includes a reference voltage terminal 701, a reference voltage output terminal 702, and a ground terminal 703. The reference voltage output terminal 702 is connected to the reference voltage terminal 124. The reference voltage terminal 701 and the ground terminal 703 are respectively connected to the reference voltage terminal 31 and the ground terminal 36.

Hereinafter, gain control performed by the high frequency amplification circuit 600 will be described. The gain control circuit 12 attenuates an input high frequency signal by changing a resistance value of the gain control circuit 12 based on the control voltage VC applied to the gain control terminal 23. The reference voltage circuit 601 obtains a reference voltage Vref1 for compensating for the change in the resistance value of the FET of the gain control circuit 12 (i.e., a voltage at which the resistance value of the gain control circuit 12 is constant if the control voltage VC is constant), and gives the reference voltage Vref1 to the gain control circuit 12. The high frequency amplification circuit 600 thus performs the gain control by controlling the attenuation in the gain control circuit 12 using the control voltage VC applied to the gain control terminal 23 and the reference voltage Vref1 obtained by the reference voltage circuit 601.

The structure and the operation of the gain control circuit 12 are the same as those described regarding the high frequency amplification circuit 10 according to the first embodiment and will not be described here again.

Figure 14:
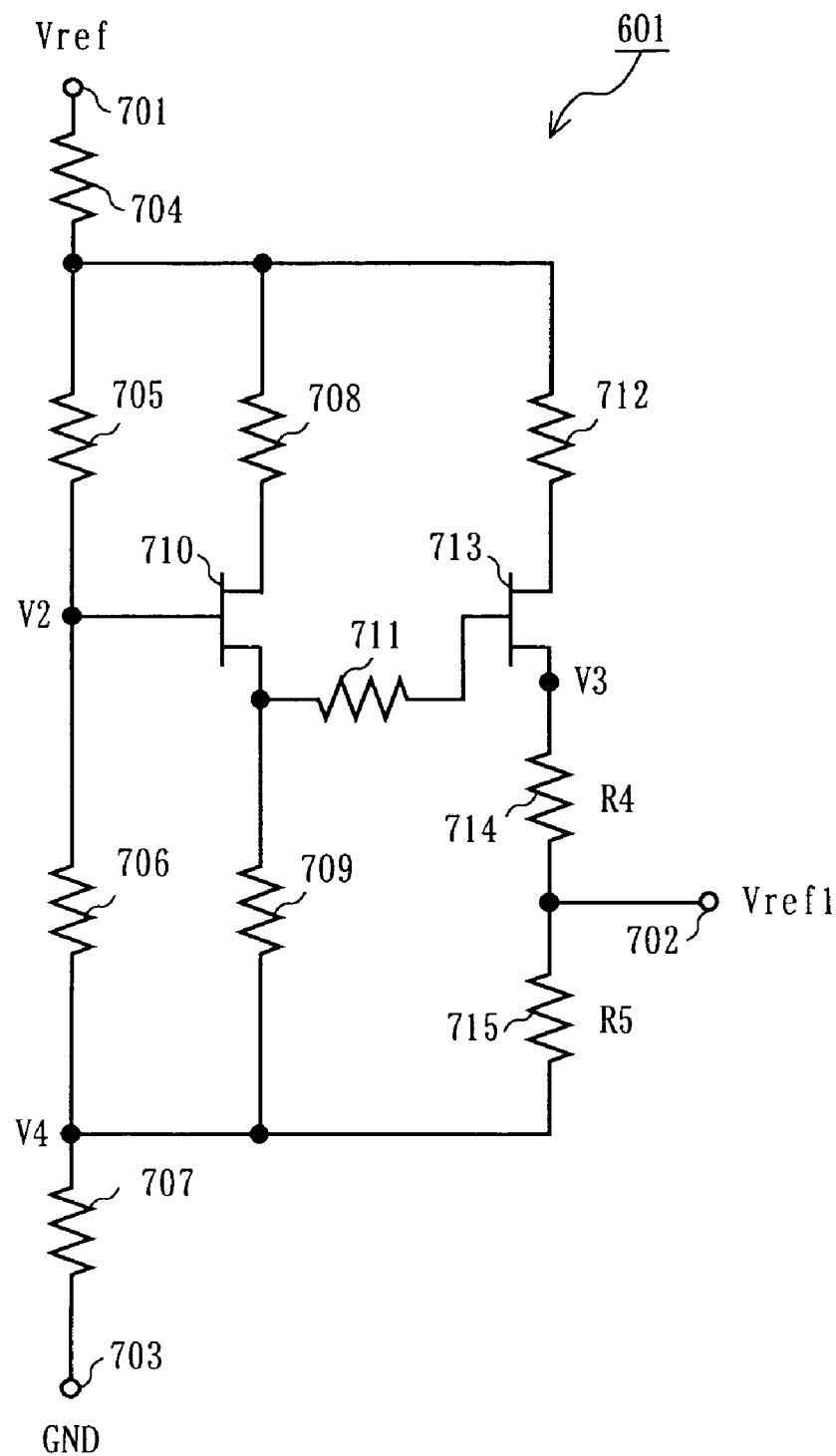
FIG. 14 is a circuit diagram of a reference voltage circuit included in the high frequency amplification circuit shown in FIG. 13.

FIG. 14 is a circuit diagram showing a detailed structure of the reference voltage circuit 601. As shown in FIG. 14, the reference voltage terminal 701 is connected to one end of a resistor 704. The other end of the resistor 704 is connected to one end of a resistor 705, one end of a resistor 708, and one end of a resistor 712. The other end of the resistor 705 is connected to a gate terminal of an FET 710 and one end of a resistor 706. Hereinafter, the potential at the connection point of the other end of the resistor 705, the gate terminal of the FET 710, and the one end of the resistor 706 will be represented as V2. The other end of the resistor 708 is connected to a drain terminal of the FET 710. A source terminal of the FET 710 is connected to one end of a resistor 709 and one end of a resistor 711. The other end of the resistor 712 is connected to a drain terminal of an FET 713. The other end of the resistor 711 is connected to a gate terminal of the FET 713. A source terminal of the FET 713 is connected to one end of a resistor 714. Hereinafter, the potential at the connection point of the source terminal of the FET 713 and the one end of the resistor 714 will be represented as V3. The reference voltage output terminal 702 is connected to the other end of the resistor 714 and one end of a resistor 715. One end of a resistor 707 is connected to the other end of the resistor 706, the other end of the resistor 709, and the other end of the resistor 715. Hereinafter, the potential of the connection point of the one end of the resistor 707, the other end of the resistor 706, the other end of the resistor 709, and the other end of the resistor 715 will be represented as V4. The ground terminal 703 is connected to the other end of the resistor 707.

As each of the resistors 704 through 707 included in the reference voltage circuit 601, a resistor having a resistance value of about several kilo-ohms is used. As each of the resistors 708, 709, 711, 712, 714 and 715, a resistor having a resistance value of about several tens of kilo-ohms is used. The FET 41 included in the gain control circuit 12 has a threshold voltage of about −0.55 V. The FET 710 and FET 713 included in the reference voltage circuit 601 each have a different threshold voltage from that of the FET 41 as described below (−0.4 V, −0.5 V and −0.6 V).

Hereinafter, an operation of the reference voltage circuit 601 will be described. It is assumed that the resistance values of the resistors 708 and 709 are sufficiently high, the current flowing between the drain terminal and the source terminal of the FET 710 is negligible, the resistance values of the resistors 712, 714 and 715 are sufficiently high, and the current flowing between the drain terminal and the source terminal of the FET 713 is negligible.

Where the threshold voltage of the FET 710 and FET 713 is Vth2, the voltage V2 applied to the gate terminal of the FET 710 is represented by expression (71) using the threshold voltage Vth2 of the FET 710 and FET 713 and the voltage value V3.

$$V2 = V3 + 2 \cdot Vth2 \tag{71}$$

The voltage Vref1 of the reference voltage output terminal 702 is represented by expression (72) using the voltage values V3 and V4, where the resistance values of the resistors 714 and 715 are respectively R4 and R5 and $\gamma = R5/(R4+R5)$.

$$Vref1 = \gamma \cdot V3 - (\gamma - 1) \cdot V4 \tag{72}$$

By substituting expression (71) for expression (72), the value of the voltage Vref1 of the reference voltage output terminal 702 is represented by expression (73) using the voltage values V2 and V4 and the threshold voltage Vth2.

$$Vref1 = \gamma \cdot (V2 - 2 \cdot Vth2) - (\gamma - 1) \cdot V4 \tag{73}$$

VC(off) and VC(on) in the gain control circuit 12 are respectively represented by expressions (74) and (75) from expressions (16), (17) and (73), where the threshold voltage of the FET 41 included in the gain control circuit 12 is Vth1.

$$VC(\text{off}) = Vth1 - 2 \cdot \gamma \cdot Vth2 + \gamma \cdot V2 - (\gamma - 1) \cdot V4 \tag{74}$$

$$VC(\text{on}) = Vth1 - 2 \cdot \gamma \cdot Vth2 + \gamma \cdot V2 - (\gamma - 1) \cdot V4 + Vw \tag{75}$$

In expressions (74) and (75), the terms regarding the threshold voltages Vth1 and Vth2 are defined as $\delta = Vth1 - 2 \cdot \gamma \cdot Vth2$. Since $\gamma = R5/(R4+R5)$, $\gamma < 1$. It is appreciated from the above that even when Vth1 and Vth2 are of different values, $\delta$ can be made 0 by appropriating setting the value of $\gamma$. In other words, the term including the threshold voltage in each of expressions (74) and (75) can be nullified by setting the value of $\gamma$ in accordance with the values of Vth1 and Vth2.

The FETs included in a high frequency amplification circuit formed on a semiconductor chip have approximately the same threshold voltage. It should be noted, though, when the FETs include gate terminals with different gate widths or when a plurality of gate electrodes are provided between the source electrode and the drain electrode of the FETs, the threshold voltages of the FETs have different values. Nonetheless, even when the threshold voltages of the FETs are different due to different structures thereof, the threshold voltage values of these FETs change by approximately the same amount in accordance with the operating temperature change.

Accordingly, even where the threshold voltage of the FETs in the reference voltage circuit 601 and the threshold voltage of the FET in the gain control circuit 12 are different from each other, VC(off) and VC(on) can be prevented from being influenced by a variation in the threshold voltages of the FETs by appropriately selecting the resistance values of the resistors 714 and 715 of the reference voltage circuit 601. Thus, the gain control characteristics of the gain control circuit 12 are not so influenced. Therefore, the variation in the gain caused by the variation in the threshold voltages of the FETs can be reduced.

Next, specific examples of the gain control characteristics when the threshold voltage of the FETs in the high frequency amplification circuit 600 varies will be described. Here, as an example, an experimental result performed under the conditions that the frequency of the signal which is input from the signal input terminal 121 is 1.95 GHz and the reference voltage Vref applied to the reference voltage terminal 701 is 3 V will be described. With such conditions, the control voltage applied to the gain control terminal 123 was changed from 0 V to 3 V in the case where the threshold voltage Vth2 of the FET 710 and the FET 713 was −0.6 V, −0.5 V and −0.4 V. The results will be shown.

Figure 15:
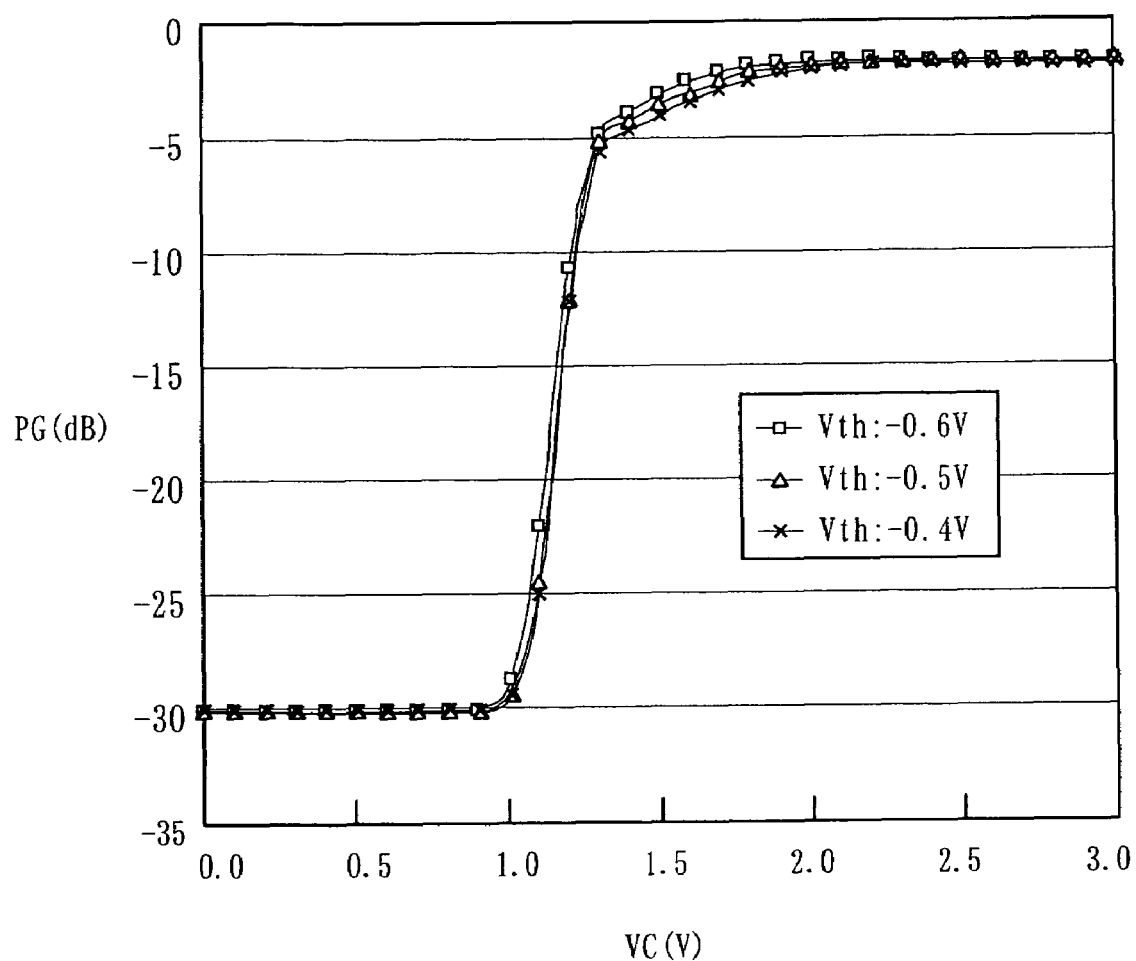
FIG. 15 is a graph illustrating the relationship between the control voltage and the input/output power ratio in the gain control circuit included in the high frequency amplification circuit shown in FIG. 13.

FIG. 15 is a graph illustrating the relationship between the control voltage and the input/output power ratio in the gain control circuit 12 operating in the above-described conditions.

Figure 16:
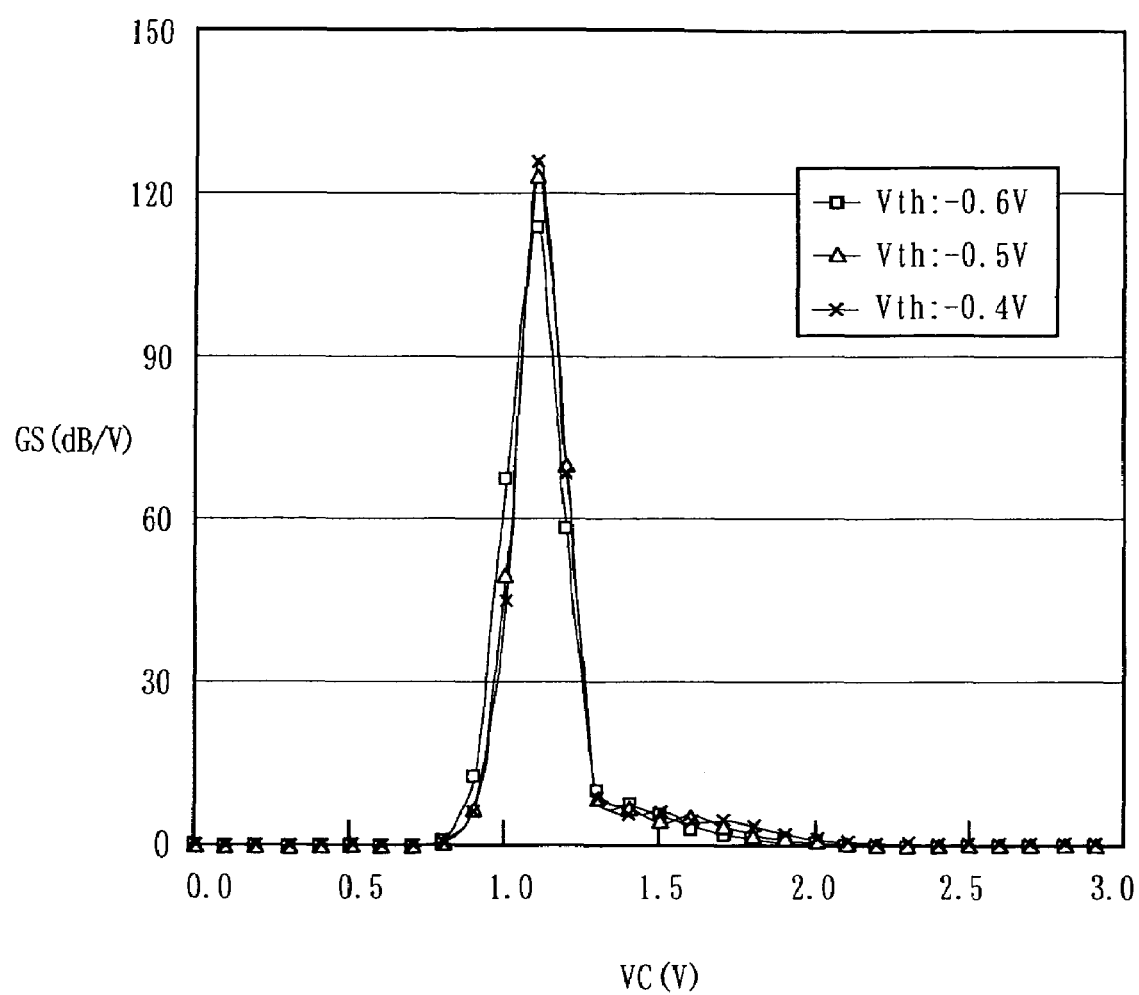
FIG. 16 is a graph illustrating the relationship between the control voltage and the gain control sensitivity in the gain control circuit included in the high frequency amplification circuit shown in FIG. 13.

FIG. 16 is a graph illustrating the relationship between the control voltage and the gain control sensitivity in the gain control circuit 12 operating in the above-described conditions. In FIG. 15 and FIG. 16, the horizontal axis represents the control voltage VC applied to the gain control terminal 23. In FIG. 15, the vertical axis represents the ratio PG between the power of the input signal to the signal input terminal 121 and the power of the output signal from the signal output terminal 122. In FIG. 16, the vertical axis represents the gain control sensitivity GS.

According to In FIG. 15 and FIG. 16, even when the threshold voltage of the FETs varies, the characteristics of the gain control circuit 12 are not substantially influenced by such a variation. Therefore, the high frequency amplification circuit 600 reduces the variations in the gain control characteristics and the gain control sensitivity even when the threshold voltage of the FETs varies due to the inconsistencies in the production process or the operating temperature change.

As described above, the high frequency amplification circuit according to this embodiment can reduce the variation in the gain caused by the variation in the threshold voltage of the FET included in the gain control circuit even where the threshold voltage of the FET in the gain control circuit and the threshold voltage of the FETs in the reference voltage circuit are different from each other.

Fourth Embodiment

Figure 17:
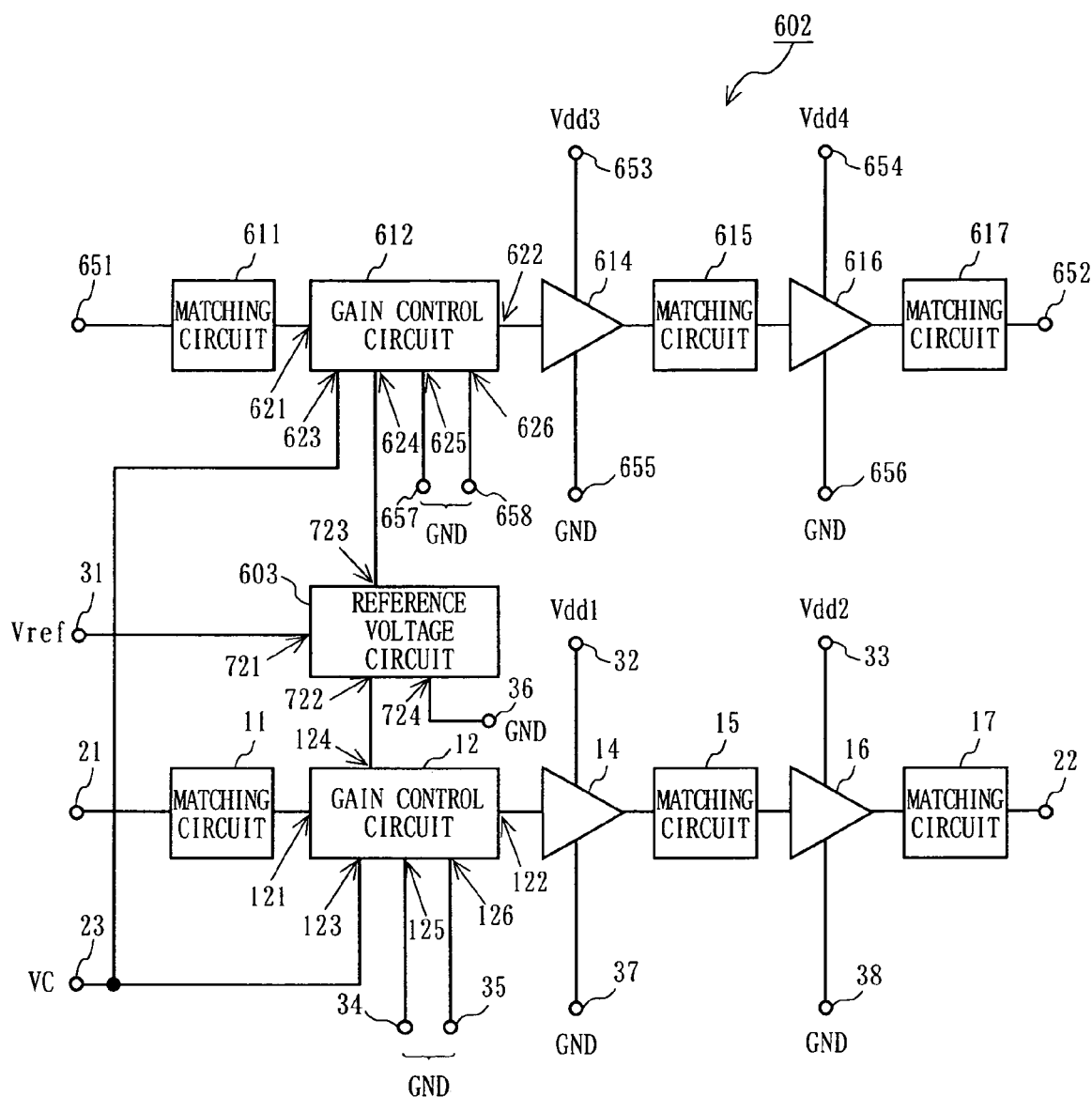
FIG. 17 is a block diagram showing a structure of a high frequency amplification circuit according to a fourth embodiment of the present invention.

FIG. 17 is a block diagram showing a structure of a high frequency amplification circuit 602 according to a fourth embodiment of the present invention. The high frequency amplification circuit 602 shown in FIG. 17 is used as the high frequency amplification circuit 202 and the high frequency amplification circuit 206 in the cellular phone terminal shown in FIG. 2. In other words, a cellular phone terminal according to this embodiment is the cellular phone terminal shown in FIG. 2 in which the high frequency amplification circuits 202 and 206 together have the structure of the high frequency amplification circuit 602 shown in FIG. 17.

Hereinafter, the high frequency amplification circuit 602 will be described in detail with reference to FIG. 17. The high frequency amplification circuit 602 includes a matching circuit 11, a gain control circuit (first gain control circuit) 12, a reference voltage circuit 603, an amplifier 14, a matching circuit 15, an amplifier 16, a matching circuit 17, a matching circuit 611, a gain control circuit (second gain control circuit) 612, an amplifier 614, a matching circuit 615, an amplifier 616, and a matching circuit 617.

The high frequency amplification circuit 602 further includes a signal input terminal 21, a signal output terminal 22, a gain control terminal 23, a reference voltage terminal 31, power source terminals 32 and 33, and ground terminals 34 through 38. The high frequency amplification circuit 602 also includes a signal input terminal 651, a signal output terminal 652, power source terminals 653 and 654, and ground terminals 655 through 658.

The gain control circuit 12 includes a signal input terminal 121, a signal output terminal 122, a gain control terminal 123, a reference voltage terminal 124, and ground terminals 125 and 126. The gain control circuit 612 includes a signal input terminal 621, a signal output terminal 622, a gain control terminal 623, a reference voltage terminal 624, and ground terminals 625 and 626.

The reference voltage circuit 603 includes a reference voltage terminal 721, a reference voltage output terminal (first reference voltage output terminal) 722, a reference voltage output terminal (second reference voltage output terminal) 723, and a ground terminal 724. The reference voltage output terminals 722 and 723 are respectively connected to the reference voltage terminals 124 and 624. The reference voltage terminal 721 is connected to the reference voltage terminal 31. The ground terminal 724 is connected to the ground terminal 36.

The gain control terminal 123 is connected to the gain control terminal 23. The ground terminals 125 and 126 are respectively connected to the ground terminals 34 and 35. The power source terminals 32 and 33 are respectively connected to power source terminals of the amplifiers 14 and 16. The ground terminals 37 and 38 are respectively connected to ground terminals of the amplifiers 14 and 16.

The gain control terminal 623 is connected to the gain control terminal 23. The ground terminals 625 and 626 are respectively connected to the ground terminals 657 and 658. The power source terminals 653 and 654 are respectively connected to power source terminals of the amplifiers 614 and 616. The ground terminals 655 and 656 are respectively connected to ground terminals of the amplifiers 614 and 616.

The high frequency amplification circuit 602 performs level adjustment, and then performs two-stage amplification, on an input high frequency signal. The high frequency signal to be amplified is input from the signal input terminal 21 or the signal input terminal 651, and the amplified signal is output from the signal output terminal 22 or the signal output terminal 652.

In order to control the gain of the high frequency amplification circuit 602, the gain control terminal 23 is supplied with a control voltage VC. The reference voltage terminal 31 is supplied with a predetermined reference voltage Vref, and the power source terminals 32 and 33 are respectively supplied with predetermined supply voltages Vdd1 and Vdd2. The power source terminals 653 and 654 are respectively supplied with predetermined supply voltages Vdd3 and Vdd4.

The matching circuits 11, 15, 17, 611, 615 and 617 are impedance matching circuits for performing impedance conversion on an input signal. The amplifiers 14 and 614 perform first-stage amplification, and the amplifiers 16 and 616 perform second-stage amplification. The gain control circuits 12 and 612 attenuate an input signal based on the control voltage VC applied to the gain control terminal 23 and output the attenuated signal.

In more detail, the signal input terminal 21 is connected to an input terminal of the matching circuit 11. An output terminal of the matching circuit 11 is connected to the signal input terminal 121 of the gain control circuit 12. The signal output terminal 122 of the gain control circuit 12 is connected to an input terminal of the amplifier 14. An output terminal of the amplifier 14 is connected to an input terminal of the matching circuit 15. An output terminal of the matching circuit 15 is connected to an input terminal of the amplifier 16. An output terminal of the amplifier 16 is connected to an input terminal of the matching circuit 17. An output terminal of the matching circuit 17 is connected to the signal output terminal 22.

The signal input terminal 651 is connected to an input terminal of the matching circuit 611. An output terminal of the matching circuit 611 is connected to the signal input terminal 621 of the gain control circuit 612. The signal output terminal 622 of the gain control circuit 612 is connected to an input terminal of the amplifier 614. An output terminal of the amplifier 614 is connected to an input terminal of the matching circuit 615. An output terminal of the matching circuit 615 is connected to an input terminal of the amplifier 616. An output terminal of the amplifier 616 is connected to an input terminal of the matching circuit 617. An output terminal of the matching circuit 617 is connected to the signal output terminal 652.

A high frequency signal, which is input to the input signal terminal 651, is input to the gain control circuit 612 via the matching circuit 611, and is attenuated by the gain control circuit 612. The output signal from the gain control circuit 612 is amplified by the amplifier 614. The output signal from the amplifier 614 is input to the amplifier 616 via the matching circuit 615, and is amplified by the amplifier 616. The output signal from the amplifier 616 is output from the signal output terminal 652 via the matching circuit 617.

The structures and the operations of the gain control circuits 12 and 612 are the same as those described above regarding the high frequency amplification circuit 10 according to the first embodiment and will not be described here again.

The control voltage VC of the gain control circuit 12 is represented by expressions (76) and (77), where the voltage of the reference voltage terminal 124 of the gain control circuit 12 is Vref3 and the threshold voltage of the FET 41 of the gain control circuit 12 is Vth3.

$$VC(\text{off}) = V\text{ref3} + V\text{th3} \quad (76)$$

$$VC(\text{on}) = V\text{ref3} + V\text{th3} + Vw \quad (77)$$

The control voltage VC of the gain control circuit 612 is represented by expressions (78) and (79), where the voltage of the reference voltage terminal 624 of the gain control circuit 612 is Vref4 and the threshold voltage of an FET of the gain control circuit 612 is Vth4.

$$VC(\text{off}) = V\text{ref4} + V\text{th4} \quad (78)$$

$$VC(\text{on}) = V\text{ref4} + V\text{th4} + Vw \quad (79)$$

Accordingly, the gain control of the high frequency amplification circuit 602 is performed by controlling the attenuation in the gain control circuit 12 and the attenuation in the gain control circuit 612 using the control voltage VC applied to the gain control terminal 23 and the reference voltages Vref3 and Vref4 obtained by the reference voltage circuit 603.

Figure 18:
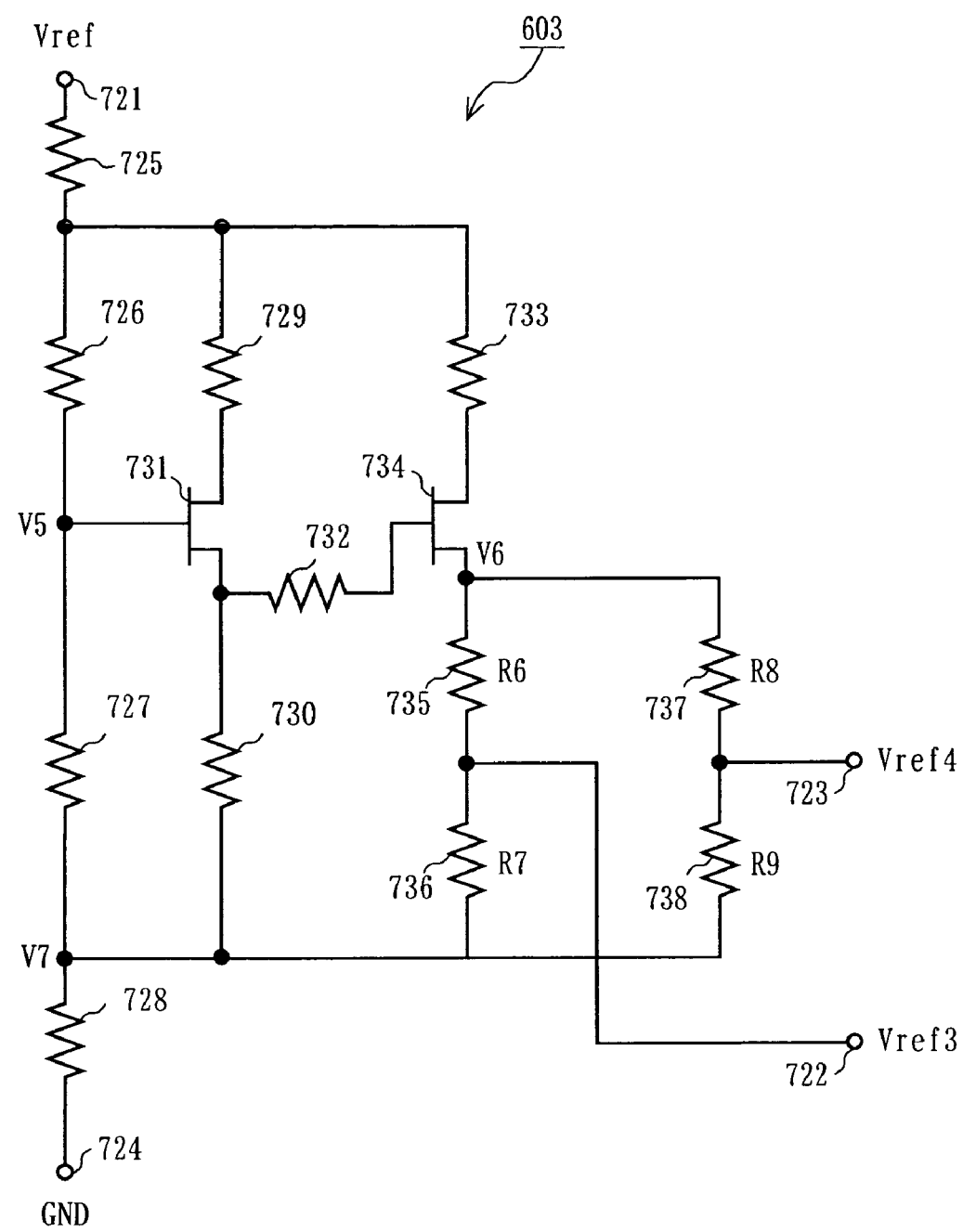
FIG. 18 is a circuit diagram of a reference voltage circuit included in the high frequency amplification circuit shown in FIG. 17.

FIG. 18 is a circuit diagram showing a detailed structure of the reference voltage circuit 603. As shown in FIG. 18, the reference voltage terminal 721 is connected to one end of a resistor 725. The other end of the resistor 725 is connected to one end of a resistor 726, one end of a resistor 729, and one end of a resistor 733. The other end of the resistor 726 is connected to a gate terminal of an FET 731 and one end of a resistor 727. Hereinafter, the potential at the connection point of the other end of the resistor 726, the gate terminal of the FET 731, and the one end of the resistor 727 will be represented as V5. The other end of the resistor 729 is connected to a drain terminal of the FET 731. A source terminal of the FET 731 is connected to one end of a resistor 730 and one end of a resistor 732. The other end of the resistor 733 is connected to a drain terminal of an FET 734. The other end of the resistor 732 is connected to a gate terminal of the FET 734. A source terminal of the FET 734 is connected to one end of a resistor 735 and one end of a resistor 737. Hereinafter, the potential at the connection point of the source terminal of the FET 734, the one end of the resistor 735, and the one end of the resistor 737 will be represented as V6. The reference voltage output terminal 722 is connected to the other end of the resistor 735 and one end of a resistor 736. The reference voltage output terminal 723 is connected to the other end of the resistor 737 and one end of a resistor 738. One end of a resistor 728 is connected to the other end of the resistor 727, the other end of the resistor 730, the other end of the resistor 736, and the other end of the resistor 738. Hereinafter, the potential at the connection point of the one end of the resistor 728, the other end of the resistor 727, the other end of the resistor 730, the other end of the resistor 736, and the other end of the resistor 738 will be represented as V7. The ground terminal 724 is connected to the other end of the resistor 728.

As each of the resistors 725 through 728 included in the reference voltage circuit 603, a resistor having a resistance value of about several kilo-ohms is used. As each of the resistors 729, 730, 732, 733 and 735 through 738, a resistor having a resistance value of about several tens of kilo-ohms is used. The FETs included in the gain control circuits 12 and 612 each have a threshold voltage of about –0.55 V. The FET 731 and FET 734 included in the reference voltage circuit 601 each have a different threshold voltage from that of the FET 41 as described below (–0.4 V, –0.5 V and –0.6 V).

Hereinafter, an operation of the reference voltage circuit 603 will be described. It is assumed that the resistance values of the resistors 729 and 730 are sufficiently high, the current flowing between the drain terminal and the source terminal of the FET 731 is negligible, the resistance values of the resistors 733, 735, 736, 737 and 738 are sufficiently high, and the current flowing between the drain terminal and the source terminal of the FET 734 is negligible.

Where the threshold voltage of the FET 731 and FET 734 is Vth5, the voltage V5 applied to the gate terminal of the FET 731 is represented by expression (80) using the threshold voltage Vth5 of the FET 731 and FET 734 and the voltage value V6.

$$V5 = V6 + 2 \cdot V\text{th5} \quad (80)$$

The voltage Vref3 at the reference voltage output terminal (first reference voltage output terminal) 722 is represented by expression (81) using the voltage values V6 and V7, where the resistance values of the resistors 735 and 736 are respectively R6 and R7 and $\epsilon = R7/(R6+R7)$.

$$V\text{ref3} = \epsilon \cdot V6 - (\epsilon - 1) \cdot V7 \quad (81)$$

By substituting expression (80) for expression (81), the value of the voltage Vref3 at the reference voltage output terminal 722 is represented by expression (82) using the voltage values V5 and V7 and the threshold voltage Vth5.

$$V\text{ref3} = \epsilon \cdot (V5 - 2 \cdot V\text{th5}) - (\epsilon - 1) \cdot V7 \quad (82)$$

Similarly, the voltage Vref4 at the reference voltage output terminal (second reference voltage output terminal) 723 is represented by expression (83) using the voltage values V6 and V7, where the resistance values of the resistors 737 and 738 are respectively R8 and R9 and $\xi = R9/(R8+R9)$.

$$V\text{ref4} = \xi \cdot V6 - (\epsilon - 1) \cdot V7 \quad (83)$$

By substituting expression (80) for expression (83), the value of the voltage Vref4 at the reference voltage output terminal 723 is represented by expression (84) using the voltage values V5 and V7 and the threshold voltage Vth5.

$$Vref4=\xi \cdot (V5-2 \cdot Vth5)-(\xi-1) \cdot V7 \qquad (84)$$

VC(off) and VC(on) in the gain control circuit (first gain control circuit) 12 are respectively represented by expressions (85) and (86) from expressions (76), (77) and (82).

$$VC(off)=Vth3-2 \cdot \epsilon \cdot Vth5+\epsilon \cdot V5-(\epsilon-1) \cdot V7 \qquad (85)$$

$$VC(on)=Vth3-2 \cdot \epsilon \cdot Vth5+\epsilon \cdot V5-(\epsilon-1) \cdot V7+Vw \qquad (86)$$

Similarly, VC(off) and VC(on) in the gain control circuit (second gain control circuit) 612 are respectively represented by expressions (87) and (88) from expressions (78), (79) and (84).

$$VC(off)=Vth4-2 \cdot \xi \cdot Vth5+\xi \cdot V5-(\xi-1) \cdot V7 \qquad (87)$$

$$VC(on)=Vth4-2 \cdot \xi \cdot Vth5+\xi \cdot V5-(\xi-1) \cdot V7+Vw \qquad (88)$$

In expressions (85) and (86), the terms regarding the threshold voltages Vth3 and Vth5 of the FETs are defined as $\eta$=Vth3−2·$\epsilon$·Vth5. Since $\epsilon$=R7/(R6+R7), $\epsilon$<1. It is appreciated from the above that even when Vth3 and Vth4 are of different values, $\eta$ can be made 0 by appropriating setting the value of $\epsilon$.

Similarly, in expressions (87) and (88), the terms regarding the threshold voltages Vth4 and Vth5 of the FETs are defined as $\kappa$=Vth4−2·$\xi$·Vth5. Since $\xi$=R9/(R8+R9), $\xi$<1. It is appreciated from the above that even when Vth4 and Vth5 are of different values, $\kappa$ can be made 0 by appropriating setting the value of $\xi$.

In other words, the term including the threshold voltages in each of expressions (85) and (86) can be nullified by selecting the value of $\epsilon$ in accordance with the values of Vth3 and Vth5. Similarly, the term including the threshold voltages in each of expressions (87) and (88) can be nullified by selecting the value of $\xi$ in accordance with the values of Vth4 and Vth5.

The FETs included in a high frequency amplification circuit formed on a semiconductor chip have approximately the same threshold voltage. It should be noted, though, when the FETs include gate terminals with different gate widths or when a plurality of gate electrodes are provided between the source electrode and the drain electrode of the FETs, the threshold voltages of the FETs have different values. Nonetheless, even when the threshold voltages of the FETs are different due to different structures thereof, the threshold voltage values of these FETs change by approximately the same amount in accordance with the operating temperature change.

Accordingly, even where the threshold voltage of the FETs in the reference voltage circuit 603, the threshold voltage of the FET in the gain control circuit 12, and the threshold voltage of the FET in the gain control circuit 612 are different from each other, VC(off) and VC(on) can be prevented from being influenced by a variation in the threshold voltages of the FETs by appropriately selecting the resistance values of the resistors 735, 736, 737 and 738 of the reference voltage circuit 603. Thus, the gain control characteristics of the first gain control circuit 12 and the second gain control circuit 612 are not so influenced. Therefore, a variation in the gain caused by the variation in the threshold voltages of the FETs can be reduced.

Next, a case where high frequency signals having different frequencies and different signal levels are input to the signal input terminals 21 and 651 of the high frequency amplification circuit 602 will be described.

In general, the sizes of FETs used in a gain control circuit are determined by the signal level of the signal which is input to the gain control circuit. When the FETs have different sizes, the FETs have different threshold voltages. Since the reference voltage circuit 603 of the high frequency amplification circuit 602 is properly operable even when the FETs of the gain control circuit 12 and the gain control circuits 612 have different threshold voltages, the high frequency amplification circuit 602 does not need to include a plurality of reference voltage circuits. Accordingly, the high frequency amplification circuit 602 allows the sizes of the FETs in the two gain control circuits to be flexibly set, and thus can have a reduced scale.

Next, specific examples of the gain control characteristics when the threshold voltage of the FETs in the high frequency amplification circuit 602 varies will be described. Here, as an example, an experimental result performed under the conditions that the frequency of the signal which is input from the signal input terminal 121 is 1.95 GHz, the reference voltage Vref applied to the reference voltage terminal 721 is 3 V, and the frequency of the signal which is input from the signal input terminal 621 is 810 MHz will be described. With such conditions, the control voltage applied to the gain control terminal 123 was changed from 0 V to 3 V in the case where the threshold voltage Vth5 of the FET 731 and the FET 734 was −0.6 V, −0.5 V and −0.4 V. The results will be shown.

Figure 19:
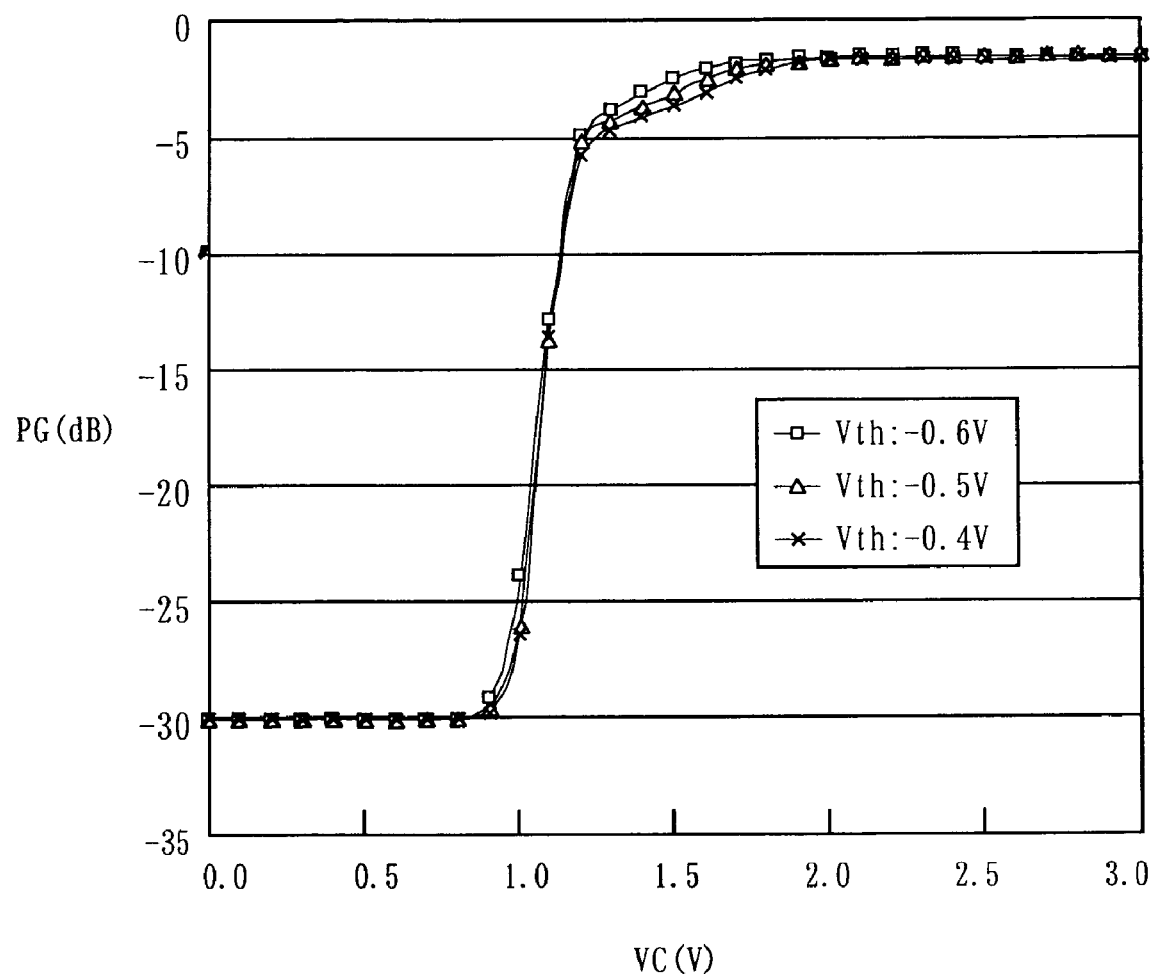
FIG. 19 is a graph illustrating the relationship between the control voltage and the input/output power ratio in a first gain control circuit included in the high frequency amplification circuit shown in FIG. 17.
Figure 20:
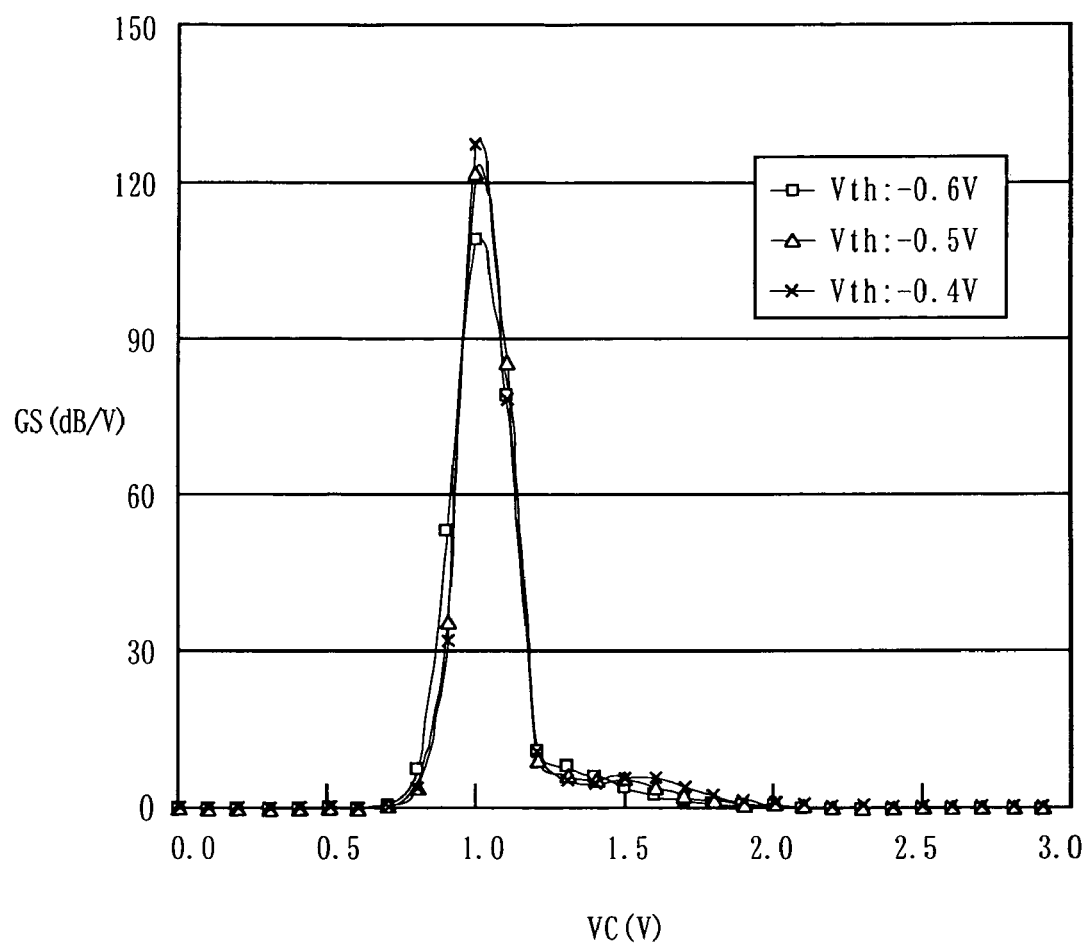
FIG. 20 is a graph illustrating the relationship between the control voltage and the gain control sensitivity in the first gain control circuit included in the high frequency amplification circuit shown in FIG. 17.

FIG. 19 is a graph illustrating the relationship between the control voltage and the input/output power ratio in the gain control circuit 12 operating in the above-described conditions. FIG. 20 is a graph illustrating the relationship between the control voltage and the gain control sensitivity in the gain control circuit 12 operating in the above-described conditions. In FIG. 19 and FIG. 20, the horizontal axis represents the control voltage VC applied to the gain control terminal 23. In FIG. 19, the vertical axis represents the ratio PG between the power of the input signal to the signal input terminal 121 and the power of the output signal from the signal output terminal 122. In FIG. 20, the vertical axis represents the gain control sensitivity GS.

Figure 21:
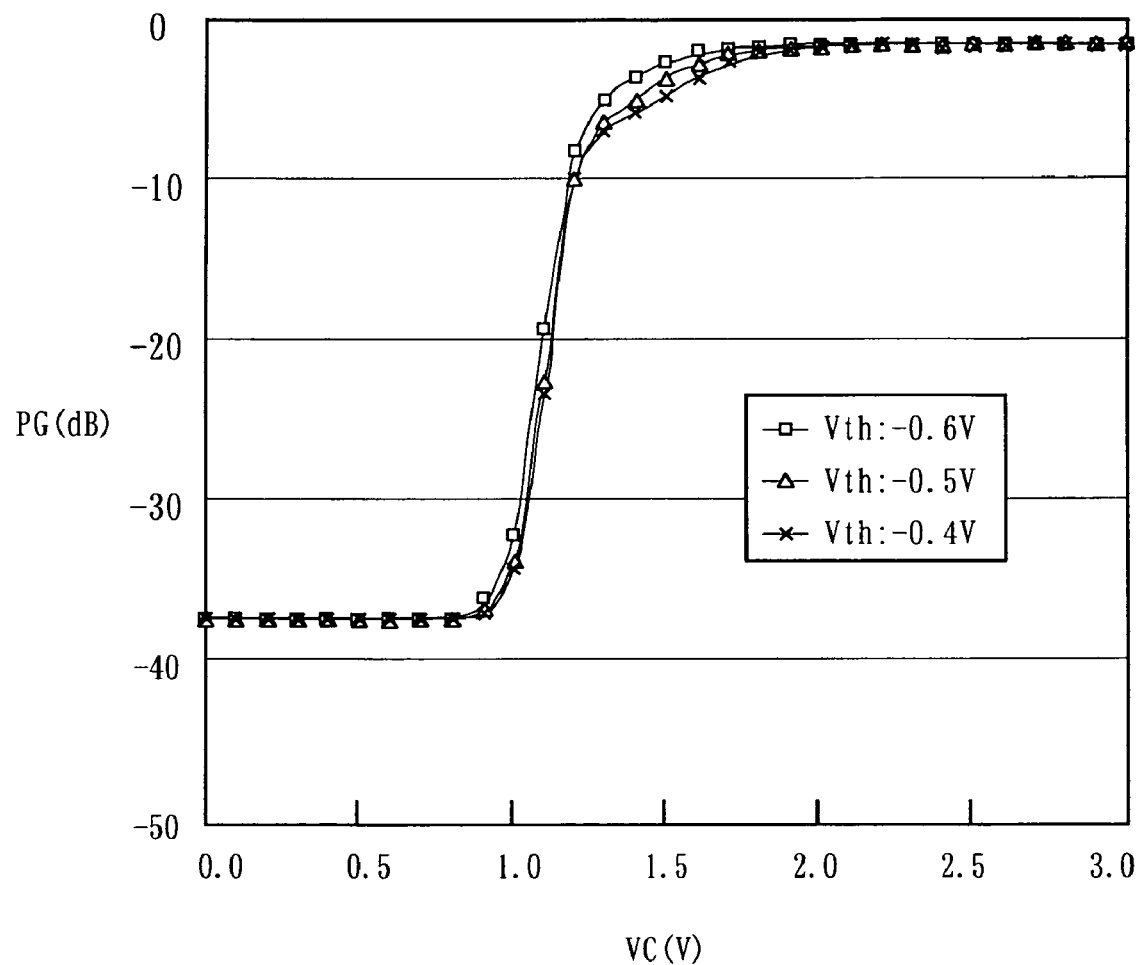
FIG. 21 is a graph illustrating the relationship between the control voltage and the input/output power ratio in a second gain control circuit included in the high frequency amplification circuit shown in FIG. 17.
Figure 22:
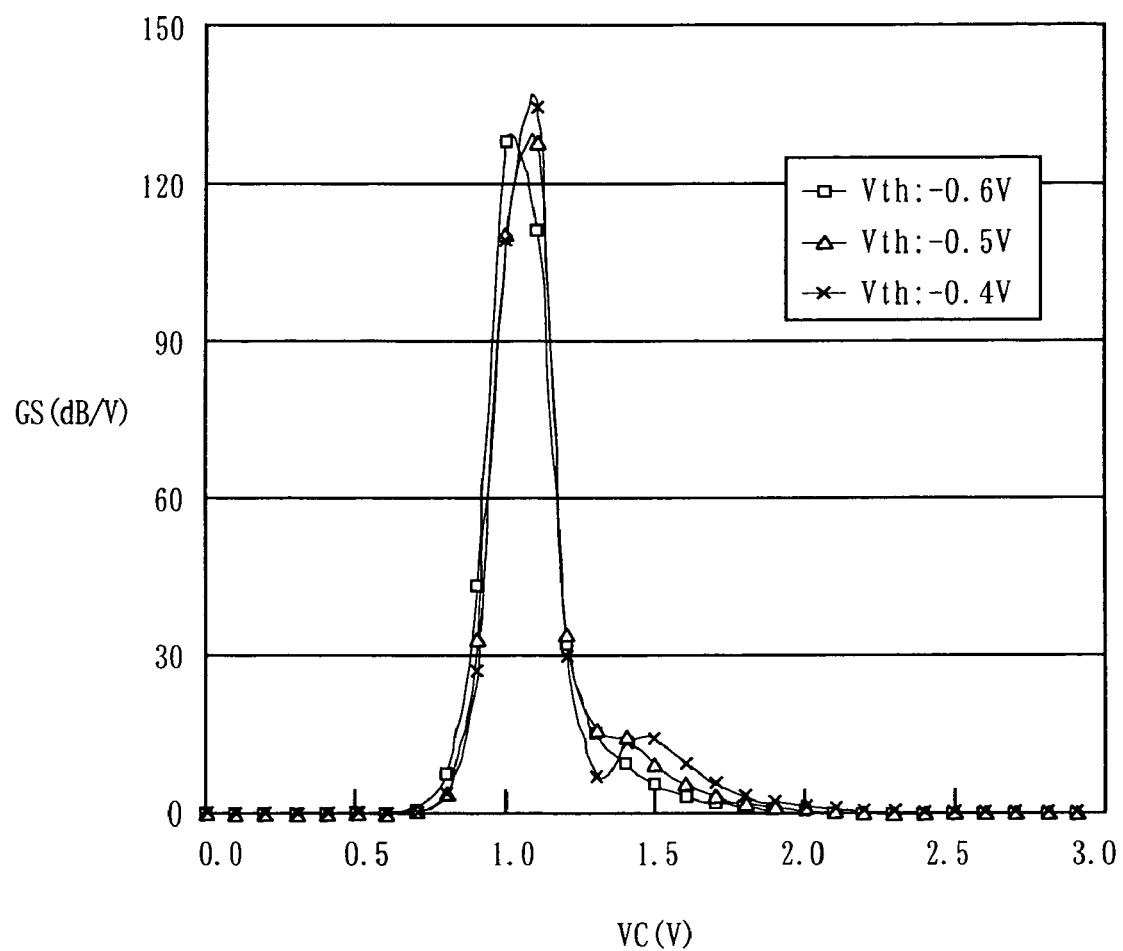
FIG. 22 is a graph illustrating the relationship between the control voltage and the gain control sensitivity in the second gain control circuit included in the high frequency amplification circuit shown in FIG. 17.

FIG. 21 is a graph illustrating the relationship between the control voltage and the input/output power ratio in the gain control circuit 612 operating in the above-described conditions. FIG. 22 is a graph illustrating the relationship between the control voltage and the gain control sensitivity in the gain control circuit 612 operating in the above-described conditions. In FIG. 21 and FIG. 22, the horizontal axis represents the control voltage VC applied to the gain control terminal 23. In FIG. 21, the vertical axis represents the ratio PG between the power of the input signal to the signal input terminal 621 and the power of the output signal from the signal output terminal 622. In FIG. 22, the vertical axis represents the gain control sensitivity GS.

According to In FIGS. 19 through 22, even when the threshold voltages of the FETs vary, the characteristics of the gain control circuits 12 and 612 are not substantially influenced by such a variation. Therefore, the high frequency amplification circuit 602 reduces the variations in the gain control characteristics and the gain control sensitivity even when the threshold voltages of the FETs vary due to the inconsistencies in the production process or the operating temperature change.

As described above, the high frequency amplification circuit according to this embodiment can reduce the variation in the gain caused by the variation in the threshold voltage of the FETs included in the gain control circuits even where the threshold voltage of the FETs in the gain control circuits and the threshold voltage of the FETs in the reference voltage circuit are different from each other.

Figure 23:
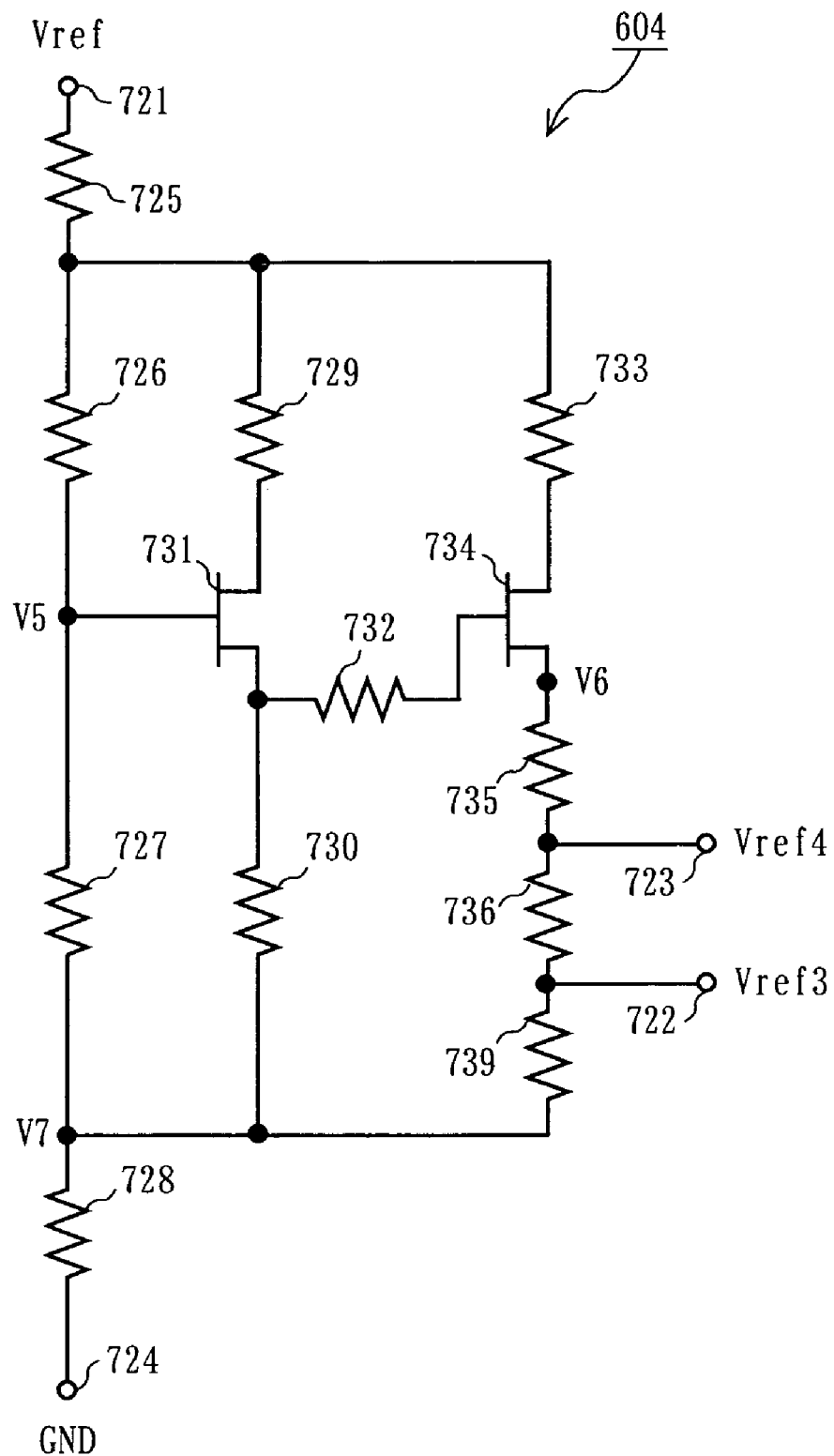
FIG. 23 is a circuit diagram of another example of the reference voltage circuit included in the high frequency amplification circuit shown in FIG. 17.

Instead of the reference voltage circuit 603, a reference voltage circuit 604 shown in FIG. 23 is usable. Substantially the same effects are provided. In the reference voltage circuit 604, the resistors 735, 736 and 739 are connected in series between the drain terminal of the FET 734 and the resistor 728. The reference voltage output terminal 722 is connected between the resistors 736 and 739, and the reference voltage output terminal 723 is connected between the resistors 735 and 736.

Fifth Embodiment

Figure 24:
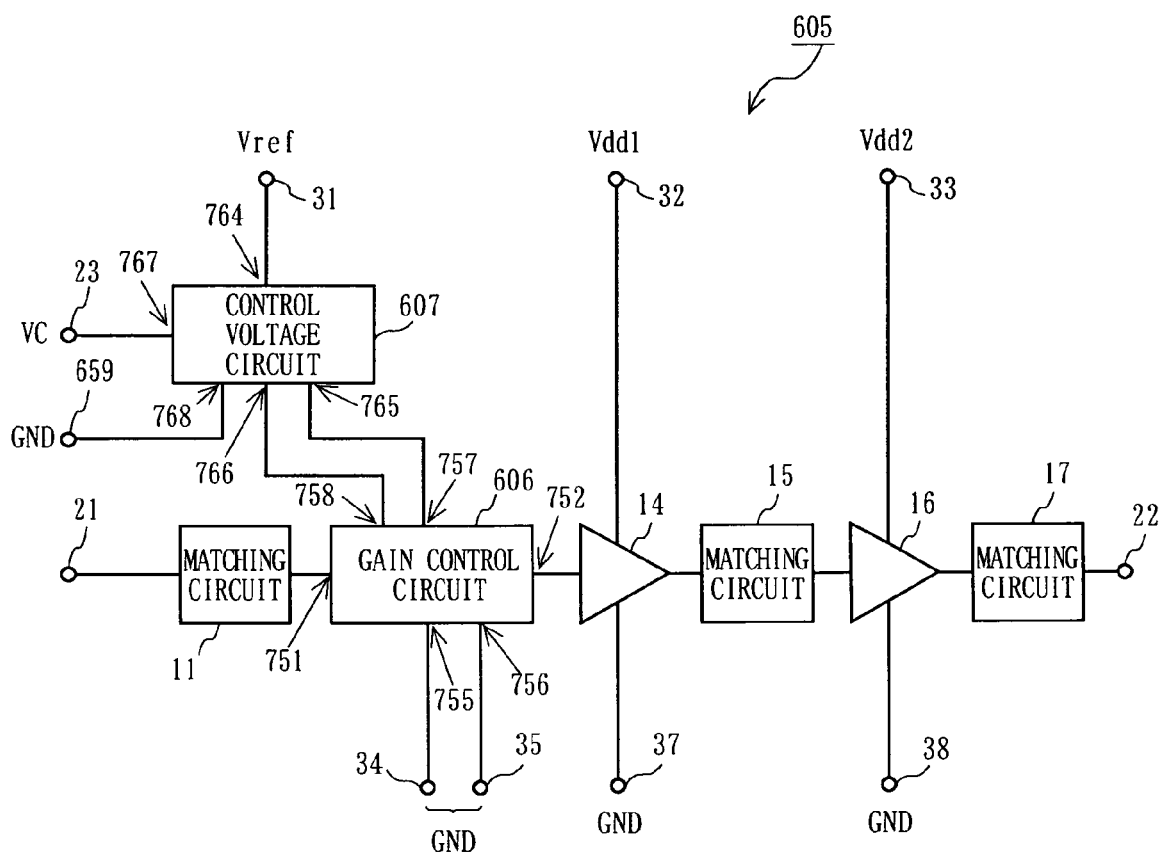
FIG. 24 is a block diagram showing a structure of a high frequency amplification circuit according to a fifth embodiment of the present invention.

FIG. 24 is a block diagram showing a structure of a high frequency amplification circuit 605 according to a fifth embodiment of the present invention. Like the high frequency amplification circuit 10 according to the first embodiment, the high frequency amplification circuit 605 shown in FIG. 24 is used as the high frequency amplification circuit 202 and/or the high frequency amplification circuit 206 in the cellular phone terminal shown in FIG. 2. In other words, a cellular phone terminal according to this embodiment is the cellular phone terminal shown in FIG. 2 in which at least one of the high frequency amplification circuits 202 and 206 has the structure of the high frequency amplification circuit 605 shown in FIG. 24.

Hereinafter, the high frequency amplification circuit 605 will be described in detail with reference to FIG. 24. The high frequency amplification circuit 605 includes a matching circuit 11, a gain control circuit 606, a control voltage circuit 607, an amplifier 14, a matching circuit 15, an amplifier 16, and a matching circuit 17. The high frequency amplification circuit 605 further includes a signal input terminal 21, a signal output terminal 22, a gain control terminal 23, a reference voltage terminal 31, power source terminals 32 and 33, and ground terminals 34, 35, 37, 38 and 659.

The gain control circuit 606 includes a signal input terminal 751, a signal output terminal 752, a gain control terminal 758, a reference voltage terminal 757, and ground terminals 755 and 756. The control voltage circuit 607 includes a reference voltage terminal 764, a control voltage input terminal 767, a reference voltage output terminal 765, a control voltage output terminal 766, and a ground terminal 768. The ground terminals 755 and 756 are respectively connected to the ground terminals 34 and 35.

The control voltage output terminal 766 is connected to the gain control terminal 758. The reference voltage output terminal 765 is connected to the reference voltage terminal 757. The reference voltage terminal 764 is connected to the reference voltage terminal 31. The ground terminal 768 is connected to the ground terminal 659.

The power source terminals 32 and 33 are respectively connected to power source terminals of the amplifiers 14 and 16. The ground terminals 37 and 38 are respectively connected to ground terminals of the amplifiers 14 and 16.

The high frequency amplification circuit 605 performs level adjustment, and then performs two-stage amplification, on an input high frequency signal. The high frequency signal to be amplified is input from the signal input terminal 21, and the amplified signal is output from the signal output terminal 22. In order to control the gain of the high frequency amplification circuit 605, the gain control terminal 23 is supplied with a control voltage VC. The reference voltage terminal 31 is supplied with a predetermined reference voltage Vref, and the power source terminals 32 and 33 are respectively supplied with predetermined supply voltages Vdd1 and Vdd2.

The matching circuits 11, 15 and 17 are impedance matching circuits for performing impedance conversion on an input signal. The amplifier 14 performs first-stage amplification, and the amplifier 16 performs second-stage amplification. The gain control circuits 606 attenuates an input signal based on the control voltage VC applied to the gain control terminal 23 and outputs the attenuated signal.

In more detail, the signal input terminal 21 is connected to an input terminal of the matching circuit 11. An output terminal of the matching circuit 11 is connected to the signal input terminal 751 of the gain control circuit 606. The signal output terminal 752 of the gain control circuit 606 is connected to an input terminal of the amplifier 14. An output terminal of the amplifier 14 is connected to an input terminal of the matching circuit 15. An output terminal of the matching circuit 15 is connected to an input terminal of the amplifier 16. An output terminal of the amplifier 16 is connected to an input terminal of the matching circuit 17. An output terminal of the matching circuit 17 is connected to the signal output terminal 22.

An input high frequency signal is input to the gain control circuit 606 via the matching circuit 11, and is attenuated by the gain control circuit 606. The output signal from the gain control circuit 606 is amplified by the amplifier 14. The output signal from the amplifier 14 is input to the amplifier 16 via the matching circuit 15, and is amplified by the amplifier 16. The output signal from the amplifier 16 is output from the signal output terminal 22 via the matching circuit 17.

Hereinafter, gain control performed by the high frequency amplification circuit 605 will be described. The gain control circuit 606 attenuates an input high frequency signal by changing a resistance value of the gain control circuit 606 based on the control voltage VC applied to the gain control terminal 23.

The control voltage circuit 607 obtains a control voltage VC3 and a reference voltage Vref5 for compensating for the change in the resistance value of an FET 760 of the gain control circuit 606, and gives the control voltage VC3 and the reference voltage Vref5 to the gain control circuit 606. The high frequency amplification circuit 605 thus performs the gain control by controlling the attenuation in the gain control circuit 606 using the control voltage VC applied to the gain control terminal 23 and the control voltage VC3 and the reference voltage Vref5 obtained by the reference voltage circuit 607.

Figure 25:
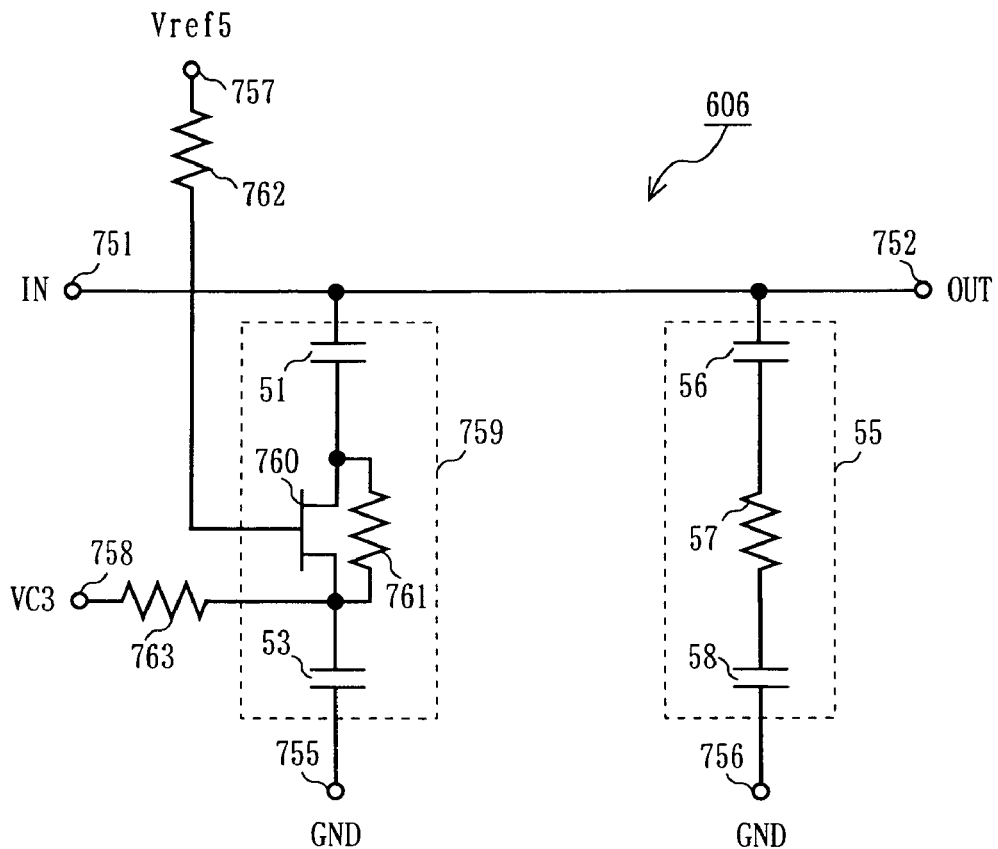
FIG. 25 is a circuit diagram of a gain control circuit included in the high frequency amplification circuit shown in FIG. 24.

FIG. 25 is a circuit diagram showing a detailed structure of the reference voltage circuit 606. As shown in FIG. 25, the signal input terminal 751 is connected to one end of a capacitor 51, one end of a capacitor 56, and the signal output terminal 752. The other end of the capacitor 51 is connected to a drain terminal of an FET 760 and one end of a resistor 761. The other end of the resistor 761 is connected to a source terminal of the FET 760, one end of a capacitor 53, and one end of a resistor 763. The other end of the capacitor 53 is connected to the ground terminal 755. The other end of the capacitor 56 is connected to one end of a resistor 57. The other end of the resistor 57 is connected to one end of a capacitor 58. The other end of the capacitor 58 is connected to the ground terminal 756. The gain control terminal 758 is connected to the other end of the resistor 763. The reference voltage terminal 757 is connected to one end of a resistor 762. A gate terminal of the FET 760 is connected to the other end of the resistor 762.

In the gain control circuit 606, a variable resistance circuit 759 includes the FET 760, the resistor 761, and the capacitors 51 and 53, which are provided between the signal input terminal 751 and the ground terminal 755.

An attenuation circuit 55 includes the capacitors 56 and 58 and the resistor 57, which are provided between the signal output terminal 752 and the ground terminal 756. Since the capacitors 51 and 53 are provided between the signal input terminal 751 and the ground terminal 755, the DC resistance between the terminals 751 and 755 is infinite. Since the capacitors 56 and 58 are provided between the signal output terminal 752 and the ground terminal 756, the DC resistance between the terminals 752 and 756 is also infinite.

In the gain control circuit 606, the source terminal and the drain terminal of the FET 760 may be replaced with each other. The one end of the resistor 763 may be connected to the drain terminal of the FET 760 and the one end of the resistor 761, instead of the source terminal of the FET 760 and the other end of the resistor 761.

In the attenuation circuit 55, the capacitor 56 and the resistor 57 may be replaced with each other, the resistor 57 and the capacitor 58 may be replaced with each other, and one of the capacitors 56 and 58 may be omitted.

Hereinafter, a case where the FET 760 included in the gain control circuit 606 acts as a variable resistor will be described.

In the gain control circuit 606, the resistance value between the source terminal and the drain terminal of the FET 760 is changed in accordance with the control voltage VC3 applied to the gain control terminal 758 and the reference voltage Vref5 applied to the reference voltage terminal 757. As a result, the attenuation between the signal input terminal 751 and the signal output terminal 752 is changed. In this behavior, the gain control of the high frequency amplification circuit 605 is performed.

Figure 26:
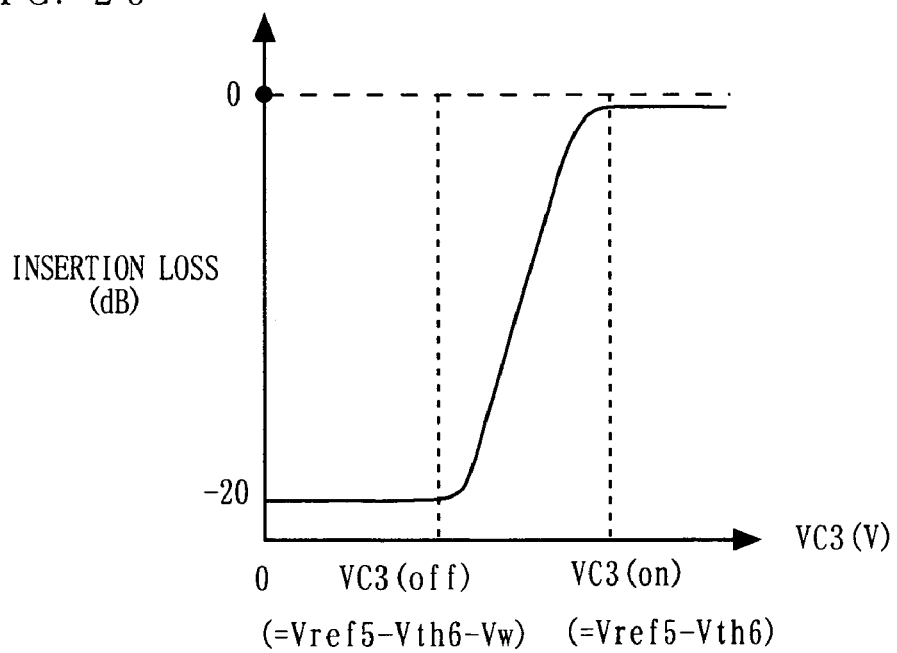
FIG. 26 is a graph illustrating the relationship between the control voltage and the insertion loss in the gain control circuit shown in FIG. 25.

FIG. 26 is a graph illustrating the relationship between the control voltage of the variable resistance circuit 759 and the insertion loss in the gain control circuit 606. In FIG. 26, the horizontal axis represents the control voltage VC3 applied to the source terminal or the drain terminal of the FET 760, and the vertical axis represents the attenuation between the signal input terminal 751 and the signal output terminal 752.

It is appreciated from FIG. 26 that the impedance between the source terminal and the drain terminal of the FET 760 is in one of the following three states.

(a) When VC3<VC3(off): fixed to about −20 dB;
(b) When VC3>VC3(on): fixed to about 0 dB; and
(c) When VC3(off)≦VC3≦VC3(on): continuously changed in accordance with the value of VC3.

Hereinafter, the state in (a) above will be referred to as a "disconnected state", the state in (b) above will be referred to as a "conductive state", and the state in (c) above will be referred to as a "variable resistance state". The threshold voltage of the FET 760 will be represented as Vth6, the potentials at the gate terminal, the source terminal and the drain terminal of the FET 760 will be respectively represented as Vg3, Vs3 and Vd3. The difference between VC3 (off) and VC3(on) will be represented as Vw.

Assuming that the resistance values of the resistors 761, 762 and 763 are sufficiently high and the voltage drop by these resistors is negligible, the potential at the gate terminal of the FET 760 is substantially equal to the reference voltage Vref5, and the potentials at the source terminal and the drain terminal of the FET 760 are substantially equal to the control voltage VC3.

Namely, expressions (89) through (91) are fulfilled.

$$Vg3=Vref5 \qquad (89)$$

$$Vd3=VC3 \qquad (90)$$

$$Vs3=VC3 \qquad (91)$$

When the FET 760 is just put into the disconnected state (i.e., when the FET 760 will not be in the disconnected state if the potential at the gate terminal becomes higher than the current value), the potentials at the gate terminal and the source terminal of the FET 760 have a relationship represented by expression (92).

$$Vg3-Vs3=Vth6 \qquad (92)$$

At this point, expression (93) is also fulfilled.

$$Vs3=VC3(on) \qquad (93)$$

By substituting expressions (91) and (93) for expression (92), expression (94) is obtained using VC3(on). VC3(off) is represented by expression (95).

$$VC3(on)=Vref5-Vth6 \qquad (94)$$

$$VC3(off)=Vref5-Vth6-Vw \qquad (95)$$

From expressions (94) and (95), it is appreciated that the potentials at the terminals of the FET 760 when the FET 760 is just put into the disconnected state are determined by the threshold voltage Vth6 of the FET 760 and the voltage value Vref5 applied to the reference voltage terminal 757.

In the gain control circuit 606, the potential between the gate terminal and the source terminal of the FET 760 is changed by changing the control voltage VC3, applied to the gain control terminal 758 and including a compensation voltage for compensating the threshold voltage of the FET 760, in the state where the voltage Vref5 is applied to the reference voltage terminal 757. Accordingly, the ON resistance value between the source terminal and the drain terminal of the FET 760 is changed. In this behavior, the attenuation between the signal input terminal 751 and the signal output terminal 752 is changed in accordance with the control voltage VC. Thus, the gain control is performed.

The gain control circuit 606 includes the attenuation circuit 55 between the signal output terminal 752 and ground terminal 756. When the control voltage VC is changed and thus the resistance value between the source terminal and the drain terminal of the FET 760 is changed, the impedance between the source terminal and the drain terminal of the FET 760 is changed. The attenuation circuit 55 acts to reduce the change in the impedance.

Figure 27:
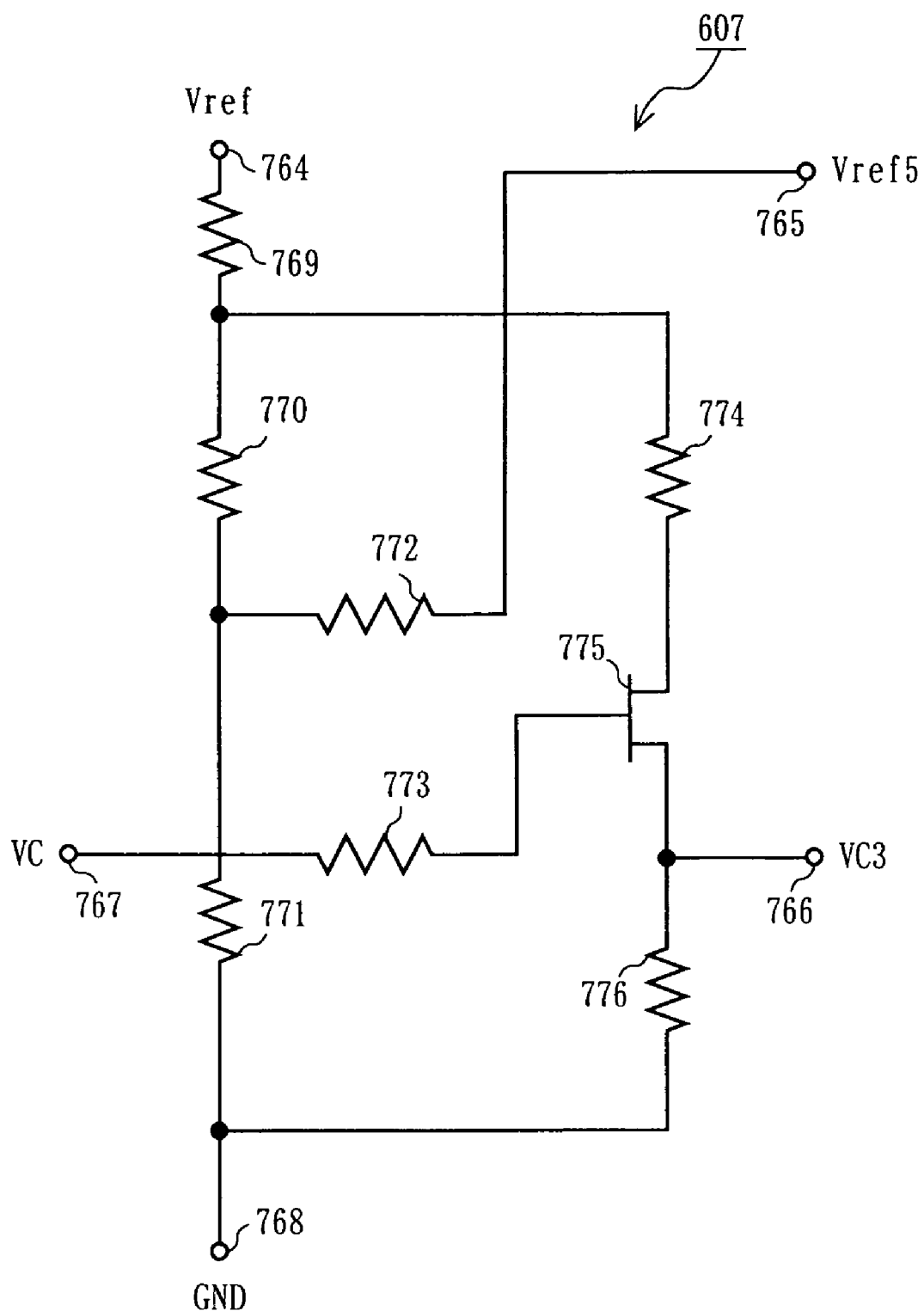
FIG. 27 is a circuit diagram of a control voltage circuit included in the high frequency amplification circuit shown in FIG. 24.

FIG. 27 is a circuit diagram showing a detailed structure of the control voltage circuit 607. As shown in FIG. 27, the reference voltage terminal 764 is connected to one end of a resistor 769. The other end of the resistor 769 is connected to one end of a resistor 770 and one end of a resistor 774. The other end of the resistor 770 is connected to one end of a resistor 771 and one end of a resistor 772. The other end of the resistor 774 is connected to a drain terminal of an FET 775. A source terminal of the FET 775 is connected to one end of a resistor 776 and the control voltage output terminal 766. The reference voltage output terminal 765 is connected to the other end of the resistor 772. The control voltage input terminal 767 is connected to one end of a resistor 773. The other end of the resistor 773 is connected to a gate terminal of the FET 775. The ground terminal 768 is connected to the other end of the resistor 771 and the other end of the resistor 776.

As each of the resistors 769 through 771 included in the control voltage circuit 607, a resistor having a resistance value of about several hundreds of ohms to several tens of kilo-ohms is used. As each of the resistors 772, 773, 774 and 776, a resistor having a resistance value of about several tens of kilo-ohms is used.

Hereinafter, an operation of the control voltage circuit 607 will be described. It is assumed that the resistance values of the resistors 774 and 776 are sufficiently high and the current flowing between the drain terminal and the source terminal of the FET 775 is negligible. It is also assumed that the resistance value of the resistor 773 is sufficiently high and the voltage drop by the resistor 773 is negligible. Where the threshold voltage of the FET 775 is Vth7, the relationship between the voltage VC at the control voltage input terminal 767 and the voltage VC3 at the control voltage output terminal 766 is represented by expression (96).

$$VC = VC3 + Vth7 \quad (96)$$

The reference voltage Vref5 at the reference voltage output terminal 765 is set in accordance with the resistance values of the resistors 769, 770 and 771.

In the case where the gain control circuit 606 and the control voltage circuit 607 are produced using the same semiconductor process, the threshold voltages of the FETs included in the circuits 606 and 607 are substantially equal to each other. Therefore, expression (97) is fulfilled.

$$Vth6 = Vth7 \quad (97)$$

Accordingly, VC(on) and VC(off) at the gain control circuit 606 are represented by expressions (98) and (99) from expressions (94) through (97).

$$VC(on) = Vref5 \quad (98)$$

$$VC(off) = Vref5 - Vw \quad (99)$$

Neither expression (98) nor expression (99) includes a term which depends on the threshold voltage of the FETs. Therefore, even when the threshold voltage of the FETs varies, VC(off) and VC(on) are not influenced by such a variation, and the gain control performed by the gain control circuit 606 is not influenced by such a variation, either. For this reason, the variation in the gain caused by the variation in the threshold voltage of the FETs can be reduced.

Next, specific examples of the gain control characteristics when the threshold voltage of the FETs in the high frequency amplification circuit 605 varies will be described. Here, as an example, an experimental result performed under the conditions that the frequency of the signal which is input from the signal input terminal 21 is 1.95 GHz and the reference voltage Vref applied to the reference voltage terminal 31 is 3.5 V will be described. With such conditions, the control voltage VC applied to the gain control terminal 23 was changed from 0 V to 3 V in the case where the threshold voltage of the FET 760 and the FET 775 was −0.6 V, −0.5 V and −0.4 V. The results will be shown.

Figure 28:
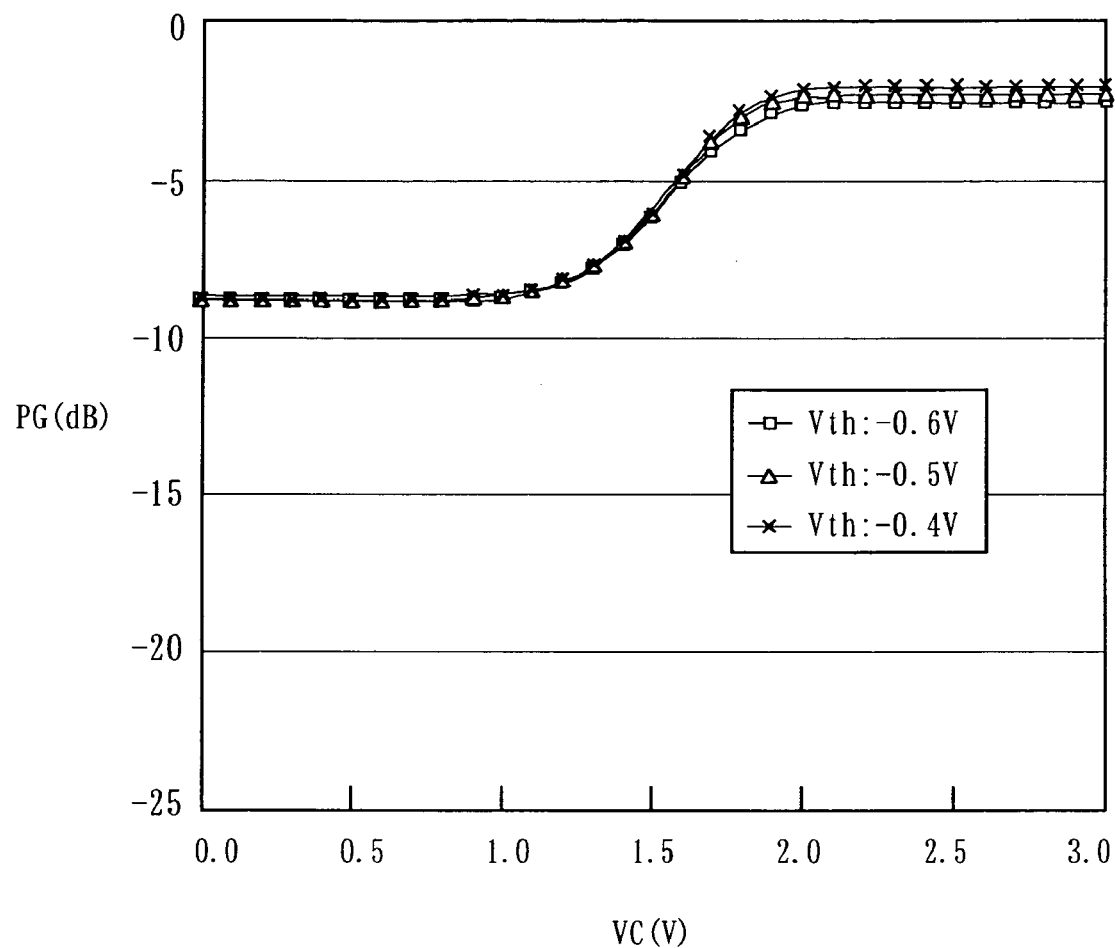
FIG. 28 is a graph illustrating the relationship between the control voltage and the input/output power ratio in the gain control circuit shown in FIG. 25.
Figure 29:
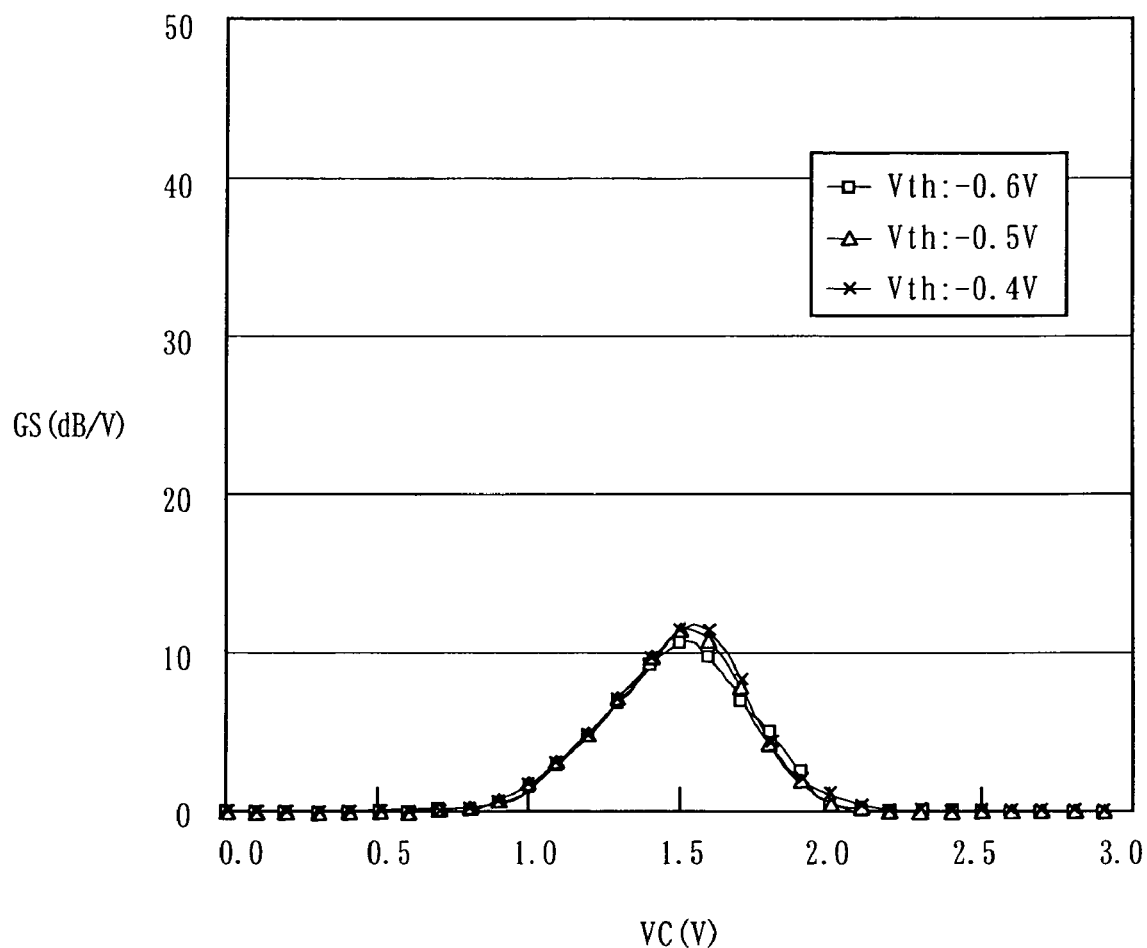
FIG. 29 is a graph illustrating the relationship between the control voltage and the gain control sensitivity in the gain control circuit shown in FIG. 25.
Figure 30:
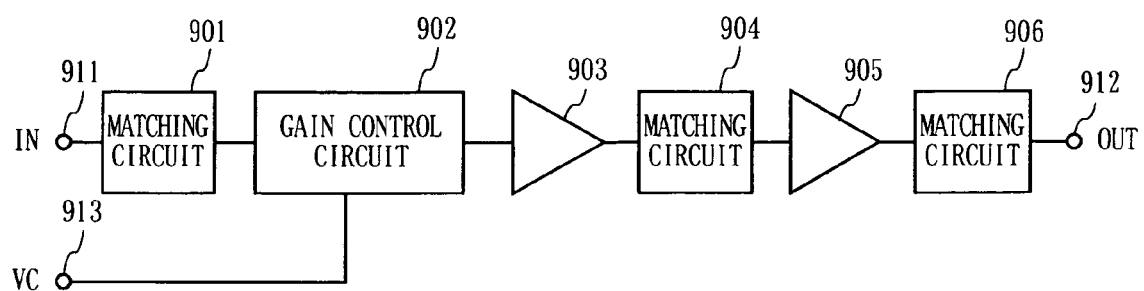
FIG. 30 is a block diagram showing a structure of a conventional high frequency amplification circuit.
Figure 31:
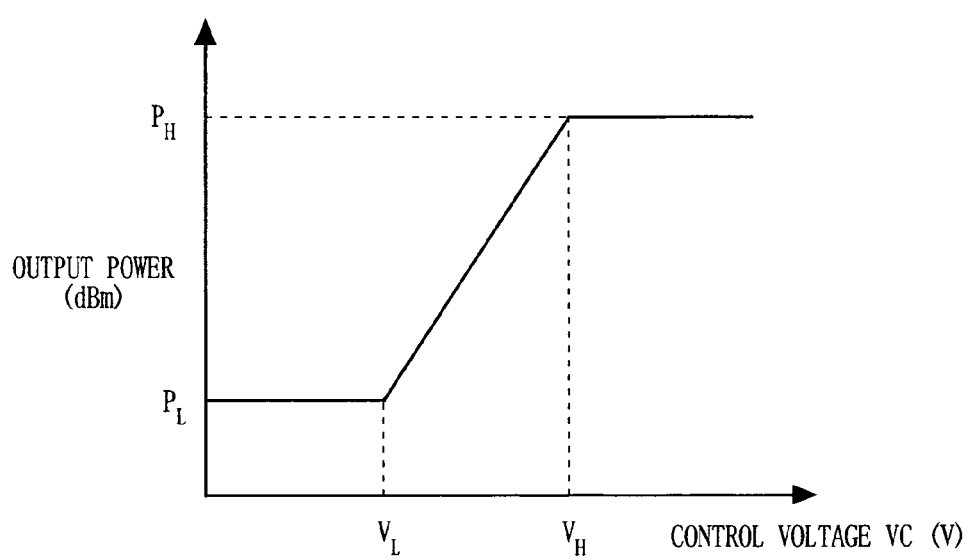
FIG. 31 is a graph illustrating the relationship between the control voltage and the output power in the conventional high frequency amplification circuit.
Figure 32:
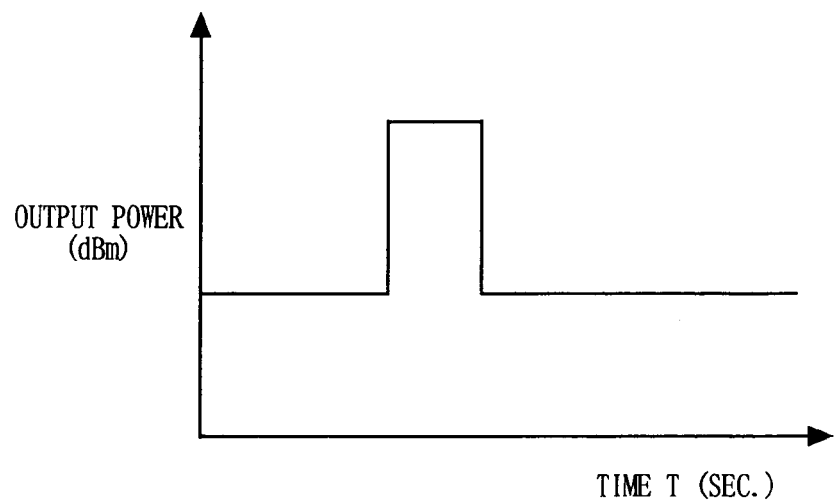
FIG. 32 is a signal waveform diagram showing a burst signal which is input to the conventional high frequency amplification circuit.
Figure 33:
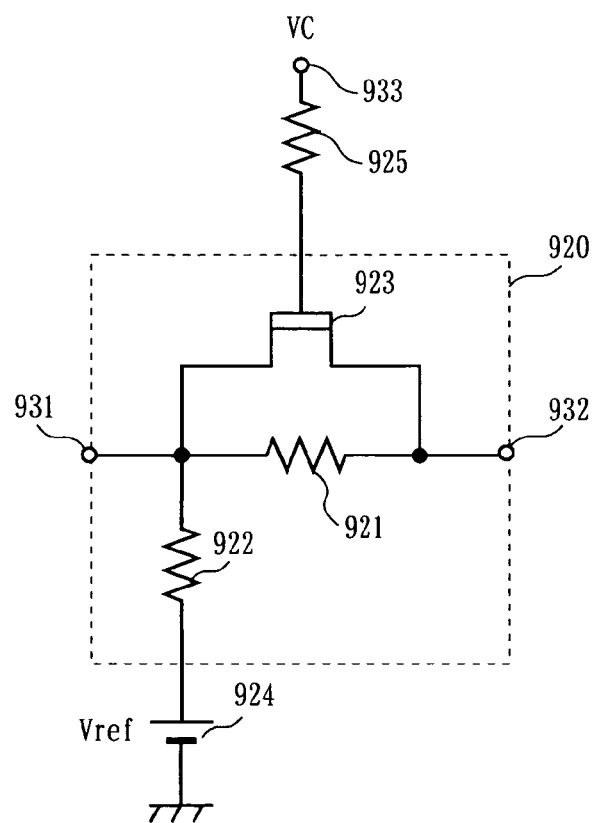
FIG. 33 is a circuit diagram of a gain control circuit included in the conventional high frequency amplification circuit.

FIG. 28 is a graph illustrating the relationship between the control voltage and the input/output power ratio in the gain control circuit 606 operating in the above-described conditions. FIG. 29 is a graph illustrating the relationship between the control voltage and the gain control sensitivity in the gain control circuit 606 operating in the above-described conditions. In FIG. 28 and FIG. 29, the horizontal axis represents the control voltage VC applied to the gain control terminal 23. In FIG. 28, the vertical axis represents the ratio PG between the power of the input signal to the signal input terminal 751 and the power of the output signal from the signal output terminal 752. In FIG. 29, the vertical axis represents the gain control sensitivity GS.

According to FIG. 28 and FIG. 29, even when the threshold voltage of the FETs 760 and 775 varies, the characteristics of the gain control circuit 606 are not substantially influenced by such a variation. Therefore, the high frequency amplification circuit 605 reduces the variations in the gain control characteristics and the gain control sensitivity even when the threshold voltage of the FETs varies due to the inconsistencies in the production process or the operating temperature change.

As described above, a high frequency amplification circuit according to this embodiment can reduce the variation in the gain caused by the variation in the threshold voltage of the FET included in the gain control circuit.

In each of the above embodiments, the following modifications are applicable. For example, in the first through fourth embodiments, the gain control circuit includes an attenuation circuit both on the input side and the output side. Alternatively, the gain control circuit may include an attenuation circuit only on the input side, only on the output side, or neither the input side nor the output side, in accordance with the characteristics of the gain control circuit required by an application. In the fifth embodiment, the gain control circuit may include no attenuation circuit.

In each of the above embodiments, the high frequency amplification circuit includes the reference voltage terminal 31 and the power source terminals 32 and 33. Alternatively, the reference voltage terminal 31 may also act as the power source terminal 32 or 33. With such a structure, the number of terminals included in the high frequency amplification circuit can be reduced, and the mounting area of the high frequency amplification circuit can be reduced.

While the invention has been described in detail, the foregoing description is in all aspects illustrative and not restrictive. It is understood that numerous other modifications and variations can be devised without departing from the scope of the invention.

What is claimed is:

1. A high frequency amplification circuit having a variable gain, comprising:
   a terminal group including a signal input terminal to which a high frequency signal to be amplified is to be input, a signal output terminal for outputting the amplified high frequency signal, a gain control terminal to which a control voltage is to be applied, and a reference voltage terminal to which a reference voltage is to be applied;
   an amplifier provided between the signal input terminal and the signal output terminal for amplifying the input high frequency signal;
   a gain control circuit, provided between the signal input terminal and the signal output terminal and connected in series to the amplifier, for changing an attenuation of the input high frequency signal in accordance with the control voltage applied to the gain control terminal; and
   a reference voltage circuit for generating an internal reference voltage from the reference voltage applied to the reference voltage terminal and supplying the generated internal reference voltage to the gain control circuit;
   wherein:
   the gain control circuit includes at least one first field effect transistor for receiving the control voltage at a gate terminal thereof, the gain control circuit having a resistance value which is changed in accordance with the given control voltage;

the reference voltage circuit includes a second field effect transistor having a threshold voltage which is substantially equal to that of the at least one first field effect transistor, the second field effect transistor being provided for generating the internal reference voltage which is shifted with respect to the reference voltage by the threshold voltage;

the gain control circuit continuously changes the attenuation of the input high frequency signal by the resistance value of the at least one first field effect transistor being continuously changed; and the reference voltage circuit supplies the internal reference voltage to a source terminal and/or a drain terminal of the at least one first field effect transistor, thereby counteracting an influence exerted by the threshold voltage of the at least one first field effect transistor on a change in the attenuation of the high frequency signal in the gain control circuit.

2. A high frequency amplification circuit according to claim 1, further comprising an attenuation circuit provided between the signal input terminal and a ground terminal and including a resistor and a capacitor connected in series to each other.

3. A high frequency amplification circuit according to claim 1, further comprising an attenuation circuit provided between the signal output terminal and a ground terminal and including a resistor and a capacitor connected in series to each other.

4. A high frequency amplification circuit according to claim 1, further comprising an attenuation circuit provided between the signal input terminal and a ground terminal and an attenuation circuit provided between the signal output terminal and the ground terminal, each attenuation circuit including a resistor and a capacitor connected in series to each other.

5. A high frequency amplification circuit according to claim 1, wherein the gain control circuit further comprises a resistor connected to the source terminal and the drain terminal of the at least one first field effect transistor.

6. A high frequency amplification circuit according to claim 1, wherein the gain control circuit comprises:
a control voltage division circuit provided between the gain control terminal and a ground terminal for dividing the control voltage to obtain a plurality of voltages;
a plurality of the first field effect transistors connected in series to each other and each having a gate terminal to which the voltage obtained by the control voltage division circuit is to be applied; and
a plurality of resistors connected to source terminals and drain terminals of the plurality of first field effect transistors.

7. A high frequency amplification circuit according to claim 1, wherein the reference voltage circuit comprises:
a reference voltage division circuit provided between the reference voltage terminal and a ground terminal for dividing the reference voltage;
a resistor provided between the reference voltage terminal and a drain terminal of the second field effect transistor; and
a resistor provided between the ground terminal and a source terminal of the second field effect transistor;
wherein a potential, at the drain terminal or the source terminal of the second field effect transistor in the case where a voltage obtained by the reference voltage division circuit is applied to a gate terminal of the second field effect transistor, is output as the internal reference voltage.

8. A high frequency amplification circuit having a variable gain, comprising:
a terminal group including a signal input terminal to which a high frequency signal to be amplified is to be input, a signal output terminal for outputting the amplified high frequency signal, a gain control terminal to which a control voltage is to be applied, and a reference voltage terminal to which a reference voltage is to be applied;
an amplifier provided between the signal input terminal and the signal output terminal for amplifying the input high frequency signal;
a gain control circuit, provided between the signal input terminal and the signal output terminal and connected in series to the amplifier, for changing an attenuation of the input high frequency signal in accordance with the control voltage applied to the gain control terminal; and
a reference voltage circuit for generating an internal reference voltage from the reference voltage applied to the reference voltage terminal and supplying the generated internal reference voltage to the gain control circuit;
wherein:
the gain control circuit includes a first field effect transistor for receiving the control voltage at a gate terminal thereof, the gain control circuit having a resistance value which is changed in accordance with the given control voltage;
the reference voltage circuit includes a plurality of second field effect transistors for generating a voltage which is shifted with respect to the reference voltage by a threshold voltage of the second field effect transistors, and a voltage division circuit for dividing the generated voltage;
the gain control circuit continuously changes the attenuation of the input high frequency signal by the resistance value of the first field effect transistor being continuously changed; and
the reference voltage circuit supplies a voltage obtained by the voltage division circuit to a source terminal and/or a drain terminal of the first field effect transistor as the internal reference voltage, thereby counteracting an influence exerted by a threshold voltage of the first field effect transistor on a change in the attenuation of the high frequency signal in the gain control circuit.

9. A high frequency amplification circuit according to claim 8, wherein the gain control circuit further comprises a resistor connected to the source terminal and the drain terminal of the first field effect transistor.

10. A high frequency amplification circuit according to claim 8, wherein the reference voltage circuit comprises:
a reference voltage division circuit provided between the reference voltage terminal and a ground terminal for dividing the reference voltage; and
two second field effect transistors, as the plurality of second field effect transistors, provided between the reference voltage terminal and the ground terminal and connected parallel to each other;
wherein:
among the two second field effect transistors, one second field effect transistor is configured such that a voltage obtained by the reference voltage division circuit is applied to a gate terminal thereof, a first resistor is provided between a drain terminal thereof and the reference voltage terminal, and a second resistor is provided between a source terminal thereof and the ground terminal;

the other second field effect transistor is configured such that a gate terminal thereof is connected to the source terminal of the one second field effect transistor, a third resistor is provided between a drain terminal thereof and the reference voltage terminal, and a fourth resistor and a fifth resistor connected in series to each other are provided as the voltage division circuit between a source terminal thereof and the ground terminal; and a potential between the fourth resistor and the fifth resistor is output as the internal reference voltage.

11. A high frequency amplification circuit having a variable gain, comprising:

a terminal group including first and second signal input terminals to which first and second high frequency signals to be amplified are respectively to be input, first and second signal output terminals respectively for outputting the amplified high frequency signals, a gain control terminal to which a control voltage is to be applied, and a reference voltage terminal to which a reference voltage is to be applied;

a first amplifier provided between the first signal input terminal and the first signal output terminal for amplifying the input first high frequency signal;

a second amplifier provided between the second signal input terminal and the second signal output terminal for amplifying the input second high frequency signal;

a first gain control circuit, provided between the first signal input terminal and the first signal output terminal and connected in series to the first amplifier, for changing an attenuation of the input first high frequency signal in accordance with the control voltage applied to the gain control terminal;

a second gain control circuit, provided between the second signal input terminal and the second signal output terminal and connected in series to the second amplifier, for changing an attenuation of the input second high frequency signal in accordance with the control voltage applied to the gain control terminal; and a reference voltage circuit for generating first and second internal reference voltages from the reference voltage applied to the reference voltage terminal and supplying the generated first and second internal reference voltages respectively to the first and second gain control circuits;

wherein:

the first gain control circuit includes a first field effect transistor for receiving the control voltage at a gate terminal thereof, the first gain control circuit having a resistance value which is changed in accordance with the given control voltage;

the second gain control circuit includes a second field effect transistor for receiving the control voltage at a gate terminal thereof, the second gain control circuit having a resistance value which is changed in accordance with the given control voltage;

the reference voltage circuit includes a plurality of third field effect transistors for generating a voltage which is shifted with respect to the reference voltage by a threshold voltage of the third field effect transistors, and a voltage division circuit for dividing the generated voltage and generating the first and second internal reference voltages;

the first and second gain control circuits continuously change the attenuation of the input first and second high frequency signals respectively by the resistance values of the first and second field effect transistors being continuously changed; and the reference voltage circuit supplies the first and second internal reference voltages generated by the voltage division circuit to source terminals and/or drain terminals of the first and second field effect transistors respectively, thereby counteracting influences exerted by the threshold voltages of the first and second field effect transistors on changes in the attenuation of the high frequency signals in the first and second gain control circuits, respectively.

12. A high frequency amplification circuit according to claim 11, wherein the first gain control circuit further comprises a resistor connected to the source terminal and the drain terminal of the first field effect transistor.

13. A high frequency amplification circuit according to claim 11, wherein the second gain control circuit further comprises a resistor connected to the source terminal and the drain terminal of the second field effect transistor.

14. A high frequency amplification circuit according to claim 11, wherein the reference voltage circuit comprises:

a reference voltage division circuit provided between the reference voltage terminal and a ground terminal for dividing the reference voltage;

two third field effect transistors, as the plurality of third field effect transistors, provided between the reference voltage terminal and the ground terminal and connected parallel to each other;

among the two third field effect transistors, one third field effect transistor is configured such that a voltage obtained by the reference voltage division circuit is applied to a gate terminal thereof, a first resistor is provided between a drain terminal thereof and the reference voltage terminal, and a second resistor is provided between a source terminal thereof and the ground terminal;

the other third field effect transistor is configured such that a gate terminal thereof is connected to the source terminal of the one third field effect transistor, a third resistor is provided between a drain terminal thereof and the reference voltage terminal, and fourth through seventh resistors are provided as the voltage division circuit between a source terminal thereof and the ground terminal;

a first resistor series circuit including the fourth and fifth resistors, and a second resistor series circuit including the sixth and seventh resistors, are connected parallel to each other;

a potential between the fourth resistor and the fifth resistor is output to the first gain control circuit as the first internal reference voltage; and a potential between the sixth resistor and the seventh resistor is output to the second gain control circuit as the second internal reference voltage.

15. A high frequency amplification circuit according to claim 11, wherein the reference voltage circuit comprises:

a reference voltage division circuit provided between the reference voltage terminal and a ground terminal for dividing the reference voltage;

two third field effect transistors, as the plurality of third field effect transistors, provided between the reference voltage terminal and a ground terminal and connected parallel to each other;

among the two third field effect transistors, one third field effect transistor is configured such that a voltage obtained by the reference voltage division circuit is applied to a gate terminal thereof, a first resistor is provided between a drain terminal thereof and the reference voltage terminal, and a second resistor is provided between a source terminal thereof and the ground terminal;

the other third field effect transistor is configured such that agate terminal thereof is connected to the source terminal of the one third field effect transistor, a third resistor is provided between a drain terminal thereof and the reference voltage terminal, and fourth, fifth and sixth resistors connected in series are provided as the voltage division circuit between a source terminal thereof and the ground terminal;

a potential between the fifth resistor and the sixth resistor is output to the first gain control circuit as the first internal reference voltage; and a potential between the fourth resistor and the fifth resistor is output to the second gain control circuit as the second internal reference voltage.

16. A high frequency amplification circuit having a variable gain, comprising:

a terminal group including a signal input terminal to which a high frequency signal to be amplified is to be input, a signal output terminal for outputting the amplified high frequency signal, a gain control terminal to which a control voltage is to be applied, and a reference voltage terminal to which a reference voltage is to be applied;

a signal line connected between the signal input terminal and the signal output terminal for allowing the input high frequency signal to flow therethrough;

an amplifier provided on the signal line for amplifying the input high frequency signal;

a control voltage circuit for generating an internal control voltage from the control voltage applied to the gain control terminal; and a gain control circuit provided on the signal line for changing an attenuation of the high frequency signal flowing through the signal line in accordance with the internal control voltage;

wherein:

the gain control circuit includes a first field effect transistor provided between the signal input terminal and a ground terminal for receiving the reference voltage at a gate terminal thereof and receiving the internal control voltage at a source terminal and/or a drain terminal thereof, the gain control circuit having a resistance value which is changed in accordance with the given internal control voltage;

the control voltage circuit includes a second field effect transistor having a threshold voltage which is substantially equal to that of the first field effect transistor, the second field effect transistor being provided for generating the internal reference voltage which is shifted with respect to the control voltage by the threshold voltage;

the gain control circuit continuously changes the attenuation of the high frequency signal flowing through the signal line by the resistance value of the first field effect transistor being continuously changed; and the control voltage circuit supplies the internal control voltage to the gain control circuit, thereby counteracting an influence exerted by the threshold voltage of the first field effect transistor on a change in the attenuation of the high frequency signal in the gain control circuit.

17. A high frequency amplification circuit according to claim 16, wherein the gain control circuit further comprises a resistor connected to the source terminal and the drain terminal of the first field effect transistor.

18. A high frequency amplification circuit according to claim 16, wherein the control voltage circuit further comprises:

a resistor provided between the reference voltage terminal and a drain terminal of the second field effect transistor; and a resistor provided between the ground terminal and a source terminal of the second field effect transistor;

wherein:

the control voltage is applied to a gate terminal of the second field effect transistor; and the drain terminal and/or the source terminal of the first field effect transistor is connected to the source terminal or the drain terminal of the second field effect transistor.

19. A mobile communication terminal, comprising:

a high frequency circuit block including a synthesizer section, a transmission section, a receiving section, and a common use section; wherein:

the transmission section comprises:

a modulator for converting an input modulation signal into a plurality of transmission signals having different transmission frequencies from each other; and a plurality of amplification sections respectively for amplifying the plurality of transmission signals obtained by the modulator;

each of the plurality of amplification sections comprises:

a high frequency amplification circuit having a variable gain for amplifying one of the plurality of transmission signals obtained by the modulator;

a band-pass filter for extracting a signal component of a predetermined band from the transmission signal amplified by the high frequency amplification circuit;

a high output high frequency amplification circuit having a fixed gain for amplifying the signal extracted by the band-pass filter; and an isolator, provided between the high output high frequency amplification circuit and the common use section, for allowing the signal in one direction from the high output high frequency amplification circuit toward the common use section; and at least one of the high frequency amplification circuits comprises:

a terminal group including a signal input terminal to which a high frequency signal to be amplified is to be input, a signal output terminal for outputting the amplified high frequency signal, a gain control terminal to which a control voltage is to be applied, and a reference voltage terminal to which a reference voltage is to be applied;

an amplifier provided between the signal input terminal and the signal output terminal for amplifying the input high frequency signal;

a gain control circuit, provided between the signal input terminal and the signal output terminal and connected in series to the amplifier, for changing an attenuation of the input high frequency signal in accordance with the control voltage applied to the gain control terminal; and a reference voltage circuit for generating an internal reference voltage from the reference voltage applied to the reference voltage terminal and supplying the generated internal reference voltage to the gain control circuit;

wherein:

the gain control circuit includes at least one first field effect transistor for receiving the control voltage at a gate terminal thereof, the gain control circuit having a resistance value which is changed in accordance with the given control voltage;

the reference voltage circuit includes a second field effect transistor having a threshold voltage which is substantially equal to that of the at least one first field effect transistor, the second field effect transistor being provided for generating the internal reference voltage which is shifted with respect to the reference voltage by the threshold voltage;

the gain control circuit continuously changes the attenuation of the input high frequency signal by the resistance value of the at least one first field effect transistor being continuously changed; and the reference voltage circuit supplies the internal reference voltage to a source terminal and/or a drain terminal of the at least one first field effect transistor, thereby counteracting an influence exerted by the threshold voltage of the at least one first field effect transistor on a change in the attenuation of the high frequency signal in the gain control circuit.

20. A mobile communication terminal according to claim 19, wherein the gain control circuit comprises:

a control voltage division circuit provided between the gain control terminal and a ground terminal for dividing the control voltage to obtain a plurality of voltages;

a plurality of the first field effect transistors connected in series to each other and each having a gate terminal to which the voltage obtained by the control voltage division circuit is to be applied; and a plurality of resistors connected to source terminals and drain terminals of the plurality of first field effect transistors.

21. A mobile communication terminal, comprising:

a high frequency circuit block including a synthesizer section, a transmission section, a receiving section, and a common use section; wherein:

the transmission section comprises:

a modulator for converting an input modulation signal into a plurality of transmission signals having different transmission frequencies from each other; and a plurality of amplification sections respectively for amplifying the plurality of transmission signals obtained by the modulator;

each of the plurality of amplification sections comprises:

a high frequency amplification circuit having a variable gain for amplifying one of the plurality of transmission signals obtained by the modulator;

a band-pass filter for extracting a signal component of a predetermined band from the transmission signal amplified by the high frequency amplification circuit;

a high output high frequency amplification circuit having a fixed gain for amplifying the signal extracted by the band-pass filter; and an isolator, provided between the high output high frequency amplification circuit and the common use section, for allowing the signal in one direction from the high output high frequency amplification circuit toward the common use section; and at least one of the high frequency amplification circuits comprises:

a terminal group including a signal input terminal to which a high frequency signal to be amplified is to be input, a signal output terminal for outputting the amplified high frequency signal, a gain control terminal to which a control voltage is to be applied, and a reference voltage terminal to which a reference voltage is to be applied;

an amplifier provided between the signal input terminal and the signal output terminal for amplifying the input high frequency signal;

a gain control circuit, provided between the signal input terminal and the signal output terminal and connected in series to the amplifier, for changing an attenuation of the input high frequency signal in accordance with the control voltage applied to the gain control terminal; and a reference voltage circuit for generating an internal reference voltage from the reference voltage applied to the reference voltage terminal and supplying the generated internal reference voltage to the gain control circuit;

wherein:

the gain control circuit includes a first field effect transistor for receiving the control voltage at a gate terminal thereof, the gain control circuit having a resistance value which is changed in accordance with the given control voltage;

the reference voltage circuit includes a plurality of second field effect transistors for generating a voltage which is shifted with respect to the reference voltage by a threshold voltage of the second field effect transistors, and a voltage division circuit for dividing the generated voltage;

the gain control circuit continuously changes the attenuation of the input high frequency signal by the resistance value of the first field effect transistor being continuously changed; and the reference voltage circuit supplies a voltage obtained by the voltage division circuit to a source terminal and/or a drain terminal of the first field effect transistor as the internal reference voltage, thereby counteracting an influence exerted by a threshold voltage of the first field effect transistor on a change in the attenuation of the high frequency signal in the gain control circuit.

22. A mobile communication terminal, comprising:

a high frequency circuit block including a synthesizer section, a transmission section, a receiving section, and a common use section; wherein:

the transmission section comprises:

a modulator for converting an input modulation signal into a plurality of transmission signals having different transmission frequencies from each other; and a plurality of amplification sections respectively for amplifying the plurality of transmission signals obtained by the modulator;

each of the plurality of amplification sections comprises:

a high frequency amplification circuit having a variable gain for amplifying one of the plurality of transmission signals obtained by the modulator;

a band-pass filter for extracting a signal component of a predetermined band from the transmission signal amplified by the high frequency amplification circuit;

a high output high frequency amplification circuit having a fixed gain for amplifying the signal extracted by the band-pass filter; and an isolator, provided between the high output high frequency amplification circuit and the common use section, for allowing the signal in one direction from the high output high frequency amplification circuit toward the common use section; and at least one of the high frequency amplification circuits comprises:

a terminal group including first and second signal input terminals to which first and second high frequency signals to be amplified are respectively to be input, first and second signal output terminals respectively for outputting the amplified high frequency signals, a gain control terminal to which a control voltage is to be applied, and a reference voltage terminal to which a reference voltage is to be applied;

a first amplifier provided between the first signal input terminal and the first signal output terminal for amplifying the input first high frequency signal;

a second amplifier provided between the second signal input terminal and the second signal output terminal for amplifying the input second high frequency signal;

a first gain control circuit, provided between the first signal input terminal and the first signal output terminal and connected in series to the first amplifier, for changing an attenuation of the input first high frequency signal in accordance with the control voltage applied to the gain control terminal;

a second gain control circuit, provided between the second signal input terminal and the second signal output terminal and connected in series to the second amplifier, for changing an attenuation of the input second high frequency signal in accordance with the control voltage applied to the gain control terminal; and a reference voltage circuit for generating first and second internal reference voltages from the reference voltage applied to the reference voltage terminal and supplying the generated first and second internal reference voltages respectively to the first and second gain control circuits;

wherein:

the first gain control circuit includes a first field effect transistor for receiving the control voltage at a gate terminal thereof, the first gain control circuit having a resistance value which is changed in accordance with the given control voltage;

the second gain control circuit includes a second field effect transistor for receiving the control voltage at a gate terminal thereof, the second gain control circuit having a resistance value which is changed in accordance with the given control voltage;

the reference voltage circuit includes a plurality of third field effect transistors for generating a voltage which is shifted with respect to the reference voltage by a threshold voltage of the third field effect transistors, and a voltage division circuit for dividing the generated voltage and generating the first and second internal reference voltages;

the first and second gain control circuits continuously change the attenuation of the input first and second high frequency signals respectively by the resistance values of the first and second field effect transistors being continuously changed; and the reference voltage circuit supplies the first and second internal reference voltages generated by the voltage division circuit to source terminals and/or drain terminals of the first and second field effect transistors respectively, thereby counteracting influences exerted by the threshold voltages of the first and second field effect transistors on changes in the attenuation of the high frequency signals in the first and second gain control circuits, respectively.

23. A mobile communication terminal, comprising:

a high frequency circuit block including a synthesizer section, a transmission section, a receiving section, and a common use section; wherein:

the transmission section comprises:

a modulator for converting an input modulation signal into a plurality of transmission signals having different transmission frequencies from each other; and a plurality of amplification sections respectively for amplifying the plurality of transmission signals obtained by the modulator;

each of the plurality of amplification sections comprises:

a high frequency amplification circuit having a variable gain for amplifying one of the plurality of transmission signals obtained by the modulator;

a band-pass filter for extracting a signal component of a predetermined band from the transmission signal amplified by the high frequency amplification circuit;

a high output high frequency amplification circuit having a fixed gain for amplifying the signal extracted by the band-pass filter; and an isolator, provided between the high output high frequency amplification circuit and the common use section, for allowing the signal in one direction from the high output high frequency amplification circuit toward the common use section; and at least one of the high frequency amplification circuits comprises:

a terminal group including a signal input terminal to which a high frequency signal to be amplified is to be input, a signal output terminal for outputting the amplified high frequency signal, a gain control terminal to which a control voltage is to be applied, and a reference voltage terminal to which a reference voltage is to be applied;

a signal line connected between the signal input terminal and the signal output terminal for allowing the input high frequency signal to flow therethrough;

an amplifier provided on the signal line for amplifying the input high frequency signal;

a control voltage circuit for generating an internal control voltage from the control voltage applied to the gain control terminal; and a gain control circuit provided on the signal line for changing an attenuation of the high frequency signal flowing through the signal line in accordance with the internal control voltage;

wherein:

the gain control circuit includes a first field effect transistor provided between the signal input terminal and a ground terminal for receiving the reference voltage at a gate terminal thereof and receiving the internal control voltage at a source terminal and/or a drain terminal thereof, the gain control circuit having a resistance value which is changed in accordance with the given internal control voltage;

the control voltage circuit includes a second field effect transistor having a threshold voltage which is substantially equal to that of the first field effect transistor, the second field effect transistor being provided for generating the internal reference voltage which is shifted with respect to the control voltage by the threshold voltage;

the gain control circuit continuously changes the attenuation of the high frequency signal flowing through the signal line by the resistance value of the first field effect transistor being continuously changed; and the control voltage circuit supplies the internal control voltage to the gain control circuit, thereby counteracting an influence exerted by the threshold voltage of the first field effect transistor on a change in the attenuation of the high frequency signal in the gain control circuit.

* * * * *